(12) United States Patent
Webster et al.

(10) Patent No.: US 12,085,442 B2
(45) Date of Patent: Sep. 10, 2024

(54) INTEGRATED CIRCUIT WITH SEQUENTIALLY-COUPLED CHARGE STORAGE AND ASSOCIATED TECHNIQUES

(71) Applicant: Quantum-Si Incorporated, Branford, CT (US)

(72) Inventors: Eric A. G. Webster, Santa Clara, CA (US); Todd Rearick, Cheshire, CT (US); Thomas Raymond Thurston, Guilford, CT (US)

(73) Assignee: Quantum-Si Incorporated, Branford, CT (US)

( * ) Notice: Subject to any disclaimer, the term of this patent is extended or adjusted under 35 U.S.C. 154(b) by 0 days.

(21) Appl. No.: 17/507,585

(22) Filed: Oct. 21, 2021

(65) Prior Publication Data
US 2022/0128402 A1 Apr. 28, 2022

Related U.S. Application Data

(60) Provisional application No. 63/104,393, filed on Oct. 22, 2020.

(51) Int. Cl.
*G01J 1/44* (2006.01)
*B01J 19/00* (2006.01)
(Continued)

(52) U.S. Cl.
CPC ............. *G01J 1/44* (2013.01); *B01J 19/0046* (2013.01); *H01L 27/14683* (2013.01);
(Continued)

(58) Field of Classification Search
CPC .... G01J 1/44; G01J 2001/446; B01J 19/0046; B01J 2219/00504; B01J 2219/00576;
(Continued)

(56) References Cited

U.S. PATENT DOCUMENTS

| 5,961,924 A | 10/1999 | Reichert et al. |
| 6,787,308 B2 | 9/2004 | Balasubramanian et al. |

(Continued)

FOREIGN PATENT DOCUMENTS

WO    WO 2011/153962 A1    12/2011

OTHER PUBLICATIONS

U.S. Appl. No. 17/507,596, filed Oct. 21, 2021, Webster et al.
(Continued)

*Primary Examiner* — Seung C Sohn
(74) *Attorney, Agent, or Firm* — Wolf, Greenfield & Sacks, P.C.

(57) ABSTRACT

Described herein are techniques that improve the collection and readout of charge carriers in an integrated circuit. Some aspects of the present disclosure relate to integrated circuits having pixels with a plurality of charge storage regions. Some aspects of the present disclosure relate to integrated circuits configured to substantially simultaneously collect and read out charge carriers, at least in part. Some aspects of the present disclosure relate to integrated circuits having a plurality of pixels configured to transfer charge carriers between charge storage regions within each pixel substantially at the same time. Some aspects of the present disclosure relate to integrated circuits having three or more sequentially coupled charge storage regions. Some aspects of the present disclosure relate to integrated circuits capable of increased charge transfer rates. Some aspects of the present disclosure relate to techniques for manufacturing and operating integrated circuits according to the other techniques described herein.

23 Claims, 41 Drawing Sheets

(51) Int. Cl.
*H01L 27/146* (2006.01)
*H01L 27/148* (2006.01)

(52) U.S. Cl.
CPC .. *H01L 27/14818* (2013.01); *H01L 27/14825* (2013.01); *B01J 2219/00504* (2013.01); *B01J 2219/00576* (2013.01); *B01J 2219/00587* (2013.01); *B01J 2219/00689* (2013.01); *B01J 2219/00698* (2013.01); *G01J 2001/446* (2013.01)

(58) Field of Classification Search
CPC .... B01J 2219/00587; B01J 2219/00689; B01J 2219/00698; H01L 27/14683; H01L 27/14818; H01L 27/14825; G01N 21/6454; G01N 21/6408; H04N 25/771
See application file for complete search history.

(56) References Cited

U.S. PATENT DOCUMENTS

| | | | |
|---|---|---|---|
| 6,917,726 B2 | 7/2005 | Levene et al. | |
| 7,175,811 B2 | 2/2007 | Bach et al. | |
| 7,426,322 B2 | 9/2008 | Hyde | |
| 7,738,086 B2 | 6/2010 | Shepard et al. | |
| 7,820,983 B2 | 10/2010 | Lundquist et al. | |
| 7,834,329 B2 | 11/2010 | Lundquist et al. | |
| 7,838,847 B2 | 11/2010 | Lundquist et al. | |
| 8,053,742 B2 | 11/2011 | Lundquist et al. | |
| 8,179,119 B2 | 5/2012 | Seitz | |
| 8,207,509 B2 | 6/2012 | Lundquist et al. | |
| 8,274,040 B2 | 9/2012 | Zhong et al. | |
| 8,278,728 B2 | 10/2012 | Murshid | |
| 8,465,699 B2 | 6/2013 | Fehr et al. | |
| 8,471,219 B2 | 6/2013 | Lundquist et al. | |
| 8,471,230 B2 | 6/2013 | Zhong et al. | |
| 8,502,169 B2 | 8/2013 | Rigneault et al. | |
| 8,618,507 B1 | 12/2013 | Lundquist et al. | |
| 8,760,549 B2 | 6/2014 | Lehmann et al. | |
| 9,029,802 B2 | 5/2015 | Lundquist et al. | |
| 9,157,864 B2 | 10/2015 | Fehr et al. | |
| 9,222,123 B2 | 12/2015 | Zhong et al. | |
| 9,222,133 B2 | 12/2015 | Lundquist et al. | |
| 9,223,084 B2 | 12/2015 | Grot et al. | |
| 9,372,308 B1 | 6/2016 | Saxena et al. | |
| 9,587,276 B2 | 3/2017 | Lundquist et al. | |
| 9,606,060 B2 | 3/2017 | Chen et al. | |
| 9,658,161 B2 | 5/2017 | Saxena et al. | |
| 9,666,748 B2 | 5/2017 | Leobandung | |
| 9,719,138 B2 | 8/2017 | Zhong et al. | |
| 9,765,395 B2 | 9/2017 | Goldsmith | |
| 9,923,014 B2* | 3/2018 | Yeo | H01L 27/1461 |
| 9,946,017 B2 | 4/2018 | Saxena et al. | |
| 10,018,764 B2 | 7/2018 | Grot et al. | |
| 10,090,429 B2 | 10/2018 | Leobandung | |
| 10,138,515 B2 | 11/2018 | Fehr et al. | |
| 10,280,457 B2 | 5/2019 | Zhong et al. | |
| 10,310,178 B2 | 6/2019 | Saxena et al. | |
| 10,487,356 B2 | 11/2019 | Lundquist et al. | |
| 10,578,788 B2 | 3/2020 | Grot et al. | |
| 10,655,172 B2 | 5/2020 | Rank et al. | |
| 10,724,090 B2 | 7/2020 | McCaffrey et al. | |
| 10,731,209 B2* | 8/2020 | Ball et al. | C08L 1/02 |
| 10,845,308 B2* | 11/2020 | Rothberg et al. | H01L 27/14689 |
| 11,714,001 B2 | 8/2023 | Webster et al. | |
| 2002/0182716 A1 | 12/2002 | Weisbuch et al. | |
| 2003/0174992 A1 | 9/2003 | Levene et al. | |
| 2009/0114919 A1 | 5/2009 | Kawahito et al. | |
| 2010/0065726 A1 | 3/2010 | Zhong et al. | |
| 2012/0000274 A1 | 1/2012 | Fife | |
| 2013/0116153 A1 | 5/2013 | Bowen et al. | |
| 2016/0366350 A1 | 12/2016 | Roffet et al. | |
| 2016/0377543 A1 | 12/2016 | Rothberg et al. | |
| 2017/0146479 A1 | 5/2017 | Levine et al. | |
| 2017/0323912 A1 | 11/2017 | Lahav et al. | |
| 2018/0197910 A1 | 7/2018 | Lee et al. | |
| 2019/0025511 A1 | 1/2019 | Rothberg et al. | |
| 2019/0292590 A1 | 9/2019 | Zhong et al. | |
| 2019/0383739 A1 | 12/2019 | Rothberg et al. | |
| 2019/0391010 A1 | 12/2019 | Thurston et al. | |
| 2020/0408690 A1 | 12/2020 | Yang et al. | |
| 2021/0025823 A1 | 1/2021 | Rothberg et al. | |
| 2021/0025824 A1 | 1/2021 | Rothberg et al. | |
| 2021/0217800 A1 | 7/2021 | Webster et al. | |
| 2022/0128403 A1 | 4/2022 | Webster et al. | |

OTHER PUBLICATIONS

PCT/US2021/056013, Dec. 22, 2021, Invitation to Pay Additional Fees.
Invitation to Pay Additional Fees for International Application No. PCT/US2021/056013 dated Dec. 22, 2021.
Hale, Fibre Optic Sensors using Adiabatically Tapered Single Mode Fibres. Dissertation submitted to the University of Cambridge. Feb. 1994. 209 pages.
Mogensen et al., A Microfluidic Device with an Integrated Waveguide Beam Splitter for Velocity Measurements of Flowing Particles by Fourier Transformation. Analytical Chemistry. Sep. 15, 2003;75(18):4931-4936.
Taitt et al., Evanescent wave fluorescence biosensors. Biosens Bioelectron. Jun. 2005;20(12):2470-87. Epub Dec. 8, 2004.
International Search Report and Written Opinion for International Application No. PCT/US2021/056013 dated Jul. 18, 2022.
International Preliminary Report on Patentability for International Application No. PCT/US2021/056013 mailed May 4, 2023.
U.S. Appl. No. 18/489,841, filed Oct. 18, 2023, Webster et al.
PCT/US2021/056013, mailed May 4, 2023, International Preliminary Report on Patentability.

* cited by examiner

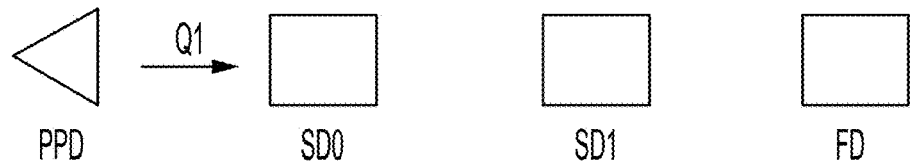
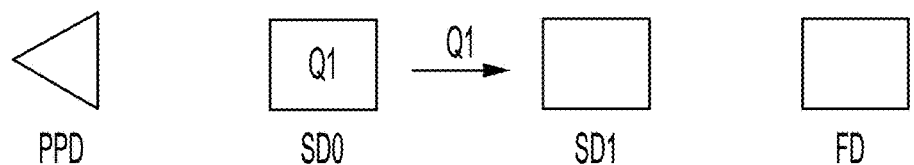
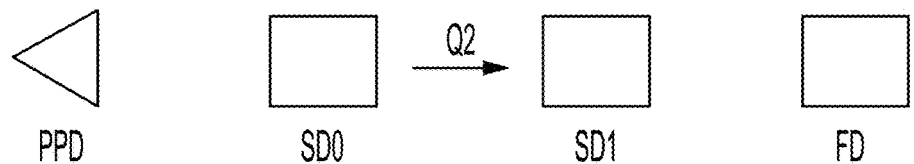
FIG. 1-8

INTEGRATED CIRCUIT WITH SEQUENTIALLY-COUPLED CHARGE STORAGE AND ASSOCIATED TECHNIQUES

RELATED APPLICATIONS

This application claims priority under 35 U.S.C. § 119(e) to U.S. Provisional Application Ser. No. 63/104,393, filed Oct. 22, 2020, and titled, "INTEGRATED CIRCUIT WITH SEQUENTIALLY-COUPLED CHARGE STORAGE AND ASSOCIATED TECHNIQUES," which is herein incorporated by reference in its entirety.

FIELD OF THE DISCLOSURE

The present disclosure relates to integrated devices and related instruments that can perform massively-parallel analyses of samples by providing short optical pulses to tens of thousands of sample wells or more simultaneously and receiving fluorescent signals from the sample wells for sample analyses. The instruments may be useful for point-of-care genetic sequencing and for personalized medicine.

BACKGROUND

Photodetectors are used to detect light in a variety of applications. Integrated photodetectors have been developed that produce an electrical signal indicative of the intensity of incident light. Integrated photodetectors for imaging applications include an array of pixels to detect the intensity of light received from across a scene. Examples of integrated photodetectors include charge coupled devices (CCDs) and Complementary Metal Oxide Semiconductor (CMOS) image sensors.

Instruments that are capable of massively-parallel analyses of biological or chemical samples are typically limited to laboratory settings because of several factors that can include their large size, lack of portability, requirement of a skilled technician to operate the instrument, power need, need for a controlled operating environment, and cost. When a sample is to be analyzed using such equipment, a common paradigm is to extract a sample at a point of care or in the field, send the sample to the lab and wait for results of the analysis. The wait time for results can range from hours to days.

SUMMARY OF THE DISCLOSURE

Some aspects of the present disclosure relate to a method, comprising, during a first time period, transferring first charge carriers from a first charge storage region to a second charge storage region and, during a second time period, receiving second charge carriers at the first charge storage region and reading out the first charge carriers from the second charge storage region.

Some aspects of the present disclosure relate to an integrated circuit, comprising a photodetection region configured to generate charge carriers in response to receiving incident photons, a first charge storage region electrically coupled to the photodetection region to receive charge carriers, and a second charge storage region electrically coupled to the first charge storage region to receive charge carriers, the integrated circuit configured to read out charge carriers from the second charge storage region while the first charge storage region receives charge carriers from the photodetection region.

Some aspects of the present disclosure relate to a system, comprising an integrated circuit, comprising a first charge storage region and a second charge storage region electrically coupled to the first charge storage region and a control circuit electrically coupled to the integrated circuit and configured to, during a first time period, control the integrated circuit to transfer, from the first charge storage region to the second charge storage region, first charge carriers and during a second time period, control the integrated circuit to receive, at the first charge storage region, second charge carriers and read out, from the second charge storage region, the first charge carriers.

Some aspects of the present disclosure relate to an integrated circuit, comprising a photodetection region, a first charge storage region, and a second charge storage region, wherein the photodetection region and the first and second charge storage regions are configured to induce an intrinsic electrical field in a first direction from the photodetection region to the first charge storage region and from the first charge storage region to the second charge storage region.

Some aspects of the present disclosure relate to an integrated circuit, comprising a first charge storage region configured to receive, generated in the integrated circuit in response to incident light from a light source, charge carriers and a second charge storage region electrically coupled to the first charge storage region and configured to receive, via the first charge storage region, charge carriers, wherein the second charge storage region is further configured to induce, in a first direction away from the first charge storage region, a first intrinsic electric field.

Some aspects of the present disclosure relate to a method of manufacturing an integrated circuit, the method comprising forming a photodetection region, a first charge storage region, and a second charge storage region in the integrated circuit, with the first charge storage region spaced from the photodetection region in the first direction and the second charge storage region spaced from the first charge storage region in the first direction, wherein the photodetection region, the first charge storage region, and the second charge storage region are formed so as to induce an intrinsic electric field in the first direction.

The foregoing summary is not intended to be limiting. Moreover, in accordance with various embodiments, aspects of the present disclosure may be implemented alone or in combination with other aspects.

BRIEF DESCRIPTION OF DRAWINGS

FIG. 1-2 is a cross-sectional view of an example pixel of the integrated device of FIG. 1-1, according to some embodiments.

FIG. 1-3A is a circuit diagram of the pixel of FIG. 1-2, according to some embodiments.

FIG. 1-3B is a block diagram of an example array of pixels of FIG. 1-2 and a processing circuit that may be included in the integrated device of FIG. 1-1, according to some embodiments.

FIG. 1-3C is a block diagram of an alternative example array of pixels of FIG. 1-2 and a plurality of processing circuits that may be included in the integrated device of FIG. 1-1, according to some embodiments.

FIG. 1-4 is a top view of an alternative example pixel that may be included in the integrated device of FIG. 1-1, according to some embodiments.

FIG. 1-5 is a top schematic view of the pixel of FIG. 1-4, according to some embodiments.

FIG. 1-6 is a view of the pixel of FIG. 1-4 along the cross-section identified in FIG. 1-5, according to some embodiments.

FIG. 1-7 is a graph of electric potential for a portion of the pixel as shown in FIG. 1-6, according to some embodiments.

FIG. 1-8 is a diagram illustrating charge transfer during time periods of example operation of the pixel of FIG. 1-2, according to some embodiments.

FIG. 1-9 is a time graph of control signals received during example operation of a plurality of pixels of FIG. 1-2, according to some embodiments.

FIG. 2-1 is a cross-sectional view of an alternative example pixel that may be included in the integrated device of FIG. 1-1, according to some embodiments.

FIG. 2-2 is a circuit diagram of the pixel of FIG. 2-1, according to some embodiments.

FIG. 2-3 is a top view of a further alternative example pixel that may be included in the integrated device of FIG. 1-1, according to some embodiments.

FIG. 2-4 is an alternative top view of the pixel of FIG. 2-3 illustrating contacts and routing channels of the pixel, according to some embodiments.

FIG. 2-5 is a view of the pixel of FIG. 2-3 along a cross-section, according to some embodiments.

FIG. 2-6 is a graph of intrinsic electric potential versus position for a portion of the pixel as shown in FIG. 2-5, according to some embodiments.

FIG. 2-7 is a diagram illustrating charge transfer during time periods of example operation of the pixel of FIG. 2-1, according to some embodiments.

FIG. 2-8a is a time graph of control signals received during example operation of a plurality of pixels of FIG. 2-1, according to some embodiments.

FIG. 2-8b is a magnified view of a portion of the time graph of FIG. 2-8a, according to some embodiments.

FIG. 2-9 is a diagram illustrating charge transfer during time periods of an alternative example operation scheme of the pixel of FIG. 2-1, according to some embodiments.

FIG. 3-1 is a cross-sectional schematic of an alternative example integrated device illustrating a row of pixels, according to some embodiments.

FIG. 3-2 is a cross-sectional view of an example pixel of the integrated device of FIG. 3-1, according to some embodiments.

FIG. 3-3A is a cross-sectional view of an alternative example pixel that may be included in the integrated device of FIG. 3-1, according to some embodiments.

FIG. 3-3B is a top view of a portion of the pixel of FIG. 3-3A, according to some embodiments.

FIG. 3-4 is a top view of an example pixel having an alternative readout configuration that may be included in the integrated device of FIG. 3-1, according to some embodiments.

FIG. 3-5A is a top view of an example pixel having a further alternative readout configuration that may be included in the integrated device of FIG. 3-1, according to some embodiments.

FIG. 3-5B is a cross-sectional view of a portion of the pixel of FIG. 3-5A, according to some embodiments.

FIG. 3-6 is a top view of a further alternative example pixel that may be included in the integrated device of FIG. 3-1, according to some embodiments.

FIG. 3-7 is a top view of an example pixel having an alternative configuration of charged and/or biased regions that may be included in the integrated device of FIG. 3-1, according to some embodiments.

FIG. 3-8 is a top view of an example pixel having an alternative charge storage region doping configuration that may be included in the integrated device of FIG. 3-1, according to some embodiments.

FIG. 4-1A is a block diagram of an integrated device and an instrument, according to some embodiments.

FIG. 4-1B is a schematic of an apparatus including an integrated device, according to some embodiments.

FIG. 4-1C is a block diagram depiction of an analytical instrument that includes a compact mode-locked laser module, according to some embodiments.

FIG. 4-1D depicts a compact mode-locked laser module incorporated into an analytical instrument, according to some embodiments.

FIG. 4-2 depicts a train of optical pulses, according to some embodiments.

FIG. 4-3 depicts an example of parallel reaction chambers that can be excited optically by a pulsed laser via one or more waveguides according to some embodiments.

FIG. 4-4 illustrates optical excitation of a reaction chamber from a waveguide, according to some embodiments.

FIG. 4-5 depicts further details of an integrated reaction chamber, optical waveguide, and time-binning photodetector, according to some embodiments.

FIG. 4-6 depicts an example of a biological reaction that can occur within a reaction chamber, according to some embodiments.

FIG. 4-7 depicts emission probability curves for two different fluorophores having different decay characteristics according to some embodiments.

FIG. 4-8 depicts time-binning detection of fluorescent emission, according to some embodiments.

FIG. 4-9 depicts a time-binning photodetector, according to some embodiments.

FIG. 4-10A depicts pulsed excitation and time-binned detection of fluorescent emission from a sample, according to some embodiments.

FIG. 4-10B depicts a histogram of accumulated fluorescent photon counts in various time bins after repeated pulsed excitation of a sample, according to some embodiments.

FIG. 4-11A depicts a histogram corresponding to a T nucleotide or nucleotide analog, according to some embodiments.

FIG. 4-11B depicts a histogram corresponding to an A nucleotide or nucleotide analog, according to some embodiments.

FIG. 4-11C depicts a histogram corresponding to a C nucleotide or nucleotide analog, according to some embodiments.

FIG. 4-11D depicts a histogram corresponding to a G nucleotide or nucleotide analog, according to some embodiments.

FIG. 4-12 is a flow diagram illustrating a method of sequencing a labeled polypeptide by Edman degradation according to some embodiments.

FIG. 4-13 includes a flow diagram illustrating a method of sequencing in which discrete binding events give rise to signal pulses of a signal output, and a graph illustrating the signal output according to some embodiments.

Figure 1:
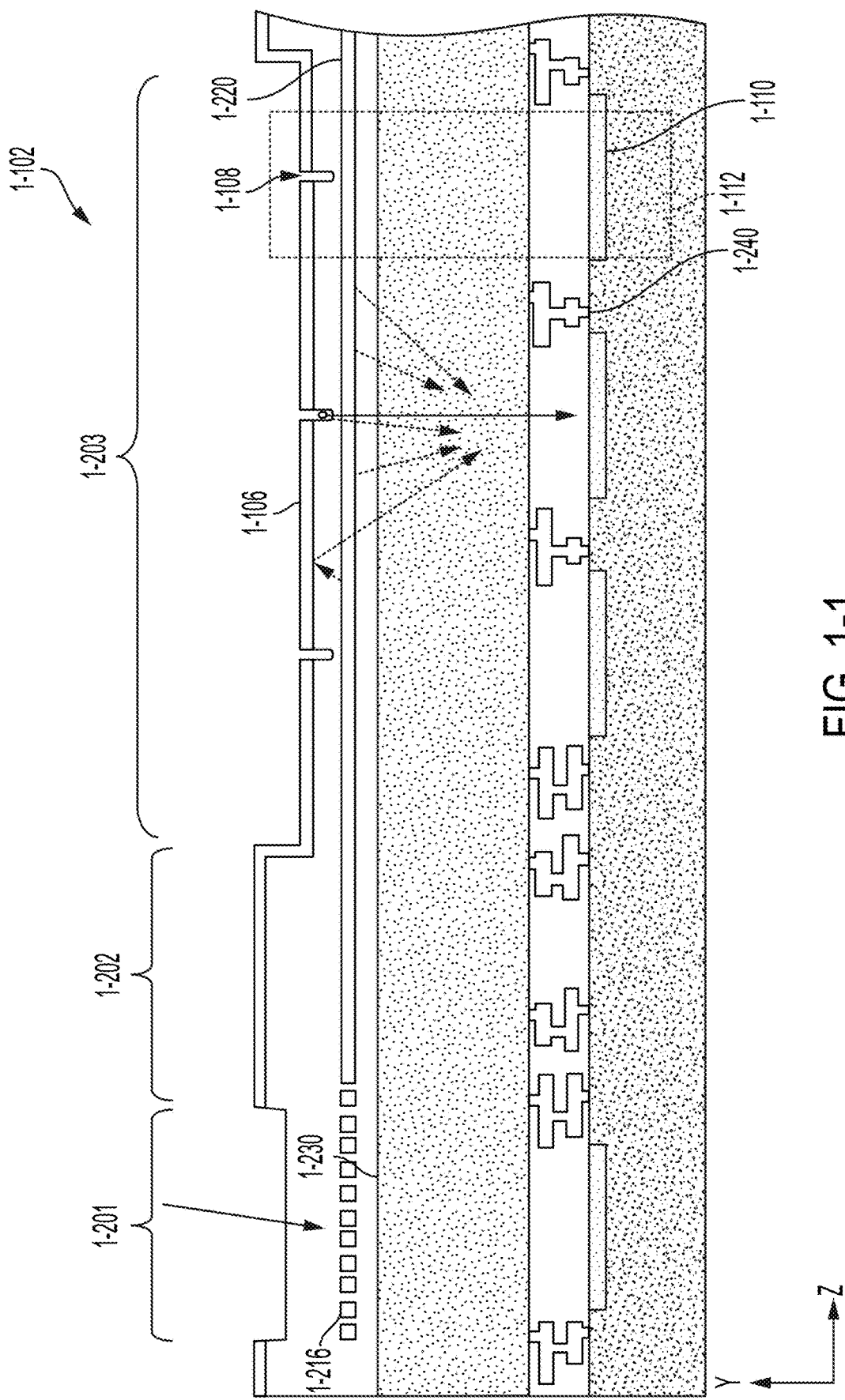
FIG. 1-1 is a cross-sectional schematic of an example integrated device illustrating a row of pixels, according to some embodiments.

The features and advantages of the present disclosure will become more apparent from the detailed description set forth below when taken in conjunction with the drawings. When describing embodiments in reference to the drawings, directional references ("above," "below," "top," "bottom," "left," "right," "horizontal," "vertical," etc.) may be used.

Such references are intended merely as an aid to the reader viewing the drawings in a normal orientation. These directional references are not intended to describe a preferred or only orientation of features of an embodied device. A device may be embodied using other orientations.

DETAILED DESCRIPTION

I. Introduction

Aspects of the present disclosure relate to integrated devices, instruments and related systems capable of analyzing samples in parallel, including identification of single molecules, protein sequencing, and nucleic acid sequencing. Such an instrument may be compact, easy to carry, and easy to operate, allowing a physician or other provider to readily use the instrument and transport the instrument to a desired location where care may be needed. Analysis of a sample may include labeling the sample with one or more fluorescent markers, which may be used to detect the sample and/or identify single molecules of the sample (e.g., individual nucleotide identification as part of nucleic acid sequencing). A fluorescent marker may become excited in response to illuminating the fluorescent marker with excitation light (e.g., light having a characteristic wavelength that may excite the fluorescent marker to an excited state) and, if the fluorescent marker becomes excited, emit emission light (e.g., light having a characteristic wavelength emitted by the fluorescent marker by returning to a ground state from an excited state). Detection of the emission light may allow for identification of the fluorescent marker, and thus, the sample or a molecule of the sample labeled by the fluorescent marker. According to some embodiments, the instrument may be capable of massively-parallel sample analyses and may be configured to handle tens of thousands of samples or more simultaneously.

The inventors have recognized and appreciated that an integrated device, having sample wells configured to receive the sample and integrated optics formed on the integrated device, and an instrument configured to interface with the integrated device may be used to achieve analysis of this number of samples. The instrument may include one or more excitation light sources, and the integrated device may interface with the instrument such that the excitation light is delivered to the sample wells using integrated optical components (e.g., waveguides, optical couplers, optical splitters) formed on the integrated device. The optical components may improve the uniformity of illumination across the sample wells of the integrated device and may reduce a large number of external optical components that might otherwise be needed. Furthermore, the inventors have recognized and appreciated that integrating photodetection regions (e.g., photodiodes) on the integrated device may improve detection efficiency of fluorescent emissions from the sample wells and reduce the number of light-collection components that might otherwise be needed.

In some embodiments, the integrated device may receive fluorescence emission photons and transmit charge carriers to one or more charge storage regions. For example, a photodetection region may be positioned on the integrated device to receive the fluorescent emissions along an optical axis, and the photodetection region also may be coupled to one or more charge storage regions (e.g., storage diodes) along an electrical axis, such that the charge storage region(s) may collect charge carriers generated in the photodetection region based on the fluorescent emissions. In some embodiments, during a collection period, the charge storage region(s) may receive the charge carriers from the photodetection region, and during a separate readout period, the charge storage region(s) may provide the stored charge carriers to a readout circuit for processing. In some embodiments, during a drain period, a drain region of the integrated device may receive noise charge carriers (e.g., excitation charge carriers generated responsive to incident excitation photons) from the photodetection region for discarding.

While it may be desirable to excite a sample and collect as many fluorescent charge carriers from the sample as possible over a given period of time, the rate at which the pixel is configured to collect charge carriers may be limited by factors such as the charge transfer rate in the pixel, the charge storage configuration of the pixel, and the process by which charge carriers are read out from the pixel. For instance, a pixel having a single charge storage region electrically coupled between the photodetection region and the readout region needs to have the charge carriers read out or otherwise cleared from the charge storage region in order for charge carriers to be collected again in the charge storage region. In an integrated device having fewer readout processing circuits than pixels (e.g., one readout circuit per column or for the entire array), the readout processing circuit(s) may be selectively coupled (e.g., multiplexed) to one or more pixels of the integrated device to read out charge carriers from the selected pixel(s) during a predetermined readout time period for the selected pixel(s). Since charge carriers are only read out from a subset of pixels of the integrated device at a time, it may take multiple readout time periods for charge carriers to be read out from all of the pixels. Moreover, the entire array of pixels may not be able to collect charge carriers from the photodetection region until charge carriers have been read out from each pixel.

Moreover, the charge transfer rate of a pixel may limit how quickly the pixel can transition between collecting and reading out charge carriers. For instance, a pixel may be configured to receive a control signal that induces an electric field in the pixel to transport charge carriers within the pixel during a collection or readout period. The collection or readout period may need to be long enough to collect or read out a large number of charge carriers for the readout processing circuitry to receive a sufficiently large signal for processing. However, the rate of charge transfer in the pixel may be limited by the electric field that can be applied to the pixel, and there are practical limitations on the electric field that can be applied to the pixel. Thus, the rate of charge transfer in the pixel may limit how short the collection and readout periods of the pixel may be, thereby limiting how frequently within a given time period the integrated device can collect and read out charge carriers.

In addition, the duration of a readout period may be limited at least in part based on the process by which charge carriers are read out from the pixel. For example, readout processing circuitry of the integrated device may be configured to reset a voltage of the readout region of each pixel prior to transferring charge carriers into the readout region and reading out the charge carriers for processing. In this example, the integrated device may be configured to perform correlated double sampling (CDS), in which a voltage of the readout region is sampled after the reset and again after the charge carriers are read out, such that a charge level indicating the number of charge carriers in the readout region can be determined using the difference between the sampled voltages. The duration of the readout period may thus be limited by the time needed to reset the voltage of the readout region, which can add up to a long period of time when many pixels are read out and sampled sequentially.

Moreover, resetting the readout region between readout periods may also introduce noise into the readout region, for example, by resetting the voltage of the readout region to slightly different voltage levels in each reset.

To solve the above problems, the inventors have developed integrated devices and associated techniques that improve the collection and readout of charge carriers in a pixel or array of pixels. Some aspects of the present disclosure relate to integrated circuits having pixels with a plurality of charge storage regions. In some embodiments, an integrated circuit may have a first charge storage region, a second charge storage region electrically coupled to the first charge storage region and configured to receive charge carriers via the first charge storage region, and a readout region electrically coupled to the second charge storage region and configured to receive charge carriers via the second charge storage region. By including a second charge storage region electrically coupled to the first charge storage region and the readout region, the integrated circuit may be capable of receiving charge carriers at the first charge storage region, transferring the charge carriers to the second charge storage region, and once again receiving charge carriers at the first charge storage region, irrespective of when the charge carriers in the second charge storage region are read out to the readout region. Thus, such an integrated circuit may be configured to collect charge carriers more frequently than an integrated circuit having only a single charge storage region per pixel. In some embodiments, the first and second charge storage region and the second charge storage region and the readout region may be electrically coupled by respective transfer channels controlled by transfer gates, as described herein.

Some aspects of the present disclosure relate to integrated circuits configured to collect and read out charge carriers substantially simultaneously, at least in part. In some embodiments, an integrated circuit may include a first charge storage region and a second charge storage region electrically coupled to the first charge storage region and configured to receive first charge carriers via the first charge storage region, the integrated circuit being configured to, during a same time period, receive second charge carriers at the first charge storage region and read out the first charge carriers from the second charge storage region. For example, the integrated circuit can be configured to, during a first time period, receive the first charge carriers at the first charge storage region and, during a second time period, receive second charge carriers at the first charge storage region and also read out the first charge carriers from the second charge storage region. In this example, by receiving and reading out charge carriers during the same time period (e.g., the second time period), charge carrier collection is not inhibited by the time required to read out the charge carriers from the second charge storage region, thus improving the frequency with which the integrated circuit is capable of collecting charge carriers.

In some embodiments, the integrated circuit may be configured to control the timing of charge carrier reception and readout by providing control signals to transfer gates that control the reception and/or transfer of charge carriers among the regions of the integrated circuit, as described herein. In some embodiments, the integrated circuit may be configured to receive the second charge carriers from the beginning of the time period to the end of the time period and read out the first charge carriers during only a portion of the time period, such that collection and read out are performed at least partially simultaneously. For example, the integrated circuit may be configured to read out from subsets of pixels during different sub-periods of time within the period of time over which charge carriers are received at the first charge storage region.

It should be appreciated that charge carrier reception and readout may occur substantially simultaneously rather than precisely simultaneously, as charge carriers may not be read out from each pixel during the entire time period in which charge carriers are received, and/or because propagation delays in control signals provided to the transfer gates of a pixel (or of multiple pixels) may arrive at slightly different times, causing charge carrier reception and transfer to occur at correspondingly different times.

It should also be appreciated that such techniques can be implemented using more than two sequentially-coupled charge storage regions. For example, an intermediate charge storage region can be coupled between the first and second charge storage regions. In some embodiments, the charge storage regions can be first, second, and third charge storage regions as described further herein.

Some aspects of the present disclosure relate to integrated circuits having a plurality of pixels configured to transfer charge carriers between charge storage regions within each pixel substantially at the same time. In some embodiments, an integrated circuit may include a first pixel having first and second charge storage regions and a second pixel having first and second charge storage regions. The integrated circuit may be configured to, during a same time period, transfer first charge carriers from the first charge storage region of the first pixel to the second charge storage region of the first pixel and transfer second charge carriers from the first charge storage region of the second pixel to the second charge storage region of the second pixel. By transferring the first and second charge carriers within the respective first and second pixels during the same time period, the first charge storage regions may be configured to receive charge carriers again in a same subsequent time period, irrespective of when the first and second charge carriers are read out. For example, in some embodiments, the time period during which the charge carriers are transferred between the charge storage regions within the respective pixels may be a first time period, and the integrated circuit may be configured to read out the first charge carriers during a second time period and read out the second charge carriers during a third time period. Thus, despite the first and second charge carriers being read out from the respective first and second pixels during different time periods, the first and second pixels may be capable of receiving charge carriers in the same subsequent time period (e.g., concurrently with the second and third time periods, in some embodiments).

Some aspects of the present disclosure relate to integrated circuits having three or more sequentially coupled charge storage regions. In some embodiments, an integrated circuit may include a first charge storage region, a second charge storage region electrically coupled to the first charge storage region, and a third charge storage region electrically coupled to the second charge storage region and configured to receive charge carriers via the second charge storage region. By including a third charge storage region in addition to the first and second charge storage regions, the integrated circuit may be capable of reading out charge carriers from the first and second charge storage regions, respectively, without resetting a voltage of the readout region between readouts. For example, the voltage of the readout region may be reset and sampled, charge carriers may be read out from the third charge storage region into the readout region and the voltage of the readout region sampled again, and then charge carriers may be read out from the second charge storage region via the third charge storage region and the voltage of the readout region sampled again without resetting the voltage of the readout region in between. In this example, the number of charge carriers read out from the second charge storage region may be determined using the difference between the second and third sampled voltages. By not resetting the voltage of the readout region in between reading out charge carriers from the second and third charge storage regions, respectively, the readout process may be performed more quickly and without introducing noise into the readout region between readouts of charge carriers from the second and third charge storage regions, respectively.

In some embodiments, the integrated circuit may be configured to transfer first charge carriers from the third charge storage region to the readout region and determine a first charge level of the charge carriers based on a first voltage level of the readout region with the charge carriers therein. The integrated circuit may be further configured to transfer second charge carriers from the second charge storage region to the readout region and determine a second charge level of the second charge carriers based on a second voltage level of the readout region with the second charge carriers therein. For example, the second charge level may be determined by subtracting the first voltage level from the second voltage level. In this manner, charge levels for the first and second charge carriers may be determined without resetting the voltage of the readout region between reading out the first and second charge carriers, thereby reducing the time consumed by the readout period and decreasing the noise in signals read out from the pixels of the integrated device.

Some aspects of the present disclosure relate to integrated circuits capable of transferring charge carriers at an increased rate. In some embodiments, an integrated circuit may include a photodetection region, a first charge storage region, and a second charge storage region, with the photodetection region and the first and second charge storage regions being configured to induce an intrinsic electric field in a first direction from the photodetection region to the first charge storage region and from the first charge storage region to the second charge storage region. By inducing an intrinsic electric field that is present in the integrated circuit even when no external electric field is applied to the integrated circuit, the electric field may be further intensified when an external electric field is applied to the integrated circuit, thereby increasing the rate of charge transfer in the integrated circuit. In some embodiments, regions of the integrated circuits may be configured to have different intrinsic electric potential levels (e.g., different pinning voltages, different dopant concentrations, etc., as described further herein). For example, the intrinsic electric potential level of the first charge storage region may be higher (e.g., for n-type doped regions) or lower (e.g., for p-type doped regions) than of the photodetection region, and the intrinsic electric potential level of the second charge storage region may be higher or lower than of the first charge storage region. The different intrinsic electric potential levels may induce the intrinsic electric field in the integrated circuit, thereby increasing the rate of charge transfer in the integrated circuit. In some embodiments, a charge storage region may be configured to induce an intrinsic electric field within the charge storage region, such as by having multiple sub-regions configured to have different intrinsic electric potential levels, as described further herein.

It should be appreciated that intrinsic electrical characteristics (e.g., fields, potential levels, etc.) of integrated circuits described herein are maintained in the absence of external electric fields (e.g., when no power or control signals are applied to or by the integrated circuit) but may be impacted (e.g., canceled, reduced, added to, etc.) by such external electric fields, as described herein.

Some aspects of the present disclosure relate to techniques for manufacturing integrated circuits according to the other techniques described herein, such as by forming an integrated circuit having multiple charge storage regions, and/or configuring an integrated circuit to induce an intrinsic electric field in a first direction from a photodetection region to a first charge storage region and from the first charge storage region to a second charge storage region.

It should be appreciated that techniques described herein may be implemented alone or in combination, as the present disclosure is not so limited.

II. Integrated Device Overview

A cross-sectional schematic of integrated device 1-102 illustrating a row of pixels 1-112 is shown in FIG. 1-1, according to some embodiments. Integrated device 1-102 may include coupling region 1-201, routing region 1-202, and pixel region 1-203. Coupling region 1-201 may be configured to receive incident excitation light from an excitation light source. Routing region 1-202 may be configured to deliver the excitation light from coupling region 1-201 to pixel region 1-203. Pixel region 1-203 may include a plurality of sample wells 1-108 positioned on a surface at a location separate from coupling region 1-201. For example, coupling region 1-201 may include one or more grating couplers 1-216 and routing region 1-202 may include one or more waveguides 1-220 configured to propagate light from grating coupler(s) 1-216 under sample well(s) 1-108. For instance, evanescent coupling of excitation light from waveguide(s) 1-220 may excite samples in sample well(s) 1-108 to emit fluorescent light.

As shown in FIG. 1-1, one or more at least partially opaque (e.g., metal) layers 1-106 can be disposed over the surface to reflect incident excitation light coupled from waveguide(s) 1-220. Sample wells 1-108 may be free of layer(s) 1-106 to allow samples to be placed in sample well(s) 1-108. In some embodiments, the directionality of the emission light from a sample well 1-108 may depend on the positioning of the sample in the sample well 1-108 relative to metal layer(s) 1-106 because metal layer(s) 1-106 may act to reflect emission light. In this manner, a distance between metal layer(s) 1-106 and a fluorescent marker on a sample positioned in a sample well 1-108 may impact the efficiency of photodetector(s) 1-110, that are in the same pixel as the sample well, to detect the light emitted by the fluorescent marker. The distance between metal layer(s) 1-106 and the bottom surface of a sample well 1-108, which is proximate to where a sample may be positioned during operation, may be in the range of 100 nm to 500 nm, or any value or range of values in that range. In some embodiments the distance between metal layer(s) 1-106 and the bottom surface of a sample well 1-108 is approximately 300 nm.

As shown in FIG. 1-1, pixel region 1-203 can include one or more rows of pixels 1-112. One pixel 1-112, illustrated by the dotted rectangle, is a region of integrated device 1-102 that includes a sample well 1-108 and one or more photodetectors 1-110 (e.g., including a photodetection region) associated with the sample well 1-108. In some embodiments, each photodetector 1-110 can include a photodetection region and one or more charge storage regions configured to receive charge carriers generated in the photodetection region in response to incident light from the sample well 1-108. When excitation light coupled from waveguide(s) 1-220 illuminates a sample located within the sample well 1-108, the sample may reach an excited state and emit emission light. The emission light may be detected by one or more photodetectors 1-110 associated with the sample well 1-108. FIG. 1-1 schematically illustrates an optical axis of emission light (shown as the solid line) from a sample well 1-108 to photodetector(s) 1-110 of pixel 1-112. The photodetector(s) 1-110 of pixel 1-112 may be configured and positioned to detect emission light from sample well 1-108. For an individual pixel 1-112, a sample well 1-108 and its respective photodetector(s) 1-110 may be aligned along a common optical axis. In this manner, the photodetector(s) 1-110 may overlap with the sample well 1-108 within a pixel 1-112.

Also shown in FIG. 1-1, integrated device 1-102 can include one or more photonic structures 1-230 and/or metal layers 1-240 positioned between sample wells 1-108 and photodetectors 1-110. For example, photonic structures 1-230 may be configured to increase the amount of emission light that reaches photodetectors 1-110 from sample wells 1-108. Alternatively or additionally, photonic structures 1-230 may be configured to reduce or prevent excitation light from reaching photodetectors 1-110, which may otherwise contribute to signal noise in detecting the emission light. As shown in FIG. 1-1, photonic structures 1-230 may be positioned between waveguide(s) 1-220 and photodetectors 1-110. According to various embodiments, photonic structures 1-230 may include one or more optical rejection photonic structures including a spectral filter, a polarization filter, and a spatial filter. In some embodiments, photonic structures 1-230 may be positioned to align with individual sample wells 1-108 and their respective photodetector(s) 1-110 along a common axis.

In some embodiments, metal layers 1-240 may be configured to route control signals to and/or from portions of integrated device 1-102. For example, the control signals may be received from a control circuit within and/or coupled to one or more conductive pads (not shown) of integrated device 1-102 and routed to pixels 1-112 via metal layers 1-240. In some embodiments, metal layers 1-240 may also act as a spatial and/or polarization filter. In such embodiments, one or more metal layers 1-240 may be positioned to block some or all excitation light from reaching photodetector(s) 1-110.

In some embodiments, the distance between the sample and the photodetector(s) may also impact efficiency in detecting emission light. By decreasing the distance light has to travel between the sample and the photodetector(s) 1-110, detection efficiency of emission light may be improved. In addition, smaller distances between the sample and the photodetector(s) 1-110 may allow for pixels that occupy a smaller area footprint of the integrated device, which can allow for a higher number of pixels to be included in the integrated device. The distance between the bottom surface of a sample well 1-108 and the photodetector(s) 1-110 may be in the range of 5 μm to 15 μm, or any value or range of values in that range, in some embodiments, but the invention is not so limited. It should be appreciated that, in some embodiments, emission light may be provided through other means than an excitation light source and a sample well. Accordingly, some embodiments may not include sample well 1-108.

A sample to be analyzed may be introduced into sample well 1-108 of pixel 1-112. The sample may be a biological sample or any other suitable sample, such as a chemical sample. The sample may include multiple molecules and the sample well may be configured to isolate a single molecule. In some instances, the dimensions of the sample well 1-108 may act to confine a single molecule within the sample well 1-108, allowing measurements to be performed on the single molecule. Excitation light may be delivered into the sample well 1-108, so as to excite the sample or at least one fluorescent marker attached to the sample or otherwise associated with the sample while it is within an illumination area within the sample well 1-108.

In operation, parallel analyses of samples within the sample wells 1-108 are carried out by exciting some or all of the samples within the wells using excitation light and detecting signals from sample emission with the photodetectors 1-110. Emission light from a sample may be detected by a corresponding photodetector 1-110 and converted to at least one electrical signal. The electrical signals may be transmitted along conducting lines (e.g., metal layers 1-240) of integrated device 1-102, which may be connected to an instrument and/or control circuit interfaced with the integrated device 1-102. The electrical signals may be subsequently processed and/or analyzed by the instrument and/or control circuit.

III. Example Dual Charge Storage Pixel Structure

Figures 1, 2:
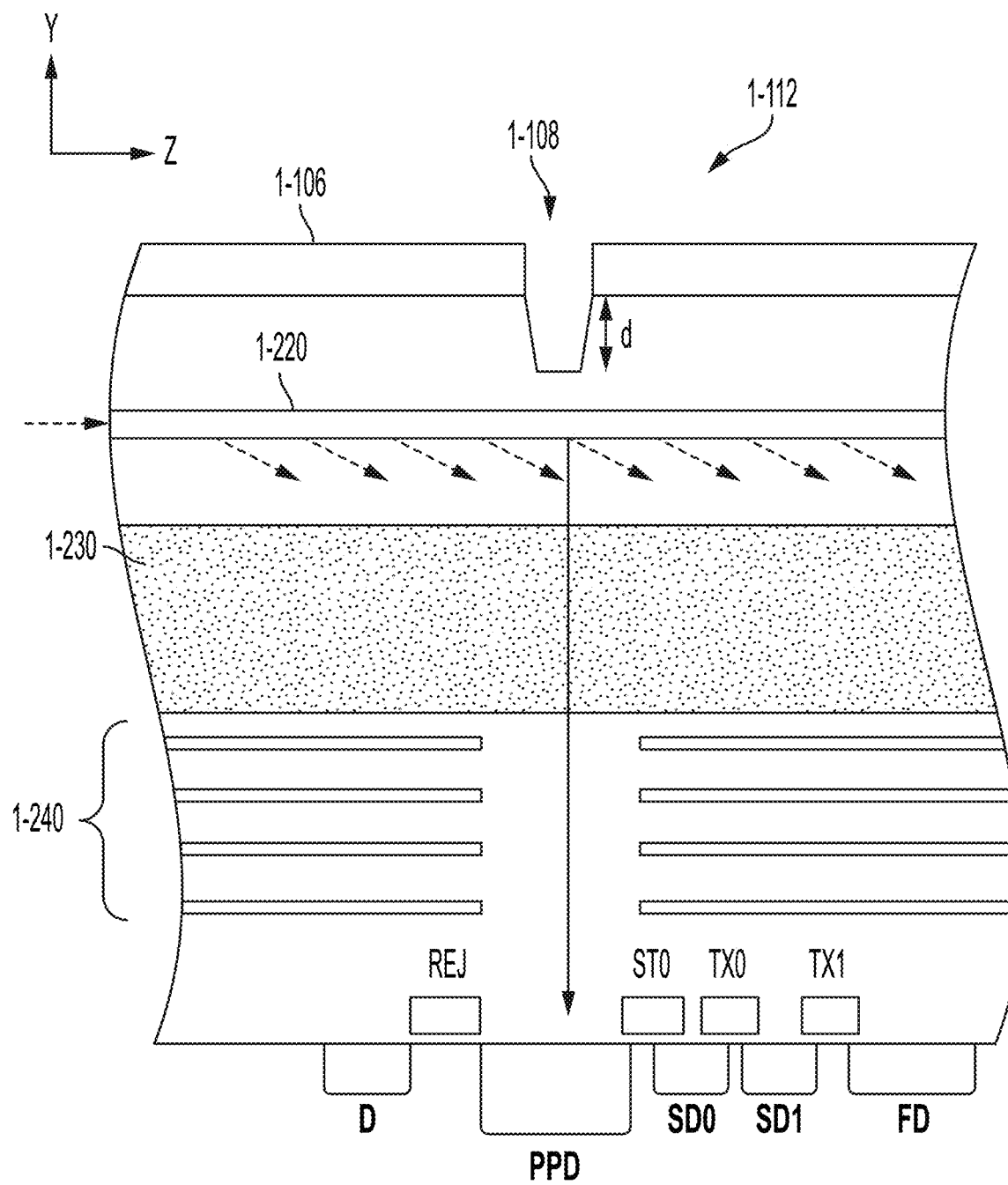

Some aspects of the present disclosure relate to integrated circuits having a plurality of charge storage regions (e.g., per pixel). FIG. 1-2 illustrates a cross-sectional view of a pixel 1-112 of integrated device 1-102, according to some embodiments. FIG. 1-3A shows a circuit diagram of pixel 1-112. FIG. 1-3B shows an example array of pixels 1-112 and processing circuit 1-114, which may be included in integrated device 1-102, according to some embodiments. FIG. 1-3C shows an alternative example array of pixels 1-112 and processing circuits 1-114*a*, 1-114*b*, and 1-114*m*, which may be included in integrated device 1-102, according to some embodiments.

In FIGS. 1-2 and 1-3A, pixel 1-112 includes a photodetection region, which may be a pinned photodiode (PPD), two charge storage regions, which may be storage diodes (SD0 and SD1), and a readout region, which may be a floating diffusion (FD) region. Also as shown, pixel 1-112 also includes drain region D and transfer gates ST0, TX0, TX1, and REJ.

In some embodiments, photodetection region PPD, charge storage regions SD0 and SD1 and readout region FD may be formed on an integrated circuit substrate by doping parts of the substrate. For example, the substrate may be lightly doped and photodetection region PPD, charge storage regions SD0 and SD1, and readout region FD may be more heavily doped. In this example, the substrate may be lightly p-type doped and photodetection region PPD, charge storage regions SD0 and SD1, and readout region FD may be n-type doped. Alternatively, the substrate may be lightly n-type doped and photodetection region PPD, charge storage regions SD0 and SD1, and readout region FD may be p-type doped, as embodiments described herein are not so limited.

In some embodiments photodetection region PPD may be configured to generate charge carriers (e.g., photo-electrons) when incident photons are received therein. In some embodiments, charge storage regions SD0 and SD1 may be electrically coupled to photodetection region PPD and/or to one another. For example, pixel 1-112 may include one or more transfer channels electrically coupling charge storage regions SD0 and SD1 to photodetection region PPD and/or to one another. In some embodiments, the transfer channels may be formed by doping portions of the integrated circuit substrate disposed between the regions. For example, the portions may be doped with a same conductivity type as the regions (e.g., an n-type doped channel disposed between an n-type doped PPD and SD0). Referring to FIG. 1-3A, for example, a channel of a transistor coupled between photodetection region PPD and charge storage region SD0 is a transfer channel electrically coupling photodetection region PPD to charge storage region SD0. Similarly, a channel of a transistor coupled between charge storage regions SD0 and SD1 is a transfer channel electrically coupling charge storage region SD0 to SD1, a channel of a transistor coupled between charge storage region SD1 and readout region FD is a transfer channel electrically coupling charge storage region SD1 to readout region FD. A channel of a transistor coupled between photodetection region PPD and drain region D is a transfer channel between photodetection region PPD and drain region D.

In some embodiments, transfer gates ST0, TX0, TX1, and REJ may be configured to control the transfer of charge carriers from photodetection region PPD to storage regions SD0 and SD1, between charge storage regions SD0 and SD1, and/or between charge storage regions SD0 and SD1 and readout region FD. For example, transfer gates ST0, TX0, TX1, and REJ may be electrically coupled to and configured to bias the transfer channels electrically coupling the regions of pixel 1-112 to transfer the charge carriers between the regions when appropriate control signals are applied to the transfer gates. The transfer gates may be conductively (e.g., physically) coupled to the transfer channels, and/or may be positioned close enough to the transfer channels and/or separated by a thin enough insulator to capacitively couple to the transfer channels, according to various embodiments. In some embodiments, transfer gates described herein may be formed using a conductive material such as metal. Alternatively or additionally, in some embodiments, transfer gates described herein may be formed using a semiconductor material such as polysilicon. In some embodiments, materials used to form transfer gates described herein may be at least partially opaque.

In some embodiments, when a control signal is received at a transfer gate, the transfer gate may electrically couple the control signal to the transfer channel and bias the transfer channel, thereby increasing the conductivity of the transfer channel. In some embodiments, the transfer channel may be doped with a same conductivity type but a lower dopant concentration than the regions of pixel 1-112 electrically coupled by the transfer channel, thereby generating an intrinsic electric potential barrier between the regions. The intrinsic electric potential barrier may exist between the regions even when no external electric field is applied to the transfer gate or transfer channel. For example, the dopant concentration of the transfer channel between photodetection region PPD and charge storage region SD0 may generate an intrinsic electric potential barrier between photodetection region PPD and charge storage region SD0. In some embodiments, a control signal may be applied to the transfer gate, the control signal being configured to lower the intrinsic electric potential barrier between the regions electrically coupled by the transfer channel, thereby increasing the conductivity of the transfer channel, and causing a transfer of charge carriers between the regions. For example, for an n-type doped transfer channel, the control signal may have a voltage that is greater than a voltage at one of the regions (e.g., at the source terminal of the transfer channel) by at least a threshold voltage of the transfer channel, the threshold voltage being dependent on the size of the transfer channel, a substrate voltage of the integrated device 1-102 proximate the transfer channel, and other such parameters. Similarly, for a p-type doped transfer channel, the control signal may have a voltage that is lower than the voltage at the one of the regions by at least the threshold voltage. In some embodiments, a control circuit of integrated device 1-102, and/or of a system that includes integrated device 1-102, may be configured to generate and provide such control signals to the transfer gates, as described further herein.

In FIG. 1-3A, pixel 1-112 further includes a reset (RST) transfer gate coupled to readout region FD and configured for coupling to a high voltage VDDP, and a row select (RS) transfer gate coupled between readout region FD and a bitline. When the integrated device 1-102 is coupled to a power source (e.g., at least a DC power supply), transfer gate RST may be coupled to high voltage VDDP, which is supplied by the power source and/or regulated by a voltage regulator of integrated device 1-102.

In some embodiments, transfer gate RST may be configured to reset a voltage of readout region FD. For example, when a reset signal is applied to transfer gate RST, transfer gate RST may bias the transfer channel electrically coupling readout region FD to high voltage VDDP, thereby increasing the conductivity of the transfer channel and transferring charge carriers from readout region FD to high voltage VDDP. In some embodiments, reset transfer gate RST may be further configured to reset the voltage of charge storage region SD0 and/or SD1. For example, when a reset signal is applied to reset transfer gate RST and a control signal is applied to transfer gate TX1, transfer gate TX1 may transfer charge carriers in charge storage region SD1 to readout region FD and transfer gate RST may transfer the charge carriers to high voltage VDDP. Similarly, when a reset signal is applied to reset transfer gate RST and control signals are applied to transfer gates TX1 and TX0, transfer gate TX0 may transfer charge carriers in charge storage region SD0 to SD1, transfer gate TX1 may transfer the charge carriers in charge storage region SD1 to readout region FD, and transfer gate RST may transfer the charge carriers to high voltage VDDP. In some embodiments, integrated device 1-102 may be configured to reset readout region FD and charge storage regions SD0 and SD1 before collecting and reading out charge carriers. For example, integrated device 1-102 may be configured to reset readout region FD, then reset charge storage region SD1, and then reset charge storage region SD0, before collecting and reading out charge carriers.

In some embodiments, the bitline may be coupled to processing circuitry on the integrated device 1-102 and/or an external circuit configured to receive a voltage level indicative of charge carriers read out to readout region FD. For example, as shown in FIG. 1-3B, a single bitline is electrically coupled between each pixel 1-112 of the array and processing circuitry 1-114. In some embodiments, processing circuitry 1-114 may include an analog-to-digital converter (ADC). In some embodiments, integrated device 1-102 may be configured to reset the voltage of readout region FD of each pixel before reading out charge carriers. For example, integrated device 1-102 may be configured to reset the voltage of readout region FD, sample the voltage, transfer charge carriers into readout region FD, and sample the voltage again. In this example, the second sampled voltage may be indicative of a number of the charge carriers transferred into readout region FD when compared to the first sampled voltage. In some embodiments, integrated device 1-102 may be configured to read out charge carriers from each pixel 1-112 to the bitline sequentially, such as row by row and/or column by column.

It should be appreciated that some arrays of pixels 1-112 may have multiple bitlines electrically coupled to different ones and/or groups of pixels 1-112, such as shown in FIG. 1-3C, with bitline a coupling to a first column of pixels 1-112 to processing circuitry 1-114a, bitline b coupling a second column of pixels 1-112 to processing circuitry 1-114b, up to bitline M coupling to an m-th column of pixels 1-112 to processing circuitry 1-114m. In some embodiments, pixels of multiple columns may be read out to respective processing circuitry at the same time. For example, a first pixel of each column (e.g., pixels (1,1) and (1,2) and so on) may be read out to the respective processing circuitry at the same time, and then a second pixel of each column (e.g., pixels (2,1) and (2,2,) and so on) may be read out to the respective processing circuitry at the same time. It should be appreciated that, in some embodiments, processing circuitry may be provided for each row of the array as an alternative or in addition to each column. In some embodiments, integrated device 1-102 may include multiple units of processing circuitry, such as each being electrically coupled to a bitline.

It should be appreciated that, in accordance with various embodiments, transfer gates described herein may include semiconductor material(s) and/or metal, and may include a gate of a field effect transistor (FET), a base of a bipolar junction transistor (BJT), and/or the like. It should also be appreciated that control signals described herein applied to the various transfer gates may vary in shape and/or voltage, such as depending on the electric potential of the semiconductor region and of the regions electrically coupled to the semiconductor region (e.g., neighboring regions).

In some embodiments, pixels described herein may include more than two charge storage regions. For example, pixel 2-112 described herein in connection with FIGS. 2-1 to 2-8 includes three charge storage regions.

FIG. 1-4 is a plan view of alternative pixel 1-112', according to some embodiments. In some embodiments, pixel 1-112' may be configured in the manner described for pixel 1-112. In FIG. 1-4, drain region D of pixel 1-112' is positioned on a same side of photodetection region PPD as charge storage regions SD0 and SD1 and readout region FD. Also shown in FIG. 1-4, photodetection region PPD may include a mask with a triangular opening, with a base of the triangular opening on a side of photodetection region proximate charge storage regions SD0 and SD1 and drain region D, and a corresponding apex of the triangular opening on a side of photodetection region PPD opposite drain region D and charge storage regions SD0 and SD1.

In some embodiments, photodetection region PPD may be configured to induce an intrinsic electric field in a direction from photodetection region PPD toward charge storage regions SD0 and SD1 and drain region D. For example, photodetection region PPD may be formed by doping a substrate of integrated device 1-102 through the opening, resulting in a higher dopant concentration in the region of the substrate exposed through the opening than in the region covered by the mask during doping. In this example, the larger quantity of dopants (e.g., n-type dopants) at the base end of the triangular opening may cause the electric potential at the base end of photodetection region PPD proximate drain region D and charge storage region SD0 to be lower than the electric potential at the apex end of photodetection region PPD on the opposite side of photodetection region PPD. The intrinsic electric field in photodetection region PPD may be present even in the absence of an external electric field being applied to pixel 1-112. The inventors recognized that the intrinsic electric field of photodetection region PPD increases the rate of charge transfer from photodetection region PPD to drain region D and/or storage regions SD0 and SD1, increasing the efficiency with which charge carriers are drained and/or collected during operation of pixel 1-112. In the example of FIG. 1-4, the intrinsic electric field may be directed along the dotted arrow between drain region and charge storage region SD0. For example, the intrinsic electric field may cause charge carriers to flow along the dotted arrow, and an extrinsic electric field induced by a control signal being applied to transfer gate REJ or ST0 may cause the charge carriers to flow to drain region D or charge storage region SD0, respectively.

FIG. 1-5 is a top schematic view of the pixel 1-112', according to some embodiments. In FIG. 1-5, charge storage region SD1 is shown having two sub-regions, SD1-0 and SD1-1, with readout region FD being positioned closer to sub-region SD1-1 than to sub-region SD1-0. As shown in FIG. 1-5, contacts may be disposed over portions of pixel 1-112'. In some embodiments, the contacts may be configured to block incident photons from reaching portions of pixel 1-112' other than photodetection region PPD and/or from reaching photodetection regions of neighboring pixels at oblique angles of incidence. For example, the contacts may be elongated in a direction parallel to the optical axis along which photodetection PPD is configured to receive incident photons. In some embodiments, the contacts may be formed using an opaque material such as tungsten. The inventors have recognized that contacts described herein prevent many or all incident photons from reaching charge storage regions SD0 and SD1 along optical paths other than the optical axis, thereby preventing the incident photons from generating noise charge carriers in charge storage regions SD0 and SD1.

In FIG. 1-5, a pair of contacts is disposed on opposite sides of photodetection region PPD, with a first contact of the pair disposed closer to the apex of the triangular opening of the mask and a second contact of the pair disposed closer to the base of the triangular opening of the mask. The second contact may be configured to block incident photons from reaching charge storage regions SD0 and SD1. A third contact is disposed at an end of pixel 1-112 opposite the end at which photodetection region PPD is disposed. The first and third contacts are disposed between the pixel 1-112 and respective neighboring pixels, and the second contact is positioned between photodetection region PPD and transfer gates ST0 and REJ. It should be appreciated that, in some embodiments, the pair of contacts on opposite sides of photodetection region PPD may be replaced with at least one contact wall that at least partially surrounds photodetection region PPD, such as a single cylindrical contact wall.

FIG. 1-6 is a view of pixel 1-112' along cross section A-A' as shown in FIG. 1-4, according to some embodiments. As shown in FIG. 1-6, pixel 1-212 also includes barriers disposed around charge storage regions SD0 and SD1 and readout region FD, as well as collection and protection layers. In some embodiments, the barriers, protection layer, and collection layer may be configured to block incident charge carriers from reaching charge storage regions SD0 and SD1 and readout region FD along paths other than the transfer channels controlled by transfer gates ST0, TX0, and TX1.

The inventors have recognized that noise charge carriers may flow to storage regions SD0 and SD1 from outside of storage regions SD0 and SD1. In some cases, excitation charge carriers generated in response to excitation light may flow to charge carriers SD0 and SD1 even when the transfer channels electrically coupling photodetection region PPD to charge storage regions SD0 and SD1 are unbiased and induce intrinsic electric potential barriers. For example, the charge carriers may flow through bulk substrate regions of pixel 1-112'. In some cases, fluorescent emission charge carriers received during a period in which charge carriers are transferred to charge storage region SD0 may flow to storage region SD1 along different electrical paths. In either case, because these undesired charge carriers may be virtually indistinguishable from fluorescent emission charge carriers intended to be collected and/or stored in charge storage regions SD0 and SD1 at any particular time, the noise charge carriers distort the signal when the charge carriers are read out from charge storage regions SD0 and SD1.

To address these problems, some techniques described herein may block at least some noise charge carriers from reaching charge storage regions SD0 and SD1 along the different paths. For example, some techniques described herein may block excitation charge carriers generated by excitation photons from reaching charge storage regions SD0 and SD1 along different paths than the transfer channels electrically coupling photodetection region PPD to charge storage region SD0 and charge storage region SD0 to charge storage region SD1, and/or may block fluorescent emission charge carriers intended for storage region SD0 from reaching storage region SD1 and vice versa. In some embodiments, such techniques may also be used to block noise charge carriers from reaching readout region FD and/or to block charge carriers from traveling between pixels 1-112' of integrated device 1-102.

In FIG. 1-6, the protection layer is spaced from photodetection region PPD along the optical axis. In some embodiments, the protection layer may be configured to induce an intrinsic electric potential barrier configured to block at least some photons traveling along the optical axis from leaving photodetection region PPD, causing photodetection region PPD to absorb the photons and generate charge carriers in response. In some embodiments, a doping type and/or concentration of the protection layer may induce the intrinsic electric potential barrier even when no external electric field is applied to integrated device 1-102. For example, the protection layer may have an opposite conductivity type from photodetection region PPD, charge storage regions SD0 and SD1, and/or readout region FD. In some embodiments, charge carriers blocked by the protection layer and absorbed by photodetection region PPD may be transferred to storage region SD0 or a drain region, depending on whether the charge carriers are absorbed during a rejection period or a collection period, as described further herein.

In some embodiments, the collection layer may be configured to induce an intrinsic electric potential well configured to absorb charge carriers incident on the collection layer at least partially along the optical axis. For example, photons incident along the optical axis may pass through the protection layer and reach the collection layer, which may generate charge carriers in response to receiving the photons. Alternatively or additionally, charge carriers obliquely incident on pixel 1-112' may reach the collection region, as the collection region may be elongated from photodetection region PPD to readout region FD, as shown in FIG. 1-6. The protection layer and the barriers of pixel 1-112' may block charge carriers generated in the collection layer that leave the collection layer from reaching charge storage regions SD0 and SD1 and/or readout region FD. In some embodiments, a doping type and/or concentration of the collection layer may be configured to induce the intrinsic electric potential well even when no external electric field is applied to integrated device 1-102. For example, the collection layer may have a same conductivity type as photodetection region PPD, charge storage regions SD0 and SD1, and/or readout region FD.

In FIG. 1-6, the collection layer is spaced from the protection layer along the optical axis and includes first and second regions. The first region is spaced from photodetection region PPD along the optical axis and elongated from photodetection region PPD to charge storage region SD1 in the direction in which charge storage regions SD0 and SD1 are spaced from photodetection region PPD. The second region is spaced from charge storage region SD1 in a direction parallel to the optical axis and is disposed closer to charge storage region SD1 in the direction parallel to the optical axis than is the first region.

In FIG. 1-6, the barriers of pixel 1-112' are spaced from charge storage regions SD0 and SD1 and readout region FD in a direction parallel to the optical axis, with a first barrier (BPW) elongated in the direction in which charge storage regions SD0 and SD1 are spaced from photodetection region PPD, and with a second barrier (LPW) elongated in the direction parallel to the optical axis. In some embodiments, barriers BPW and LPW may be intrinsic to pixel 1-112' such that they are configured to block charge carriers traveling in pixel 1-112' from reaching storage regions SD0 and SD1 and readout region FD even when no external electric field is applied to integrated device 1-102. In some embodiments, a doping type and/or concentration of barriers BPW and LPW may induce the intrinsic electric potential barriers. For example, barriers BPW and LPW may be doped with an opposite conductivity type from photodetection region PPD, charge storage regions SD0 and SD1, and/or readout region FD. In some embodiments, second barrier LPW may be configured to block charge carriers from reaching an adjacent pixel 1-112' of integrated device 1-102.

In some embodiments, pixel 1-112 may be configured to induce an intrinsic electric field in a direction from photodetection region PPD to readout region FD. For example, photodetection region PPD, charge storage regions SD0 and SD1, and readout region FD may be configured to induce the intrinsic electric field at least in part by having different intrinsic electric potential levels, as described further herein.

FIG. 1-7 is a graph of intrinsic electric potential versus position for a portion of pixel 1-112', according to some embodiments. In FIG. 1-7, a first intrinsic electric potential level is shown for photodetection region PPD, a second intrinsic electric potential level is shown for charge storage region SD0, third and fourth electric potential levels are shown for respective sub-regions SD1-0 and SD1-1 of charge storage region SD1, and a fifth electric potential level is shown for readout region FD. In FIG. 1-7, the first intrinsic electric potential level is lower than the second intrinsic electric potential level, the second intrinsic electric potential level is lower than the third intrinsic electric potential level, and the fourth intrinsic electric potential level is lower than the fifth intrinsic electric potential level. For example, the illustrated photodetection region PPD, charge storage regions SD0 and SD1, and readout region FD may be n-type doped and configured to store and read out electrons generated in photodetection region PPD in response to incident photons from a light source. In this example, the intrinsic electric field may force the electrons in the first direction from photodetection region PPD toward readout region FD due to the negative charge of the electron and the consecutively higher electric potential levels of the regions of pixel 1-112' from photodetection region PPD toward readout region FD. It should be appreciated that, for a pixel having p-type doped regions, the intrinsic electric potential levels of the pixel regions may consecutively decrease from photodetection region PPD toward readout region FD, such that the intrinsic electric field may force holes generated in photodetection region PPD toward readout region FD.

In some embodiments, each region of pixel 1-112' shown in FIG. 1-7 may have pinning voltages configured to induce the respective intrinsic electric potential levels. For example, photodetection region PPD may have a first pinning voltage, charge storage region SD0 may have a second pinning voltage higher than the first pinning voltage, charge storage region SD1 may have a third pinning voltage in sub-region SD1-0 and a fourth pinning voltage in sub-region SD1-1, with the third pinning voltage being higher than the second pinning voltage and the fourth pinning voltage being higher than the third pinning voltage, and readout region may have a fifth pinning voltage that is higher than the fourth pinning voltage. In a pixel having p-type doped regions, the pinning voltages of the regions may consecutively decrease from photodetection region PPD toward readout region FD.

In some embodiments, photodetection region PPD may be doped to have a first dopant concentration, charge storage region SD0 may be doped to have a second dopant concentration higher than the first dopant concentration, sub-region SD1-0 of charge storage region SD1 may be doped to have a third dopant concentration higher than the second dopant concentration, sub-region SD1-1 of charge storage region SD1 may be doped to have a fourth dopant concentration higher than the third dopant concentration, and readout region FD may be doped to have a fifth dopant concentration higher than the fourth dopant concentration.

In one example process, pixel 1-112' may be formed by doping photodetection region PPD, charge storage regions SD0 and SD1, and readout region FD to have the first dopant concentration. Next, charge storage regions SD0 and SD1 and readout region FD may be doped to have the second dopant concentration. In this example, photodetection region PPD may be covered by a mask to prevent photodetection region PPD from being doped to have the second dopant concentration. Next, charge storage region SD1 and readout region FD may be doped to have the third dopant concentration. Photodetection region PPD and charge storage region SD0 may be covered by a mask during this step. Next, readout region FD and sub-region SD1-1 of charge storage region SD1 may be doped to have the fourth dopant concentration. Photodetection region PPD, charge storage region SD0, and sub-region SD1-0 of charge storage region SD1 may be covered by a mask during this step. Next, readout region may be doped to have the fifth dopant concentration. Photodetection region PPD and charge storage regions SD0 and SD1 may be covered by a mask during this step. In some embodiments, readout region FD may be degenerately doped. For example, the fermi level of readout region FD may be in the conduction band. Photodetection region PPD, charge storage regions SD0 and SD1, sub-regions SD1-0 and SD1-1 of charge storage region SD1, and readout region FD may have consecutively increasing dopant concentrations in both n-type and p-type doped embodiments that induce the intrinsic electric potentials, pinning voltages and/or electric fields described herein.

Also shown in FIG. 1-7, a first intrinsic electric potential barrier is disposed between photodetection region PPD and charge storage region SD0, a second intrinsic electric potential barrier is disposed between charge storage region SD0 and charge storage region SD1, and a third intrinsic electric potential level is disposed between charge storage region SD1 and readout region FD. When a signal is applied to a transfer gate to transfer charge carriers between regions of pixel 1-112', transfer gate may lower a corresponding one of the intrinsic electric potential barriers of pixel 1-112'.

It should be appreciated that photodetection region PPD, charge storage regions SD0 and SD1, sub-regions SD1-0 and SD1-1, and readout region FD may be doped in any suitable manner and in any order to have the dopant concentrations described herein. For example, each region (and/or sub-region) may be doped in its own separate doping step with all other regions covered by a mask during the doping step.

It should also be appreciated that charge storage region SD0 may alternatively or additionally include two or more sub-regions as described herein for charge storage region SD1. For example, the sub-regions of charge storage region SD0 can have different intrinsic electric potential levels as described herein for sub-regions SD1-0 and SD1-1.

In some embodiments, some components of pixels described herein may be disposed and/or formed on one or more substrate layers of an integrated circuit. In some embodiments, the substrate layer(s) may alternatively or additionally include one or more auxiliary layers (e.g., epitaxial layers) disposed above and/or below the other substrate layer(s). In some embodiments, some components of pixels described herein may be formed by etching away at least a portion of the substrate and/or auxiliary layer(s).

IV. Example Dual Charge Storage Pixel Operation

FIG. 1-8 is a diagram illustrating charge transfer during time periods of operation of pixel 1-112, according to some embodiments. As shown in FIG. 1-8, operation of pixel 1-112 may include multiple charge collection and transfer steps performed in time periods 1-1, 1-2, 1-3, 1-4, and 1-5. FIG. 1-9 is a time graph 1-900 of control signals received at transfer gates TX0, TX1, RST, and RS during operation of N pixels 1-112, numbered 0 through N−1, according to some embodiments. First and second collection sequences that may include one or more control signals received at transfer gates REJ and ST0 are also represented in time graph 1-900, although the control signals are not shown. In some embodiments, the control signals received at transfer gates REJ and ST0 may be several orders of magnitude shorter in time than control signals received at other transfer gates, as described herein. While the description of FIGS. 1-8 and 1-9 only refers to operation of pixel 1-112, it should be appreciated that pixel 1-112' may be configured to operate in same manner as described herein for pixel 1-112.

In FIG. 1-8, operation of pixel 1-112 may be cyclical. For example, as described further herein, each operation cycle may be performed during time periods 1-1 to 1-4, and pixel operation during time period 1-5 may be performed during time period 1-1 of a subsequent cycle (e.g., simultaneously with steps performed during time 1-1 of the subsequent cycle). In some embodiments, pixels 0 through N−1 of FIG. 1-9 may be arranged in a grid array having rows and columns (e.g., the array of FIG. 1-3B). Alternatively or additionally, in some embodiments, pixels 0 through N−1 may be a subset of a larger array, such as a single column of the larger array (e.g., a column of the array of FIG. 1-3C). In some embodiments, each pixel 0 through N−1 may be representative of a row of pixels, with each pixel of the row receiving the control signals shown being received by the pixel in FIG. 1-9. In some embodiments, a control circuit of integrated device 1-102, and/or of a system that includes integrated device 1-102, may be configured to generate and provide the control signals shown in FIG. 1-9 to the respective transfer gates of pixel 1-112, as described herein. For example, the control circuit can be electrically coupled to integrated device 1-102 (e.g., via traces on one or more printed circuit boards), and integrated device 1-102 can include conductive paths that provide received control signals from the control circuit to appropriate transfer gates of each pixel 1-112.

In some embodiments, time period 1-1 may include one or more collection sequences. For example, during each collection sequence, charge carriers may be generated in photodetection region PPD in response to light from a light source. In some embodiments, each collection sequence may include a rejection period followed by a collection period. For example, during the rejection period, the control circuit may apply a drain signal to transfer gate REJ to transfer charge carriers generated in photodetection region PPD to drain region D. During the rejection period, the transfer channel electrically coupling photodetection region PPD to transfer gate may be substantially unbiased such that an intrinsic electric potential barrier prevents charge carriers in photodetection region PPD from reaching charge storage region SD0. In this example, the control circuit may apply the drain signal during a time when photodetection region PPD is expected to receive excitation light and before photodetection region is expected to receive fluorescence light from a sample, such that excitation charge carriers are discarded rather than being collected in charge storage region SD0.

In some embodiments, each collection period may include receiving charge carriers at charge storage region SD0 from photodetection region PPD. As shown in FIG. 1-8, charge carriers Q1 are received at charge storage region SD0 from photodetection region PPD during period 1-1. For example, the control circuit may apply a signal to transfer gate ST0 to transfer charge carriers from photodetection region PPD to charge storage region SD0. During the collection period, the transfer channel electrically coupling photodetection region PPD to drain region D may be substantially unbiased, such that an intrinsic electric potential barrier prevents charge carriers in photodetection region PPD from reaching drain region D. In this example, the control circuit may apply the signal to transfer gate ST0 during a time when photodetection region PPD is expected to receive fluorescence light from the sample, such that fluorescence charge carriers are collected in charge storage region SD0. In some embodiments, the transfer channel electrically coupling charge storage region SD0 to charge storage region SD1 may be unbiased such that an intrinsic electric potential barrier prevents charge carriers from reaching charge storage region SD1. In some embodiments, time period 1-1 may be between 5 milliseconds (ms) and 10 ms long. In some embodiments, multiple collection sequences may be performed within each time period 1-1. For example, each collection sequence may include a rejection period of between 1 nanosecond (ns) and 5 ns, such as 2 ns, followed by a collection period of between 5 and 20 ns, such as between 5 and 10 ns. In this example, charge carriers received during each collection period (e.g., in response to an excitation pulse) may be aggregated in charge storage region SD0 over the series of collection sequences.

In some embodiments, each pixel 0 through N-1 of FIG. 1-9 may perform a collection sequence substantially at the same time. For example, each pixel may discard excitation charge carriers substantially at the same time and may collect fluorescence charge carriers in charge storage region SD0 at substantially the same time. It should be appreciated that propagation delay in control signals provided to the pixels due to the positioning of each pixel relative to the control circuit may cause a very short delay to occur between rejection and/or collection in each pixel, such that each pixel does not collect and reject at the exact same time. It should also be appreciated that, while the same signal may be applied to transfer gates of different pixels, the propagation delays and/or different voltage biases of each pixel may cause the signals applied to different pixels to not be exactly the same.

In some embodiments, time period 1-2 may include one or more transfer sequences. For example, in FIG. 1-8, charge carriers Q1 are transferred from storage region SD0 to SD1 during time period 1-2. In FIG. 1-9, the control circuit applies a signal to transfer gate TX0 to transfer charge carriers from charge storage region SD0 to charge storage region SD1. In some embodiments, the transfer channel electrically coupling photodetection region PPD to charge storage region SD0 may be unbiased during time period 1-2 such that charge carriers are not received in charge storage region SD0 from photodetection region PPD. In some embodiments, each pixel 0 through N-1 of FIG. 1-9 may perform a transfer sequence substantially at the same time, such as described herein for collection sequences. In some embodiments, time period 1-2 may be between 10 ns and 20 microseconds (μs), such as between 10 ns and 100 ns, between 100 ns and 1 μs, between 1 μs and 10 μs, between 1 μs and 20 μs, or between 10 μs and 20 μs, for example.

In some embodiments, time period 1-3 may include one or more readout sequences. For example, during each readout sequence, integrated device 1-102 may read out charge carriers from charge storage regions SD0 and SD1. For example, in FIG. 1-8, charge carriers Q1 are transferred from charge storage region SD1 to readout region FD during period 1-3. In FIG. 1-9, the control circuit applies a signal to transfer gate TX1 to transfer the charge carriers in charge storage region SD1 to readout region FD during time period 1-3.

In some embodiments, during time period 1-3, the control circuit may apply the signal to transfer gate TX1 of each pixel 0 through N-1 at a different predetermined time for reading out charge carriers from that pixel. For example, in some embodiments, the control circuit may apply the signal to transfer gate TX1 of only one pixel at a time. For example, integrated device 1-102 may be configured to read out charge carriers from a row of pixels one pixel at a time. In this example, integrated device 1-102 may include readout processing circuitry (e.g., processing circuitry 1-114 of FIG. 1-3B) configured for selectively coupling to readout regions FD of a pixel when a signal is applied to transfer gate RS of the pixel. Transfer channels of each pixel electrically coupling charge storage regions SD0 to readout region FD and electrically coupling readout region FD to the bitline may be unbiased when such signals are not applied, such that intrinsic electric potential barriers prevent charges from being read out to readout region FD and/or to the bitline. In some embodiments, the control circuit may apply the signal(s) to transfer gates TX1 (and transfer gates RS) of multiple pixels substantially at the same time such that charge carriers are read out from the multiple pixels substantially at the same time. For example, the control circuit may apply the signal(s) to transfer gates TX1 and RS of a row of pixels substantially at one time and apply the signal(s) to transfer gates TX1 and RS of another row of pixels substantially at another time, such that charge carriers are read out one row of pixels at a time.

In some embodiments, such as shown in FIG. 1-9, the control circuit may apply a signal to transfer gate RST to reset the voltage of readout region FD prior to transferring charge carriers from charge storage region SD1 to readout region FD. In some embodiments, such as shown in FIG. 1-9, the control circuit may apply a signal to transfer gate TX1 and apply a signal to transfer gate RST to reset the voltage of storage region SD1 after the charge carriers have been read out from readout region FD. In some embodiments, processing circuitry electrically coupled to readout region FD (e.g., via a bitline) may sample a first voltage of readout region FD before and sampling a second voltage of readout region FD after the charge carriers are transferred from charge storage region SD1 to readout region FD and determine a number of the charge carriers using the first and second voltages. For example, the first voltage may be subtracted from the second voltage, or vice versa, to determine a charge level of the readout region having the charge carriers therein, with the charge level indicating the number of charge carriers. In some embodiments, integrated device 1-102 may reset the voltage of readout region FD after sampling the second voltage of readout region FD. In some embodiments, integrated device 1-102 may repeat the process of resetting the voltage of readout region FD, sampling the voltage, reading out charge carriers into readout region FD, and resetting the voltage again for each pixel of integrated device 1-102.

In some embodiments, time period 1-3 may also include one or more collection sequences performed in the manner described for time period 1-1. For example, In FIG. 1-8, charge carriers Q2 are received in charge storage region SD0 from photodetection region PPD during time period 1-3. In some embodiments, charge carriers may be received at charge storage region SD0 from photodetection region PPD from a beginning of time period 1-3 to an end of time period 1-3 and charge carriers may be read out from charge storage region SD1 to readout region FD during only a portion of time period 1-3. In such embodiments, time period 1-3 only includes the collection period of a collection sequence, with the rejection period of the collection sequence occurring before the start of time period 1-3. Accordingly, while charge storage region SD0 of each pixel 1-112 receives charge carriers from photodetection region PPD, integrated device 1-102 may read out charge carriers from charge storage region SD1 of a first pixel 1-112 (or group, e.g., row of pixels 1-112) of integrated device 1-102 and then from charge storage region SD1 of a second pixel (or group, e.g., row of pixels 1-112) of integrated device 1-102. In some embodiments, collection sequences performed during time period 1-3 may include collection periods that are offset in time with respect to the collection periods of time period 1-1. For example, the collection periods of time period 1-3 may be timed to capture charge carriers indicative of different characteristics (e.g., fluorescence lifetime) than the collection periods of time period 1-1.

In some embodiments, time period 1-4 may include one or more transfer sequences performed in the manner described for time period 1-2. For example, in FIG. 1-8, charge carriers Q2 are transferred from charge storage region SD0 to charge storage region SD1 during time period 1-4. In FIG. 1-9, a signal is applied to transfer gate TX0 to transfer charge carriers from charge storage region SD0 to charge storage region SD1 during time period 1-4.

In some embodiments, time period 1-5 may include one or more readout sequences and one or more collection sequences performed in the manner described for time period 1-3. For example, in FIG. 1-8, charge carriers Q2 are transferred from charge storage region SD1 to readout region FD and charge carriers Q1' are received at charge storage region SD0 from photodetection region PPD during time period 1-5. In this example, receiving charge carriers Q1' also occurs during time period 1-1 of a subsequent cycle of operation, as time period 1-5 of the illustrated operation cycle overlaps, at least in part, with time period 1-1 of the subsequent cycle (e.g., when charge carriers Q2 are read out from the particular pixel). In FIG. 1-9, time period 1-5 for the preceding operation cycle is shown occurring during time period 1-1 of the illustrated operation cycle. In some embodiments, such as shown in FIG. 1-9, time period 1-5 may be preceded by time period 1-5a, in which a signal is applied to transfer gate RST to reset the voltage at readout region FD. Time period 1-5a may also occur during time period 1-1 of the subsequent operation cycle. In FIG. 1-9, each pixel 0 through N−1 has its own time period 1-5 during which charge carriers are read out from readout region FD of the pixel and its own time period 1-5a in which the voltage of readout region FD is reset. Time periods 1-5 and 1-5a are indicated for pixel 0 in FIG. 1-9 but also occur for pixels 1 to N−1 in the manner described for pixel 0. In some embodiments, time period 1-5 and/or time period 1-5a may be between 10 ns and 100 μs, such as between 10 ns and 20 ns, between 10 ns and 15 ns, between 50 ns and 100 ns, between 100 ns and 1 μs, between 1 μs and 10 μs, between 10 μs and 100 μs, and/or between 10 μs and 50 μs.

It should be appreciated that, in some embodiments, operation of pixels described herein may include time periods between the time periods described herein and/or may omit certain time periods described herein. It should also be appreciated that, in some embodiments, operation of pixels described herein may not be cyclical, for example, by moving to a new time period (e.g., not any of time periods 1-1 through 1-5) after time period 1-5 is complete. In some embodiments, time periods described herein may occur in a different order than described herein.

It should also be appreciated that, while FIG. 1-9 shows collection sequences having a duration of 10 ms with one transfer of charge carriers from charge storage region SD0 to charge storage region SD1 per collection sequence, other collection sequence durations are possible. For example, in the example of FIG. 1-9, 100 transfers from charge storage region SD0 to charge storage region SD1 may occur per second. This transfer can occur at least 50, at least 75, and/or at least 100 times per second, or any other suitable number of times per second, as embodiments described herein are not so limited.

V. Example Tri-Charge Storage Pixel Structure

Some aspects of the present disclosure relate to integrated circuits having three or more charge storage regions (e.g., per pixel). FIG. 2-1 is a cross-sectional view of pixel 2-112, which may be included in integrated device 1-102, according to some embodiments. In some embodiments, pixel 2-112 may be configured in the manner described for pixel 1-112 in connection with FIGS. 1-1 to 1-9. For example, as shown in FIG. 2-1, pixel 2-112 includes photodetection region PPD, charge storage regions SD0 and SD1, readout region FD, and drain region D, and transfer gates, each of which may be configured in the manner described for pixel 1-112. Pixel 2-112 further includes charge storage region SD2 electrically coupled between charge storage region SD1 and readout region FD. For example, transfer channels may electrically couple charge storage region SD1 to charge storage region SD2 and charge storage region SD2 to readout region FD. In FIG. 2-1, transfer gate TX0 is configured to control a transfer of charge carriers from charge storage region SD1 to charge storage region SD2, and transfer gate TX1 is configured to control a transfer of charge carriers from charge storage region SD2 to readout region FD.

FIG. 2-2 is a circuit diagram of pixel 2-112, according to some embodiments. As shown in FIG. 2-2, the transfer channel electrically coupling charge storage region SD1 to charge storage region SD2 is a channel of a transistor having transfer gate TX0 and the transfer channel electrically coupling charge storage region SD2 to readout region FD is a channel of a transistor having transfer gate TX1. The other transistors of pixel 2-112 shown in FIG. 2-2, such as the transistor having reset gate RST and the transistor having row select transfer gate RS may be configured in the manner described for pixel 1-112 in connection with FIGS. 1-3A and 1-3B. For example, an array of pixels 2-112 may be arranged in a configuration with processing circuitry as described herein for pixel 1-112 in connection with FIGS. 1-3B and 1-3C.

Figures 1, 2, 3, 3A:
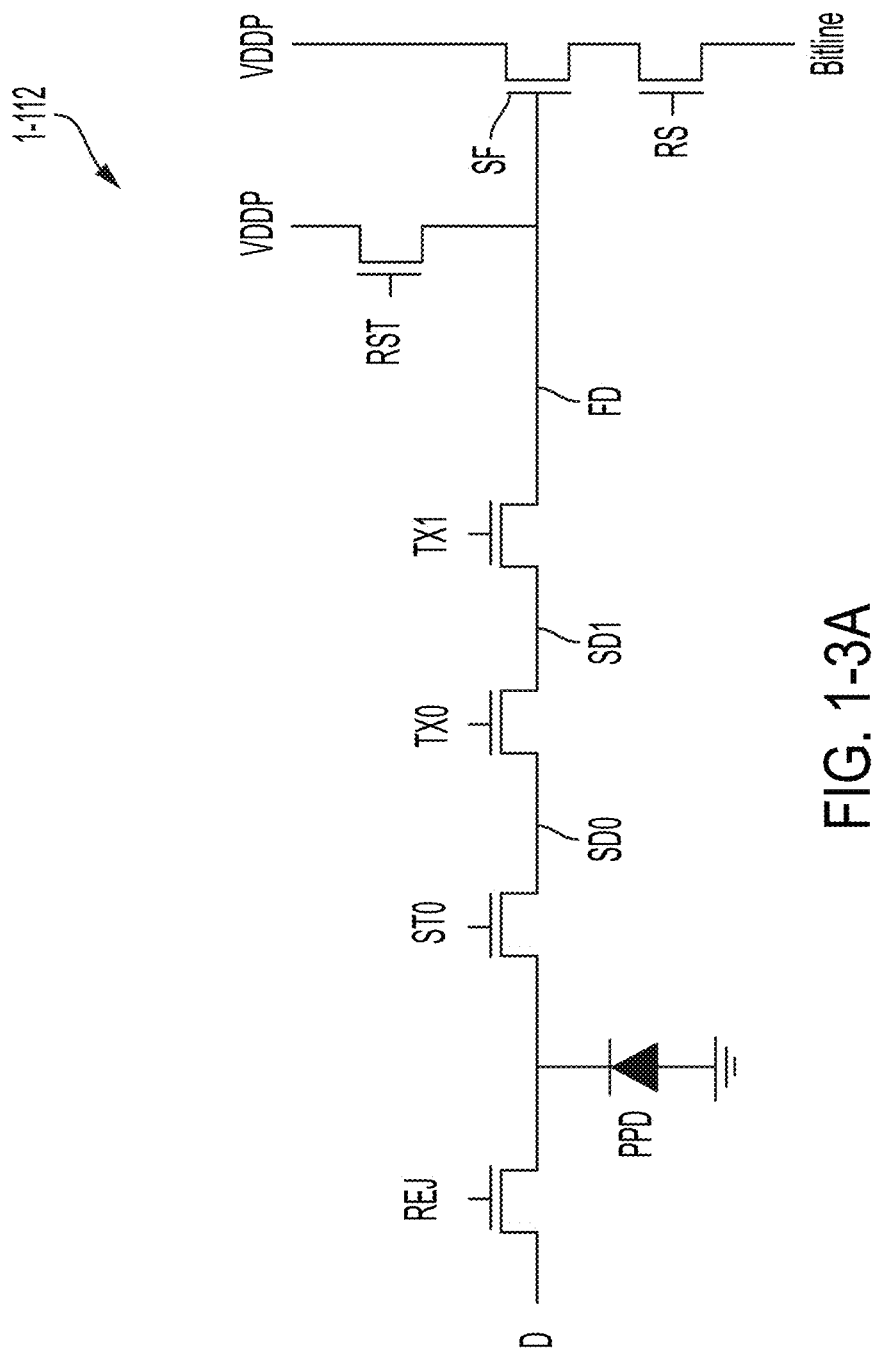

FIG. 2-3 is a top view of pixel 2-112', which may be included in integrated device 1-102, according to some embodiments. In some embodiments, pixel 2-112' may be configured in the manner described herein for pixel 1-112'. For example, photodetection region PPD of pixel 2-112' may be configured to induce an intrinsic electric field in the direction from photodetection region PPD toward charge storage region SD0 and drain region D. In FIG. 2-3, charge storage region SD2 can have two sub-regions, SD2-0 and SD2-1.

Figures 1, 2, 3, 3B:
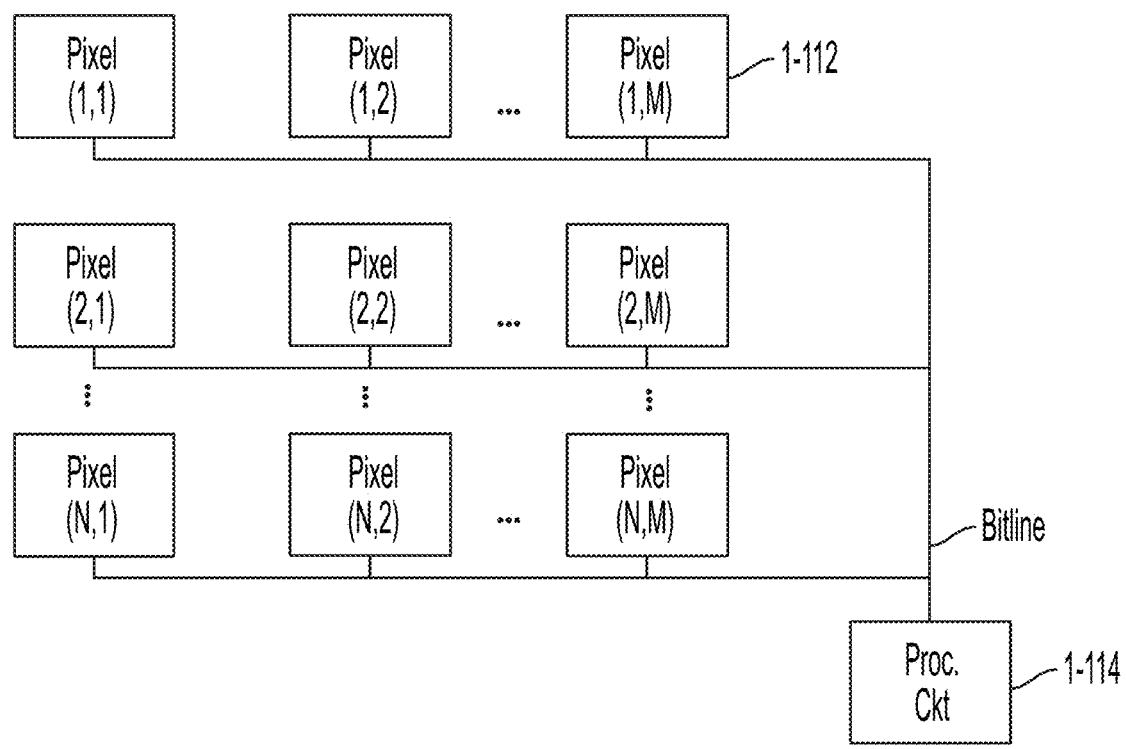
Figures 1, 2, 3, 3C:
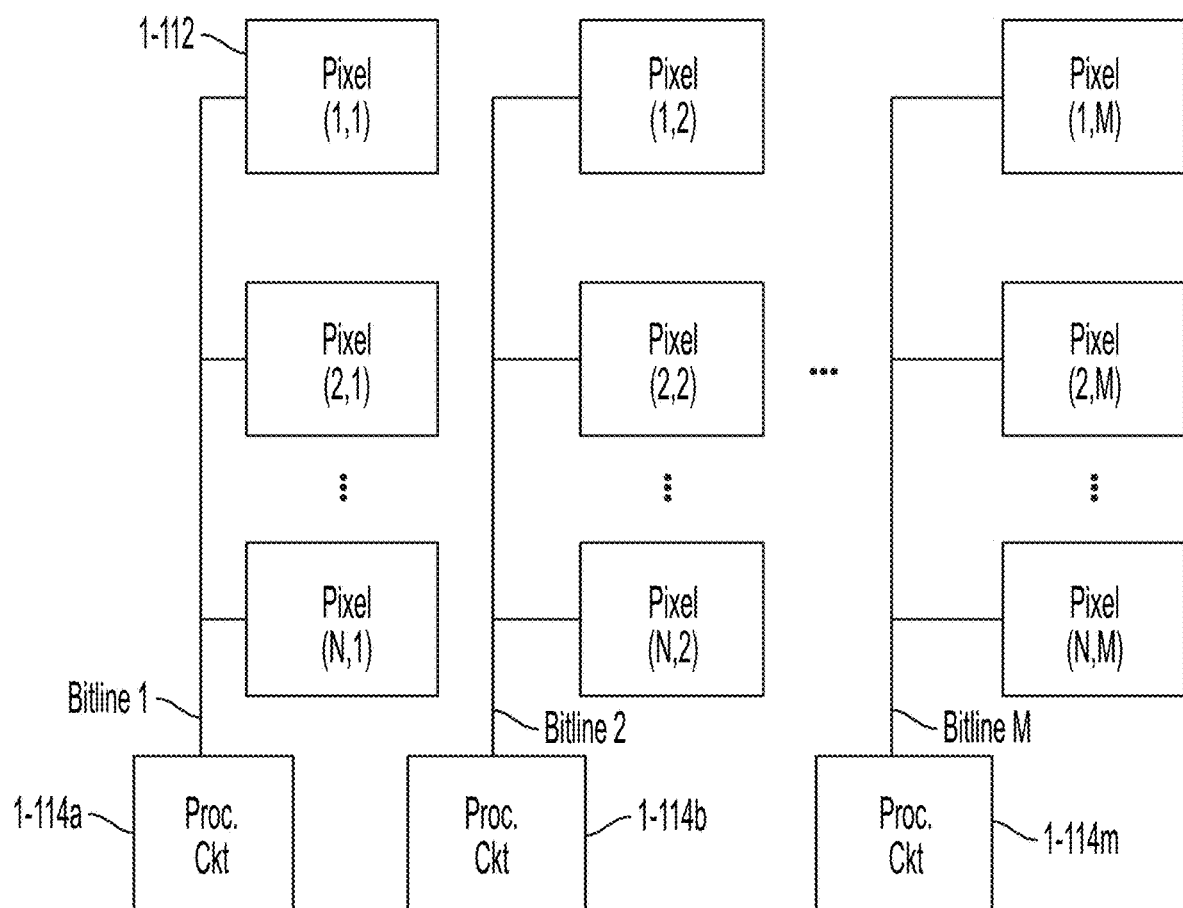
Figures 1, 2, 3, 4:
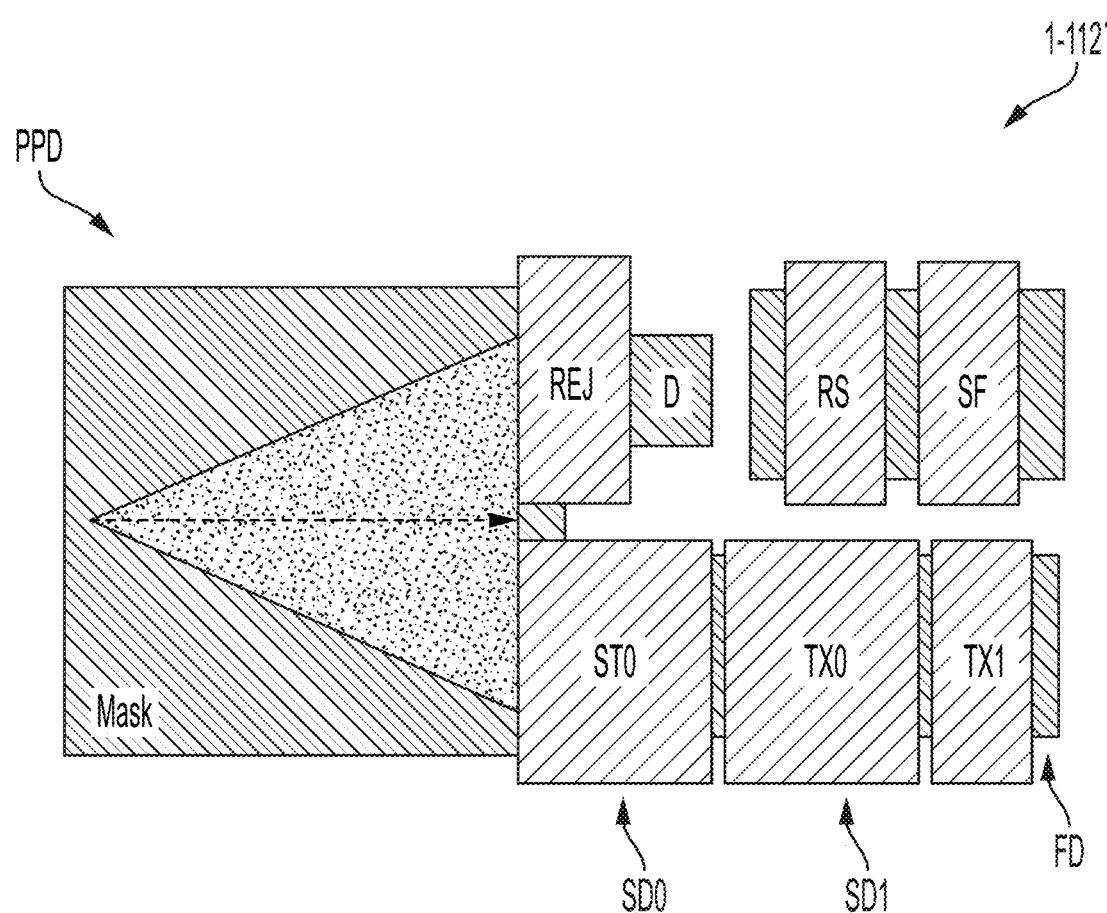

FIG. 2-4 is an alternative top view illustrating contacts and routing channels of pixel 2-112', according to some embodiments. As shown in FIG. 2-4, a first layer of routing channels $V_{ST0}$, $V_{ST1}$, and $V_{TX0}$ are coupled to transfer gates ST0, ST1, and TX0, respectively. FIG. 2-4 also shows a second layer of routing channels $V_{RS}$, $V_{TX1}$, and $V_{RST}$ coupled to transfer gates RS, TX1, and RST, respectively. The second layer of routing channels is also shown including a routing channel coupled between readout region FD and a source follower (SF) transfer gate that couples readout region FD to the transfer channel controlled by transfer gate RS (e.g., as shown schematically in FIG. 2-2). A third layer of routing channels $V_{REJ}$, VDDP, $V_D$, and Bitline are shown coupled to transfer gate REJ, the transfer channel controlled by transfer gate RST, drain region D, and the transfer channel controlled by transfer gate RS, respectively.

FIG. 2-4 also shows a pair of contacts positioned on opposite sides of photodetection region PPD and a third contact positioned at an end of pixel 2-112' opposite photodetection region PPD, which may be configured in the manner described for the contacts of pixel 1-112'.

It should be appreciated that readout region FD pixel 1-112' may be electrically coupled to the transfer gate SF on a layer of pixel 1-112' (not shown in FIG. 1-5) in the manner described herein for pixel 2-112'. In some embodiments, the routing channels shown in FIG. 2-4 may also be included in integrated device 1-102 for pixel 1-112'.

FIG. 2-5 is a view of the pixel of FIG. 2-3 along cross-section B-B' indicated in FIG. 2-3, according to some embodiments. FIG. 2-5 further illustrates the protection layer, collection layer, and barriers BPW and LPW of pixel 2-112', which may be configured in the manner described for the protection layer, collection layer, and barriers BPW and LPW of pixel 1-112'. For example, the protection layer, collection layer, and barriers BPW and LPW may be configured to prevent noise charge carriers from reaching charge storage regions SD0, SD1, and SD2 and readout region FD.

FIG. 2-6 is a graph of intrinsic electric potential versus position for a portion of pixel 2-112', according to some embodiments. As shown in FIG. 2-6, pixel 2-112' may be configured to induce an intrinsic electric field from photodetection region PPD to readout region FD in the manner described for pixel 1-112'. For example, as shown in FIG. 2-6, photodetection region PPD may be configured to have a first intrinsic electric potential level, charge storage region SD0 may be configured to have a second intrinsic electric potential level higher than the first intrinsic electric potential level, charge storage region SD1 may be configured to have a third intrinsic electric potential level higher than the second intrinsic electric potential level, sub-regions SD2-0 and SD2-1 of charge storage region SD2 may be configured to have fourth and fifth intrinsic electric potential levels higher than the third intrinsic electric potential level (e.g., as described for sub-regions SD1-0 and SD1-1 of charge storage region SD1 of pixel 1-112'), and readout region FD may be configured to have a sixth intrinsic electric potential level high than the fifth intrinsic electric potential level. It should be appreciated that, in some embodiments, the intrinsic electric potentials of photodetection region PPD, charge storage regions SD0, SD1, and SD2, and readout region FD may consecutively decrease from photodetection region PPD to readout region FD, as described herein for pixel 1-112' in connection with FIG. 1-7.

It should be appreciated that charge storage region SD0 and/or SD1 may alternatively or additionally include two or more sub-regions as described herein for charge storage region SD2. For example, the sub-regions of charge storage region SD0 and/or SD1 can have different intrinsic electric potential levels as described herein for sub-regions SD2-0 and SD2-1.

VI. Example Tri-Charge Storage Pixel Operation

FIG. 2-7 is a diagram illustrating charge transfer during time periods of operation of pixel 2-112, according to some embodiments. As shown in FIG. 2-7, operation of pixel 2-112 includes multiple charge collection and transfer steps performed in time periods 2-1, 2-2, 2-3, 2-4, 2-5, and 2-6. FIG. 2-8a is a time graph 2-800 of control signals received at transfer gates REJ, ST0, ST1, TX0, TX1, RST, and RS of N pixels 2-112, numbered 0 through N−1, according to some embodiments. FIG. 2-8b is a magnified view of a portion of time graph 2-800 shown in FIG. 2-8a. While the description of FIGS. 2-7 and 2-8a and 2-8b only refers to operation of pixel 2-112, it should be appreciated that pixel 2-112' may be configured to operate in same manner as described herein for pixel 2-112.

In FIG. 2-7, operation of pixel 2-112 may be cyclical. For example, as described further herein, each operation cycle may be performed during time periods 2-1 to 2-4, and pixel operation during time periods 2-5 and 2-6 may be performed during time period 2-1 of a subsequent cycle of operation (e.g., simultaneously with steps performed during time period 2-1 of the subsequent cycle). In some embodiments, pixels 0 through N−1 of FIGS. 2-8a and 2-8b may be configured in the manner described for pixels 0 through N−1 of FIG. 1-9. In some embodiments, a control circuit of integrated device 1-102, and/or of a system that also includes integrated device 1-102, may be configured to generate and provide the control signals shown in FIGS. 2-8a and 2-8b to the respective transfer gates of pixel 2-112, as described herein.

In some embodiments, time period 2-1 may include one or more collection sequences performed in the manner described for time period 1-1 in connection with FIGS. 1-8 and 1-9. For example, as shown in FIG. 2-7, charge carriers Q1 are received at charge storage region SD0 from photodetection region PPD during time period 2-1. In some embodiments, following a rejection period during which the control circuit may apply a signal to transfer gate REJ to transfer excitation charge carriers generated in photodetection region PPD to drain region D, the control circuit may apply a signal to transfer gate ST0 to transfer fluorescence charge carriers generated in photodetection region PPD to charge storage region SD0 during a collection period. In some embodiments, the rejection and/or collection periods of each pixel 0 through N−1 of FIGS. 2-8a and 2-8b may be performed substantially at the same time.

In some embodiments, time period 2-2 may include one or more transfer sequences performed in the manner described for time period 1-2 in connection with FIGS. 1-8 and 1-9. For example, as shown in FIG. 2-7, charge carriers Q1 are transferred from charge storage region SD0 to charge storage region SD2 via charge storage region SD1 during time period 2-2. In some embodiments, the control circuit may apply a signal to transfer gate ST1 to transfer charge carriers from charge storage region SD0 to charge storage region SD1 during time period 2-2. As shown in FIG. 2-8a, the control circuit may apply a signal to transfer gate TX0 to transfer the charge carriers from charge storage region SD1 to charge storage region SD2 during time period 2-2. In some embodiments, charge carriers may be transferred from charge storage region SD0 to charge storage region SD2 via charge storage region SD1 in each pixel 0 through N−1 substantially at the same time.

In some embodiments, time period 2-3 may include one or more collection sequences performed in the manner described for time period 2-1. For example, as shown in FIG. 2-7, charge carriers Q2 are received in charge storage region SD0 from photodetection region PPD and charge carriers Q1 remain stored in charge storage region SD2 during time period 2-3. As shown in FIG. 2-8a, no signals are applied to transfer gates ST1, TX0, or TX1 during time period 2-3.

In some embodiments, time period 2-4 may include one or more transfer sequences performed in the manner described for time period 1-2 in connection with FIGS. 1-8 and 1-9. For example, as shown in FIG. 2-7, charge carriers Q2 are transferred from charge storage region SD0 to charge storage region SD1 and charge carriers Q1 remain stored in charge storage region SD2 during time period 2-4. In FIG. 2-8a, time period 2-4 for the preceding cycle of operation is shown occurring prior to time period 2-1 of the illustrated operation cycle. During time period 2-4 as shown in FIG. 2-8a, the control circuit may apply a signal to transfer gate ST1 to transfer charge carriers from charge storage region SD0 to charge storage region SD1. In some embodiments, time period 2-4 may occur substantially at the same time for each pixel 0 through N−1.

In some embodiments, time period 2-5 may include collection sequences and one or more readout sequences performed in the manner described for time period 1-5 in connection with FIGS. 1-8 and 1-9. For example, as shown in FIG. 2-7, charge carriers Q1' are received in charge storage region SD0 from photodetection region PPD. In this example, receiving charge carriers Q1' also occurs during time period 2-1 of a subsequent cycle of operation, as time period 2-5 of the illustrated operation cycle overlaps, at least in part, with time period 2-1 of the subsequent cycle (e.g., when charge carriers Q1 are read out from the particular pixel). In FIG. 2-8a, time period 2-5 for the preceding operation cycle is shown during time period 2-1 of the illustrated operation cycle. In some embodiments, such as shown in FIGS. 2-8a and 2-8b, time period 2-5 may be preceded by time period 2-5a, in which a signal is applied to transfer gate RST to reset the voltage at readout region FD. For example, processing circuitry electrically coupled to readout region FD may sample a first voltage of readout region FD after the voltage is reset and a second voltage of readout region FD after charge carriers Q1 are transferred into readout region FD, as described here including in connection with FIGS. 1-8 and 1-9. Time period 2-5a may also occur during time period 2-1 of the subsequent operation cycle. In FIGS. 2-8a, each pixel 0 through N−1 has its own time period 2-5 during which charge carriers are read out from readout region FD of the pixel and its own time period 2-5a in which the voltage of readout region FD is reset. Time periods 2-5 and 2-5a are indicated for pixel 0 in FIGS. 2-8a and 2-8b but also occur for pixels 1 to N−1 in the manner described for pixel 0.

In some embodiments, time period 2-6 may include one or more collection sequences and one or more readout sequences performed in the manner described for time period 2-5. For example, In FIG. 2-7, charge carriers Q1' are received in charge storage region SD0 from photodetection region PPD and charge carriers Q2 are transferred from charge storage region SD1 to charge storage region SD2 and from charge storage region SD2 to readout region FD during time period 2-6. In some embodiments, the voltage of readout region FD may not be reset between reading out charge carriers Q1 and Q2 into readout region FD. For example, processing circuitry electrically coupled to readout region FD may sample a first voltage of readout region FD after the voltage of readout region FD is reset and before charge carriers Q1 are transferred into readout region FD, a second voltage of readout region FD after charge carriers Q1 are transferred into readout region FD, and a third voltage of readout region FD after charge carriers Q2 are transferred into readout region FD. In this example, the second voltage may indicate the number of charge carriers Q1 (e.g., as compared to the first voltage level), and the third voltage level may indicate the number of charge carriers Q2 (e.g., as compared to the second voltage level). In some embodiments, integrated device 1-102 may repeat this process to read out readout region FD of each pixel 2-112 of integrated device 1-102.

In FIG. 2-7, time period 2-6 occurs during (at least a part of) time period 2-1 of the subsequent operation cycle, as described for time period 2-5. In some embodiments, time periods 2-5 and 2-6 may occur during the course of a single collection sequence of time period 2-1 of the subsequent cycle. As shown in FIGS. 2-8a and 2-8b, the control circuit may apply signals to transfer gates TX1 and TX0 to transfer charge carriers from charge storage region SD1 to readout region FD via charge storage region SD2. In some embodiments, such as shown in FIGS. 2-8a and 2-8b, time period 2-6 may be followed by time period 2-7, during which the control circuit may apply signals to transfer gates RST, TX1, and TX0 to reset the voltage of charge storage regions SD1 and SD2 after the charge carriers have been read out from readout region FD.

In FIGS. 2-8a and 2-3b, time periods 2-5a, 2-5, 2-6, and 2-7 are indicated for pixel 0, but also occur for pixels 1 to N−1 in the manner described for pixel 0. For example, each pixel 0 through N−1 may have its own time period 2-5 and time period 2-6, during each of which charge carriers may be read out from readout region FD of the pixel, and time periods 2-5a and 2-7, during which the voltage of readout region FD and/or charge storage regions SD1 and SD2 may be reset.

In the example of FIGS. 2-8a and 2-8b, such as described herein for FIG. 1-9, the transfer of charge carriers from charge storage region SD0 to charge storage region SD1 or charge storage region SD2, as appropriate, can occur at least 50, at least 75, and/or at least 100 times per second, or any other suitable number of times per second, as embodiments described herein are not so limited.

FIG. 2-9 is a diagram illustrating charge transfer during time periods of an alternative operation scheme of pixel 2-112 (and/or pixel 2-112'), according to some embodiments. As shown in FIG. 2-9, operation of pixel 2-112 includes multiple charge collection and transfer steps performed in time periods 2-1', 2-2', 2-3', 2-4', 2-5', and 2-6'.

In some embodiments, operation during time periods 2-1' and 2-2' may be performed as described for time periods 2-1 and 2-2 in connection with FIG. 2-7, except that charge carriers Q1 are shown in FIG. 2-9 only being transferred from charge storage region SD0 to charge storage region SD1 during time period 2-2'. It should be appreciated that, in some embodiments, charge carriers Q1 may be transferred from charge storage region SD0 to charge storage region SD2 via charge storage region SD1 during time period 2-2'. In some embodiments, charge carriers Q1 may be transferred from charge storage region SD0 to charge storage region SD1 in each pixel 2-112, or in a subset of pixels 2-112, substantially at the same time.

In some embodiments, time period 2-3' may be performed in the manner described for time period 2-3 in connection with FIG. 2-7, with charge carriers Q2 being received in charge storage region SD0 from photodetection region PPD. In FIG. 2-9, charge carriers Q1 are transferred from charge storage region SD1 to charge storage region SD2 during time period 2-3'. In some embodiments, charge carriers Q1 may be transferred from charge storage region SD1 to charge storage region SD2 in each pixel 2-112, or in a subset of pixels 2-112, substantially at the same time.

In some embodiments, time period 2-4' may include one or more transfer and one or more readout sequences. For example, in FIG. 2-9, charge carriers Q2 are transferred from charge storage region SD0 to charge storage region SD1 and charge carriers Q1 are transferred from charge storage region SD2 to readout region FD. In some embodiments, charge carriers Q2 may be transferred from charge storage region SD0 to charge storage region SD1 in each pixel 2-112, or in a subset of pixels 2-112, substantially at the same time. In some embodiments, each pixel 2-112, or each subset of pixels 2-112, may have its own portion of time period 2-4' during which charge carriers are read out from readout region FD of the pixel. In some embodiments, before charge carriers Q1 are transferred to readout region FD, a voltage of readout region FD may be reset.

In some embodiments, time periods 2-5' and 2-6' may be performed in the manner described for time periods 2-3' and 2-4', respectively. For example, in FIG. 2-9, charge carriers Q1' are received in charge storage region SD0 from photodetection region PPD and charge carriers Q2 are transferred from charge storage region SD1 to charge storage region SD2 during time period 2-5', and charge carriers Q1' are transferred from charge storage region SD0 to charge storage region SD1 and charge carriers Q2 are transferred from charge storage region SD2 to readout region FD during time period 2-6'. In FIG. 2-9, time periods 2-5' and/or 2-6' may occur during time period 2-1' of a subsequent cycle of operation, such as described herein for time periods 2-5 and 2-6. For example, charge carriers Q2 may be transferred from charge storage region SD1 to charge storage region SD2 and/or read out from charge storage region SD2 to readout region FD during at least a portion of the time during which charge carriers Q1' are received at charge storage region SD0 from photodetection region PPD.

VII. Additional Example Structures with Sequentially-Coupled Storage

In the foregoing examples, integrated device 1-102 is shown in a configuration that receives incident photons in a direction in which photodetection region PPD, charge storage regions SD0 and SD1, and readout region FD are spaced from transfer gates REJ, ST0, TX0, and TX1. In some embodiments, integrated device 1-102 can have a front-side illuminated (FSI) configuration.

Some aspects of the present disclosure relate to structures configured to receive incident photons in other directions and including multiple sequentially-coupled charge storage regions, as described herein for integrated device 1-102. For instance, the inventors recognized that an integrated device configured to receive incident photons in a direction in which the transfer gates are spaced from the photodetection region, charge storage regions, and/or readout region may have improved optical and electrical characteristics because the optical characteristics of the transfer gates have a reduced impact on the incident photons.

FIG. 3-1 is a cross-sectional schematic of an alternative example integrated device 3-102 illustrating a row of pixels 3-112, according to some embodiments.

In some embodiments, integrated device 3-102 can be configured in the manner described herein for integrated device 1-102. For example, as shown in FIG. 3-1, integrated device 3-102 can include a coupling region 3-201 including one or more grating couplers 3-216, a routing region 3-202 including one or more waveguides 3-220, and a pixel region 3-203 including one or more pixels 3-112. An exemplary pixel 3-112 is indicated by a dotted box in FIG. 3-1 including a sample well 3-108 and a photodetector 3-110. Also shown in FIG. 3-1, integrated device 3-102 can include one or more photonic structures 3-230 positioned between sample wells 3-108 and photodetectors 3-110.

As shown in FIG. 3-1, integrated device 3-102 is shown configured to receive incident photons at a first side, and metal layers 3-240 are positioned on a second side of integrated device 3-102 that is opposite the first side in the direction in which integrated device 3-102 is configured to receive incident photons. In some embodiments, integrated device 3-102 can have a backside-illuminated (BSI) configuration.

FIG. 3-2 is a cross-sectional view of an example pixel 3-112 of integrated device 3-102, according to some embodiments. In some embodiments, pixel 3-112 may be configured in the manner described herein for pixel 1-112, pixel 112', pixel 2-112, pixel 2-112', and/or any other pixel described herein. For example, as shown in FIG. 3-2, pixel 3-112 can include photodetection region PPD, two charge storage regions SD0 and SD1, readout region FD, drain region D, and transfer gates ST0, TX0, TX1, and REJ. It should be appreciated that pixel 3-112 can include any number of charge storage regions as described herein for pixels 1-112, 1-112', 2-112, and 2-112'.

As shown in FIG. 3-2, transfer gates ST0, TX0, TX1, and REJ can be spaced from photodetection region PPD, charge storage regions SD0 and SD1, readout region FD, and drain region D in the direction Dir1 in which photodetection region PPD is configured to receive incident photons. Also shown in FIG. 3-2, metal layers 3-240 can be spaced from photodetection region PPD, charge storage regions SD0 and SD1, readout region FD, and drain region D, as well as transfer gates ST0, TX0, TX1, and REJ in the direction Dir1.

In FIG. 3-2, charge storage region SD0 is spaced from photodetection region PPD in a second direction perpendicular to the direction Dir1, charge storage region SD1 is spaced from charge storage region SD0 in the second direction. Also shown in FIG. 3-2, transfer gate ST0 is spaced from photodetection region PPD in the second direction and transfer gate TX0 is spaced from transfer gate ST0 in the second direction. In some embodiments, readout region FD can be spaced from charge storage region SD1 in the second direction and/or transfer gate TX1 can be spaced from transfer gate TX0 in the second direction (e.g., FIGS. 3-3B, 3-4). Alternatively or additionally, in some embodiments, readout region FD can be spaced from charge storage region SD1 in a third direction different from the second direction and/or transfer gate TX1 can be spaced from transfer gate TX0 in the third direction (FIGS. 3-5A, 3-6).

In some embodiments, pixel 3-112 can include one or more charged and/or biased (C/B) regions positioned alongside photodetection region PPD. For example, the C/B regions can include one or more charge layers (e.g., metal-oxide compounds such as aluminum-oxide) within an oxide layer (e.g., silicon dioxide) that intrinsically deplete photodetection region PPD of charge carriers. Alternatively or additionally, the C/B regions can include a conductive material (e.g., metal) configured for coupling to a bias voltage (e.g., supplied by a power supply) to deplete photodetection region PPD of charge carriers when the bias voltage is applied to the C/B regions. The inventors have recognized that C/B regions can increase the rate at which charge carriers generated in photodetection region PPD flow to drain region D and/or charge storage regions SD0 and SD1. In some embodiments, C/B regions can be positioned on each side of photodetection region PPD except the side at which photodetection region PPD is configured to receive incident photons.

FIG. 3-3A is a cross-sectional view of an alternative example pixel 3-312 that may be included in integrated device 3-102, according to some embodiments. FIG. 3-3B is a top view of a portion of pixel 3-312, according to some embodiments.

In some embodiments, pixel 3-312 may be configured in the manner described herein for pixel 1-112' and/or any other pixel described herein. For example, as shown in FIGS. 3-3A and 3-3B, pixel 3-312 can include barriers BPW and LPW positioned to block charge carriers from reaching charge storage regions SD0 and SD1 and readout region FD.

As shown in FIGS. 3-3A and 3-3B, charge storage region SD1 can have first and second sub-regions SD1-0 and SD1-1, which may be configured in the manner described herein for first and second sub-regions SD1-0 and SD1-1 of pixel 1-112' and/or first and second sub-regions SD2-0 and SD2-1 of pixel 2-112'. Also shown in FIGS. 3-3A and 3-3B, charge storage region SD0 can have first and second sub-regions SD0-0 and SD0-1, which can have different intrinsic electric potential levels as described for first and second sub-regions SD1-0 and SD1-1 and SD2-0 and SD2-1. For example, first and second sub-regions SD0-0 and SD0-1 can have different pinning voltages, such as due to second sub-region SD0-1 having a higher doping concentration than first sub-region SD0-0.

As shown in FIG. 3-3A, photodetection region PPD can include first and second sub-regions PPD-0 and PPD-1 separated in the direction Dir1 in which photodetection region PPD is configured to receive incident photons. In some embodiments, the C/B regions of pixel 3-312 can be configured to deplete first sub-region PPD-0 of charge carriers. In some embodiments, charge carriers in second sub-region PPD-1 can be depleted when transfer gate REJ is biased to cause the charge carriers to flow to drain region D and/or when transfer gate ST0 is biased to cause the charge carriers to flow to charge storage region SD0. In some embodiments, first sub-region PPD-0 can have a higher dopant concentration than second sub-region PPD-1 to further increase the rate at which charge carriers flow in the direction Dir1.

Also shown in FIGS. 3-3A and 3-3B, pixel 3-312 can include barriers DPI disposed around the C/B regions and/or between the C/B regions and photodetection region PPD. For example, barriers DPI can be configured to block charge carriers from flowing between adjacent pixels 3-312 and/or to provide charge isolation around the C/B regions. Also shown in FIG. 3-3A, a metal shield can be disposed over at least a portion of pixel 3-312 to block at least some photons from reaching charge storage regions SD0 and SD1 and readout region FD of pixel 3-312. Also shown in FIG. 3-3A, the metal shield can include an opening for incident photons to reach photodetection region PPD. As shown in FIG. 3-3A, the metal shield can be offset from a surface of pixel 3-312 (e.g., of photodetection region PPD) in the direction Dir1 by a gap, such as 100 nanometers (nm) or less.

In some embodiments, pixel 3-312 can include one or more barriers positioned between drain region D and the readout circuitry of pixel 3-312. For example, as shown in FIG. 3-3B, an isolation barrier ISO can be positioned between drain region D and transfer gates RST, SF, and RS. For example, the isolation barrier ISO can be formed by implanting one or more boron implants between the doped portions of pixel 3-312 shown under transfer gates RST, SF, and RS in FIG. 3-3B. The inventors have recognized that isolation barrier(s) ISO can prevent charge carriers from traveling between drain region D and the readout circuitry, which can impact the accuracy with which charge carriers are read out from pixel 3-312. In some cases, using implanted isolation barrier(s) ISO rather than (or in addition to) oxide barriers can reduce dark current and noise charge carriers reaching charge storage regions.

FIG. 3-4 is a top view of an example pixel 3-412 having an alternative readout configuration that may be included in integrated device 3-102, according to some embodiments. In some embodiments, pixel 3-412 can be configured in the manner described herein for pixel 3-312 and/or any other pixel described herein. In some embodiments, the readout circuitry of pixel 3-412 can be angularly offset. For example, as shown in FIG. 3-4, the readout circuitry can be angularly offset (e.g., by 45 degrees) following readout region FD. The inventors have recognized that angularly offset readout circuitry can reduce the width dimensions (e.g., in the direction from charge storage region SD0 to drain region D) of pixel 3-412, allowing pixel 3-412 to be made smaller. Also shown in FIG. 3-4, one or more isolation barriers ISO can be positioned between drain region D and the angularly offset readout circuitry as described herein for pixel 3-312.

FIG. 3-5A is a top view of an example pixel 3-512 having a further alternative readout configuration that may be included in integrated device 3-102, according to some embodiments. FIG. 3-5B is a view of pixel 3-512 along cross-section C-C' in FIG. 3-5A, according to some embodiments. In some embodiments, pixel 3-512 can be configured in the manner described herein for pixels 3-312, 3-412, and/or any other pixel described herein. As shown in FIG. 3-5A, the readout circuitry of pixel 3-512 can be positioned in the manner described herein for pixel 1-112', for example.

As shown in FIGS. 3-5A and 3-5B, one or more isolation barriers ISO can be positioned between drain region D and transfer gates SF and RS, and/or between transfer gates SF and RS and transfer gates TX1 and RST. As shown in FIG. 3-5B, the isolation barrier ISO between drain region D and transfer gate SF can extend deeper (e.g., away from the surface on which transfer gate SF is disposed) into pixel 3-512 than drain region D and/or the doped region below transfer gate SF.

Also shown in FIG. 3-5A, drain region D, the doped portions of the readout circuitry of pixel 3-512 (e.g., readout region FD), and isolation barrier(s) ISO can be positioned to provide gaps G between isolation barrier(s) ISO and drain region D and/or the doped portions of the readout circuitry. The inventors recognized that gaps G between the isolation barrier(s) and doped portions of pixel 3-512 can further reduce the electric field between the doped portions and adjacent doped portions of pixel 3-512 (e.g., between drain region D and the doped portion under transfer gate SF), which further prevents charge carriers from traversing the isolation barrier(s). In some embodiments, gaps G can be sized to cause the electric field in the pixel to be below 500,000 V/cm during operation (e.g., when bias voltages are applied to the pixel). Although not labeled in FIGS. 3-3A to 3-4, it should be appreciated that the readout circuitry, drain region D, and isolation barrier(s) ISO of the pixels can be positioned to create gaps as described herein for pixel 3-512.

It should further be appreciated that pixels described herein in connection with FIGS. 3-2 to 3-5 may not include some or all of the isolation barriers shown in the foregoing examples.

FIG. 3-6 is a top view of a further alternative pixel 3-612 that may be included in integrated device 3-102, according to some embodiments. In some embodiments, pixel 3-612 can be configured in the manner described herein for pixel 3-312, 3-412, 3-512, and/or any other pixel described herein. As shown in FIG. 3-6, the readout circuitry of pixel 3-612 can be positioned in the manner described herein for pixel 3-512. Also shown in FIG. 3-6, drain region D and the readout circuitry of pixel 3-612 can be positioned without isolation barriers ISO between them. A portion of barrier BPW is shown in FIG. 3-6 positioned below transfer gate TX1 and readout region FD. FIG. 3-6 also shows the C/B regions of pixel 3-612, which may also be included in pixels 3-412 and/or 3-512 although not shown. In FIG. 3-6, the C/B regions running parallel to the direction from photodetection region PPD to charge storage region SD0 and/or from photodetection region PPD to drain region D are shown continuous along the perimeter of pixel 3-712. Also shown in FIG. 3-7, the C/B regions running parallel to the direction from charge storage region SD0 to drain region D are shown discontinuous along the perimeter of pixel 3-712, with gaps separating portions of the C/B regions.

FIG. 3-7 is a top view of an example pixel 3-712 having an alternative configuration of C/B regions that may be included in the integrated device of FIG. 3-1, according to some embodiments. In some embodiments, pixel 3-712 may be configured in the manner described herein for pixels 3-312, 3-412, 3-512, 3-612, and/or any other pixel described herein. In FIG. 3-7, the C/B regions running parallel to the direction from charge storage region SD0 to drain region D are shown continuous along the perimeter of pixel 3-712. Also shown in FIG. 3-7, the C/B regions running parallel to the direction from photodetection region PPD to charge storage region SD0 and/or from photodetection region PPD to drain region D are shown discontinuous along the perimeter of pixel 3-712, with gaps separating portions of the C/B regions.

FIG. 3-8 is a top view of an example pixel having an alternative charge storage region doping configuration that may be included in the integrated device of FIG. 3-1, according to some embodiments. In some embodiments, pixel 3-812 can be configured in the manner described herein for pixels 3-312, 3-412, 3-512, 3-612, and/or any other pixel described herein. As shown in FIG. 3-8, charge storage region SD1 can include sub-regions SD1-0, SD1-1, and SD1-2. For example, sub-region SD1-2 can have a different intrinsic electric potential level than sub-region SD1-1. For example, sub-regions SD1-1 and SD1-2 can have different pinning voltages, such as due to sub-region SD1-2 having a higher dopant concentration than sub-region SD1-1.

While the example pixel configurations described herein in connection with FIGS. 3-2 to 3-8 have two sequentially-coupled charge storage regions, it should be appreciated that such pixels can have three or more charge storage regions, as embodiments described herein are not so limited.

VIII. DNA and/or RNA Sequencing Applications

An analytic system described herein may include an integrated device and an instrument configured to interface with the integrated device. The integrated device may include an array of pixels, where a pixel includes a reaction chamber and at least one photodetector. A surface of the integrated device may have a plurality of reaction chambers, where a reaction chamber is configured to receive a sample from a suspension placed on the surface of the integrated device. A suspension may contain multiple samples of a same type, and in some embodiments, different types of samples. In this regard, the phrase "sample of interest" as used herein can refer to a plurality of samples of a same type that are dispersed in a suspension, for example. Similarly, the phrase "molecule of interest" as used herein can refer to a plurality of molecules of a same type that are dispersed in a suspension. The plurality of reaction chambers may have a suitable size and shape such that at least a portion of the reaction chambers receive one sample from a suspension. In some embodiments, the number of samples within a reaction chamber may be distributed among the reaction chambers such that some reaction chambers contain one sample with others contain zero, two or more samples.

In some embodiments, a suspension may contain multiple single-stranded DNA templates, and individual reaction chambers on a surface of an integrated device may be sized and shaped to receive a sequencing template. Sequencing templates may be distributed among the reaction chambers of the integrated device such that at least a portion of the reaction chambers of the integrated device contain a sequencing template. The suspension may also contain labeled nucleotides which then enter in the reaction chamber and may allow for identification of a nucleotide as it is incorporated into a strand of DNA complementary to the single-stranded DNA template in the reaction chamber. In some embodiments, the suspension may contain sequencing templates and labeled nucleotides may be subsequently introduced to a reaction chamber as nucleotides are incorporated into a complementary strand within the reaction chamber. In this manner, timing of incorporation of nucleotides may be controlled by when labeled nucleotides are introduced to the reaction chambers of an integrated device.

Excitation light is provided from an excitation source located separate from the pixel array of the integrated device. The excitation light is directed at least in part by elements of the integrated device towards one or more pixels to illuminate an illumination region within the reaction chamber. A marker may then emit emission light when located within the illumination region and in response to being illuminated by excitation light. In some embodiments, one or more excitation sources are part of the instrument of the system where components of the instrument and the integrated device are configured to direct the excitation light towards one or more pixels.

Emission light emitted from a reaction chamber (e.g., by a fluorescent label) may then be detected by one or more photodetectors within a pixel of the integrated device. Characteristics of the detected emission light may provide an indication for identifying the marker associated with the emission light. Such characteristics may include any suitable type of characteristic, including an arrival time of photons detected by a photodetector, an amount of photons accumulated over time by a photodetector, and/or a distribution of photons across two or more photodetectors. In some embodiments, a photodetector may have a configuration that allows for the detection of one or more timing characteristics associated with emission light (e.g., fluorescence lifetime). The photodetector may detect a distribution of photon arrival times after a pulse of excitation light propagates through the integrated device, and the distribution of arrival times may provide an indication of a timing characteristic of the emission light (e.g., a proxy for fluorescence lifetime). In some embodiments, the one or more photodetectors provide an indication of the probability of emission light emitted by the marker (e.g., fluorescence intensity). In some embodiments, a plurality of photodetectors may be sized and arranged to capture a spatial distribution of the emission light. Output signals from the one or more photodetectors may then be used to distinguish a marker from among a plurality of markers, where the plurality of markers may be used to identify a sample or its structure. In some embodiments, a sample may be excited by multiple excitation energies, and emission light and/or timing characteristics of the emission light from the reaction chamber in response to the multiple excitation energies may distinguish a marker from a plurality of markers.

Figures 1A, 4:
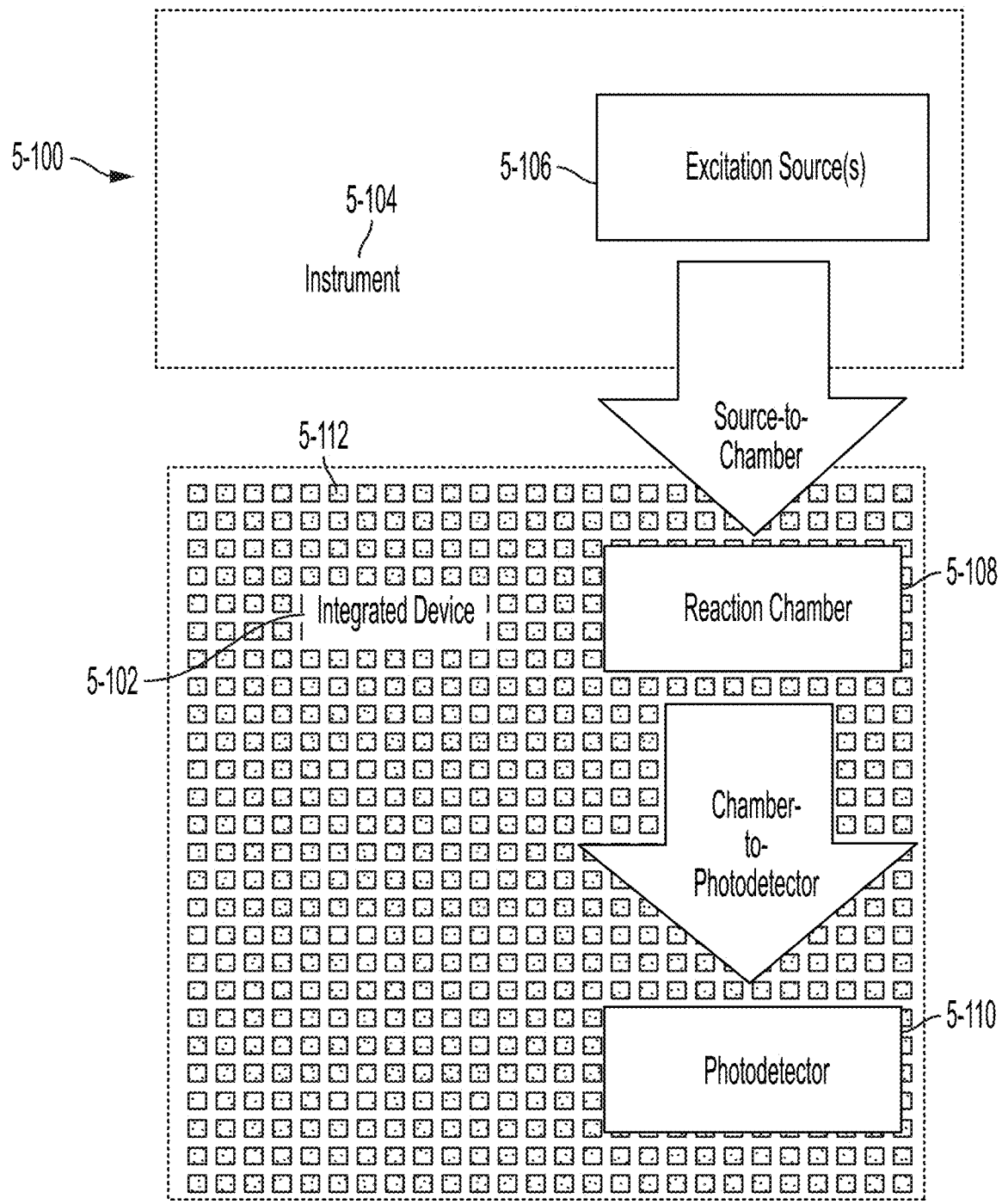

A schematic overview of the system 5-100 is illustrated in FIG. 4-1A. The system comprises both an integrated device 5-102 that interfaces with an instrument 5-104. In some embodiments, instrument 5-104 may include one or more excitation sources 5-106 integrated as part of instrument 5-104. In some embodiments, an excitation source may be external to both instrument 5-104 and integrated device 5-102, and instrument 5-104 may be configured to receive excitation light from the excitation source and direct excitation light to the integrated device. The integrated device may interface with the instrument using any suitable socket for receiving the integrated device and holding it in precise optical alignment with the excitation source. The excitation source 5-106 may be configured to provide excitation light to the integrated device 5-102. As illustrated schematically in FIG. 4-1A, the integrated device 5-102 has a plurality of pixels 5-112, where at least a portion of pixels may perform independent analysis of a sample of interest. Such pixels 5-112 may be referred to as "passive source pixels" since a pixel receives excitation light from a source 5-106 separate from the pixel, where excitation light from the source excites some or all of the pixels 5-112. Excitation source 5-106 may be any suitable light source. Examples of suitable excitation sources are described in U.S. patent application Ser. No. 14/821,688, filed Aug. 7, 2015, titled "INTEGRATED DEVICE FOR PROBING, DETECTING AND ANALYZING MOLECULES," which is incorporated by reference in its entirety. In some embodiments, excitation source 5-106 includes multiple excitation sources that are combined to deliver excitation light to integrated device 5-102. The multiple excitation sources may be configured to produce multiple excitation energies or wavelengths.

A pixel 5-112 has a reaction chamber 5-108 configured to receive a single sample of interest and a photodetector 5-110 for detecting emission light emitted from the reaction chamber in response to illuminating the sample and at least a portion of the reaction chamber 5-108 with excitation light provided by the excitation source 5-106. In some embodiments, reaction chamber 5-108 may retain the sample in proximity to a surface of integrated device 5-102, which may ease delivery of excitation light to the sample and detection of emission light from the sample or a reaction component (e.g., a labeled nucleotide).

Optical elements for coupling excitation light from excitation light source 5-106 to integrated device 5-102 and guiding excitation light to the reaction chamber 5-108 are located both on integrated device 5-102 and the instrument 5-104. Source-to-chamber optical elements may comprise one or more grating couplers located on integrated device 5-102 to couple excitation light to the integrated device and waveguides to deliver excitation light from instrument 5-104 to reaction chambers in pixels 5-112. One or more optical splitter elements may be positioned between a grating coupler and the waveguides. The optical splitter may couple excitation light from the grating coupler and deliver excitation light to at least one of the waveguides. In some embodiments, the optical splitter may have a configuration that allows for delivery of excitation light to be substantially uniform across all the waveguides such that each of the waveguides receives a substantially similar amount of excitation light. Such embodiments may improve performance of the integrated device by improving the uniformity of excitation light received by reaction chambers of the integrated device.

Reaction chamber 5-108, a portion of the excitation source-to-chamber optics, and the reaction chamber-to-photodetector optics are located on integrated device 5-102. Excitation source 5-106 and a portion of the source-to-chamber components are located in instrument 5-104. In some embodiments, a single component may play a role in both coupling excitation light to reaction chamber 5-108 and delivering emission light from reaction chamber 5-108 to photodetector 5-110. Examples of suitable components, for coupling excitation light to a reaction chamber and/or directing emission light to a photodetector, to include in an integrated device are described in U.S. patent application Ser. No. 14/821,688, filed Aug. 7, 2015, titled "INTEGRATED DEVICE FOR PROBING, DETECTING AND ANALYZING MOLECULES," and U.S. patent application Ser. No. 14/543,865, filed Nov. 17, 2014, titled "INTEGRATED DEVICE WITH EXTERNAL LIGHT SOURCE FOR PROBING, DETECTING, AND ANALYZING MOLECULES," both of which are incorporated by reference in their entirety.

Pixel 5-112 is associated with its own individual reaction chamber 5-108 and at least one photodetector 5-110. The plurality of pixels of integrated device 5-102 may be arranged to have any suitable shape, size, and/or dimensions. Integrated device 5-102 may have any suitable number of pixels. The number of pixels in integrated device 5-102 may be in the range of approximately 10,000 pixels to 1,000,000 pixels or any value or range of values within that range. In some embodiments, the pixels may be arranged in an array of 512 pixels by 512 pixels. Integrated device 5-102 may interface with instrument 5-104 in any suitable manner. In some embodiments, instrument 5-104 may have an interface that detachably couples to integrated device 5-102 such that a user may attach integrated device 5-102 to instrument 5-104 for use of integrated device 5-102 to analyze at least one sample of interest in a suspension and remove integrated device 5-102 from instrument 5-104 to allow for another integrated device to be attached. The interface of instrument 5-104 may position integrated device 5-102 to couple with circuitry of instrument 5-104 to allow for readout signals from one or more photodetectors to be transmitted to instrument 5-104. Integrated device 5-102 and instrument 5-104 may include multi-channel, high-speed communication links for handling data associated with large pixel arrays (e.g., more than 10,000 pixels).

Figures 1B, 4:
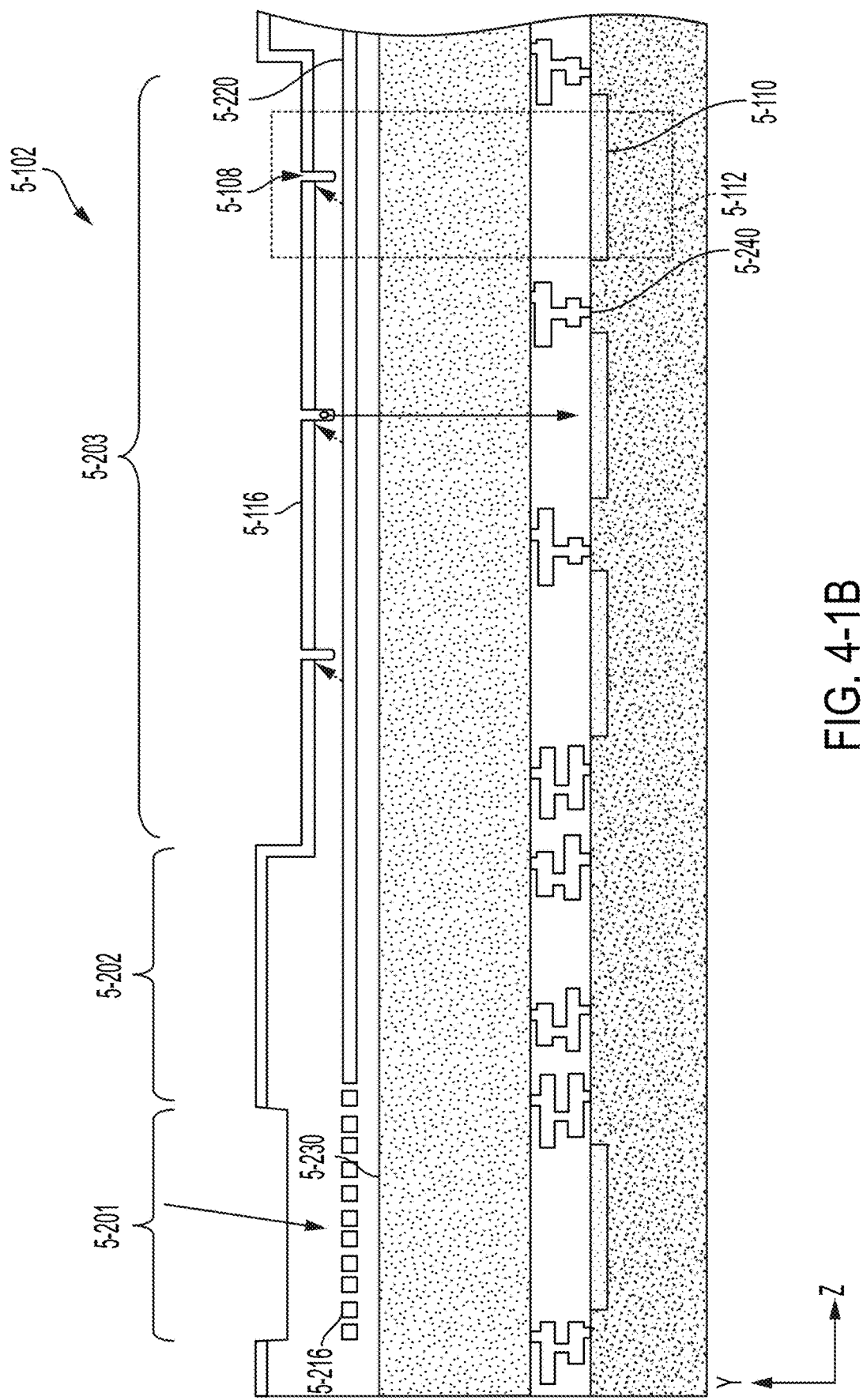

A cross-sectional schematic of integrated device 5-102 illustrating a row of pixels 5-112 is shown in FIG. 4-1B. Integrated device 5-102 may include coupling region 5-201, routing region 5-202, and pixel region 5-203. Pixel region 5-203 may include a plurality of pixels 5-112 having reaction chambers 5-108 positioned on a surface at a location separate from coupling region 5-201, which is where excitation light (shown as the dashed arrow) couples to integrated device 5-102. Reaction chambers 5-108 may be formed through metal layer(s) 5-116. One pixel 5-112, illustrated by the dotted rectangle, is a region of integrated device 5-102 that includes a reaction chamber 5-108 and a photodetection region having one or more photodetectors 5-110.

FIG. 4-1B illustrates the path of excitation (shown in dashed lines) by coupling a beam of excitation light to coupling region 5-201 and to reaction chambers 5-108. The row of reaction chambers 5-108 shown in FIG. 4-1B may be positioned to optically couple with waveguide 5-220. Excitation light may illuminate a sample located within a reaction chamber. The sample or a reaction component (e.g., fluorescent label) may reach an excited state in response to being illuminated by the excitation light. When in an excited state, the sample or reaction component may emit emission light, which may be detected by one or more photodetectors associated with the reaction chamber. FIG. 4-1B schematically illustrates the path of emission light (shown as the solid line) from a reaction chamber 5-108 to photodetector(s) 5-110 of pixel 5-112. The photodetector(s) 5-110 of pixel 5-112 may be configured and positioned to detect emission light from reaction chamber 5-108. Examples of suitable photodetectors are described in U.S. patent application Ser. No. 14/821,656, filed Aug. 7, 2015, titled "INTEGRATED DEVICE FOR TEMPORAL BINNING OF RECEIVED PHOTONS," which is incorporated by reference in its entirety. For an individual pixel 5-112, a reaction chamber 5-108 and its respective photodetector(s) 5-110 may be aligned along a common axis (along the y-direction shown in FIG. 4-1B). In this manner, the photodetector(s) may overlap with the reaction chamber within a pixel 5-112.

The directionality of the emission light from a reaction chamber 5-108 may depend on the positioning of the sample in the reaction chamber 5-108 relative to metal layer(s) 5-116 because metal layer(s) 5-116 may act to reflect emission light. In this manner, a distance between metal layer(s) 5-116 and a fluorescent marker positioned in a reaction chamber 5-108 may impact the efficiency of photodetector(s) 5-110, that are in the same pixel as the reaction chamber, to detect the light emitted by the fluorescent marker. The distance between metal layer(s) 5-116 and the bottom surface of a reaction chamber 5-106, which is proximate to where a sample may be positioned during operation, may be in the range of 100 nm to 500 nm, or any value or range of values in that range. In some embodiments the distance between metal layer(s) 5-116 and the bottom surface of a reaction chamber 5-108 is approximately 300 nm.

The distance between the sample and the photodetector(s) may also impact efficiency in detecting emission light. By decreasing the distance light has to travel between the sample and the photodetector(s), detection efficiency of emission light may be improved. In addition, smaller distances between the sample and the photodetector(s) may allow for pixels that occupy a smaller area footprint of the integrated device, which can allow for a higher number of pixels to be included in the integrated device. The distance between the bottom surface of a reaction chamber 5-108 and photodetector(s) may be in the range of 1 µm to 15 µm, or any value or range of values in that range.

Photonic structure(s) 5-230 may be positioned between reaction chambers 5-108 and photodetectors 5-110 and configured to reduce or prevent excitation light from reaching photodetectors 5-110, which may otherwise contribute to signal noise in detecting emission light. As shown in FIG. 4-1B, the one or more photonic structures 5-230 may be positioned between waveguide 5-220 and photodetectors 5-110. Photonic structure(s) 5-230 may include one or more optical rejection photonic structures including a spectral filter, a polarization filter, and a spatial filter. Photonic structure(s) 5-230 may be positioned to align with individual reaction chambers 5-108 and their respective photodetector(s) 5-110 along a common axis. Metal layers 5-240, which may act as a circuitry for integrated device 5-102, may also act as a spatial filter, in accordance with some embodiments. In such embodiments, one or more metal layers 5-240 may be positioned to block some or all excitation light from reaching photodetector(s) 5-110.

Coupling region 5-201 may include one or more optical components configured to couple excitation light from an external excitation source. Coupling region 5-201 may include grating coupler 5-216 positioned to receive some or all of a beam of excitation light. Examples of suitable grating couplers are described in U.S. patent application Ser. No. 15/844,403, filed Dec. 15, 2017, titled "OPTICAL COUPLER AND WAVEGUIDE SYSTEM," which is incorporated by reference in its entirety. Grating coupler 5-216 may couple excitation light to waveguide 5-220, which may be configured to propagate excitation light to the proximity of one or more reaction chambers 5-108. Alternatively, coupling region 5-201 may comprise other well-known structures for coupling light into a waveguide.

Components located off of the integrated device may be used to position and align the excitation source 5-106 to the integrated device. Such components may include optical components including lenses, mirrors, prisms, windows, apertures, attenuators, and/or optical fibers. Additional mechanical components may be included in the instrument to allow for control of one or more alignment components. Such mechanical components may include actuators, stepper motors, and/or knobs. Examples of suitable excitation sources and alignment mechanisms are described in U.S. patent application Ser. No. 15/161,088, filed May 20, 2016, titled "PULSED LASER AND SYSTEM," which is incorporated by reference in its entirety. Another example of a beam-steering module is described in U.S. patent application Ser. No. 15/842,720, filed Dec. 14, 2017, titled "COMPACT BEAM SHAPING AND STEERING ASSEMBLY," which is incorporated herein by reference.

A sample to be analyzed may be introduced into reaction chamber 5-108 of pixel 5-112. The sample may be a biological sample or any other suitable sample, such as a chemical sample. In some cases, the suspension may include multiple molecules of interest and the reaction chamber may be configured to isolate a single molecule. In some instances, the dimensions of the reaction chamber may act to confine a single molecule within the reaction chamber, allowing measurements to be performed on the single molecule. Excitation light may be delivered into the reaction chamber 5-108, so as to excite the sample or at least one fluorescent marker attached to the sample or otherwise associated with the sample while it is within an illumination area within the reaction chamber 5-108.

In operation, parallel analyses of samples within the reaction chambers are carried out by exciting some or all of the samples within the reaction chambers using excitation light and detecting signals with the photodetectors that are representative of emission light from the reaction chambers. Emission light from a sample or reaction component (e.g., fluorescent label) may be detected by a corresponding photodetector and converted to at least one electrical signal. The electrical signals may be transmitted along conducting lines (e.g., metal layers 5-240) in the circuitry of the integrated device, which may be connected to an instrument interfaced with the integrated device. The electrical signals may be subsequently processed and/or analyzed. Processing or analyzing of electrical signals may occur on a suitable computing device either located on or off the instrument.

Instrument 5-104 may include a user interface for controlling operation of instrument 5-104 and/or integrated device 5-102. The user interface may be configured to allow a user to input information into the instrument, such as commands and/or settings used to control the functioning of the instrument. In some embodiments, the user interface may include buttons, switches, dials, and a microphone for voice commands. The user interface may allow a user to receive feedback on the performance of the instrument and/or integrated device, such as proper alignment and/or information obtained by readout signals from the photodetectors on the integrated device. In some embodiments, the user interface may provide feedback using a speaker to provide audible feedback. In some embodiments, the user interface may include indicator lights and/or a display screen for providing visual feedback to a user.

In some embodiments, instrument 5-104 may include a computer interface configured to connect with a computing device. Computer interface may be a USB interface, a FireWire interface, or any other suitable computer interface. Computing device may be any general purpose computer, such as a laptop or desktop computer. In some embodiments, computing device may be a server (e.g., cloud-based server) accessible over a wireless network via a suitable computer interface. The computer interface may facilitate communication of information between instrument 5-104 and the computing device. Input information for controlling and/or configuring the instrument 5-104 may be provided to the computing device and transmitted to instrument 5-104 via the computer interface. Output information generated by instrument 5-104 may be received by the computing device via the computer interface. Output information may include feedback about performance of instrument 5-104, performance of integrated device 5-112, and/or data generated from the readout signals of photodetector 5-110.

In some embodiments, instrument 5-104 may include a processing device configured to analyze data received from one or more photodetectors of integrated device 5-102 and/or transmit control signals to excitation source(s) 2-106. In some embodiments, the processing device may comprise a general purpose processor, a specially-adapted processor (e.g., a central processing unit (CPU) such as one or more microprocessor or microcontroller cores, a field-programmable gate array (FPGA), an application-specific integrated circuit (ASIC), a custom integrated circuit, a digital signal processor (DSP), or a combination thereof.) In some embodiments, the processing of data from one or more photodetectors may be performed by both a processing device of instrument 5-104 and an external computing device. In other embodiments, an external computing device may be omitted and processing of data from one or more photodetectors may be performed solely by a processing device of integrated device 5-102.

Figures 1C, 4:
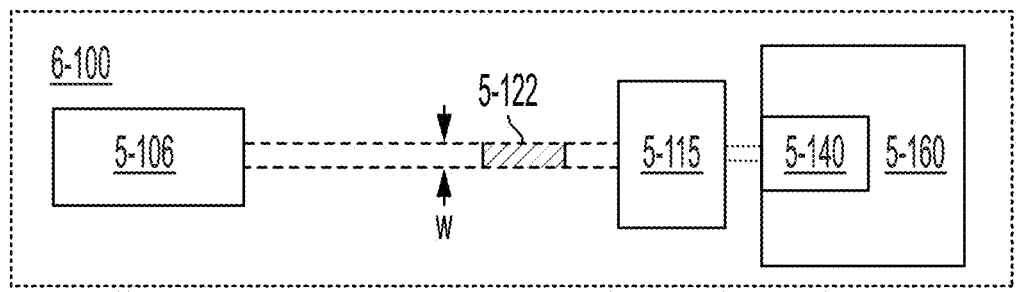

Referring to FIG. 4-1C, a portable, advanced analytic instrument 5-100 can comprise one or more pulsed optical sources 5-106 mounted as a replaceable module within, or otherwise coupled to, the instrument 5-100. The portable analytic instrument 5-100 can include an optical coupling system 5-115 and an analytic system 5-160. The optical coupling system 5-115 can include some combination of optical components (which may include, for example, none, one from among, or more than one component from among the following components: lens, mirror, optical filter, attenuator, beam-steering component, beam shaping component) and be configured to operate on and/or couple output optical pulses 5-122 from the pulsed optical source 5-106 to the analytic system 5-160. The analytic system 5-160 can include a plurality of components that are arranged to direct the optical pulses to at least one reaction chamber for sample analysis, receive one or more optical signals (e.g., fluorescence, backscattered radiation) from the at least one reaction chamber, and produce one or more electrical signals representative of the received optical signals. In some embodiments, the analytic system 5-160 can include one or more photodetectors and may also include signal-processing electronics (e.g., one or more microcontrollers, one or more field-programmable gate arrays, one or more microprocessors, one or more digital signal processors, logic gates, etc.) configured to process the electrical signals from the photodetectors. The analytic system 5-160 can also include data transmission hardware configured to transmit and receive data to and from external devices (e.g., one or more external devices on a network to which the instrument 5-100 can connect via one or more data communications links). In some embodiments, the analytic system 5-160 can be configured to receive a bio-optoelectronic chip 5-140, which holds one or more samples to be analyzed.

Figures 1D, 4:
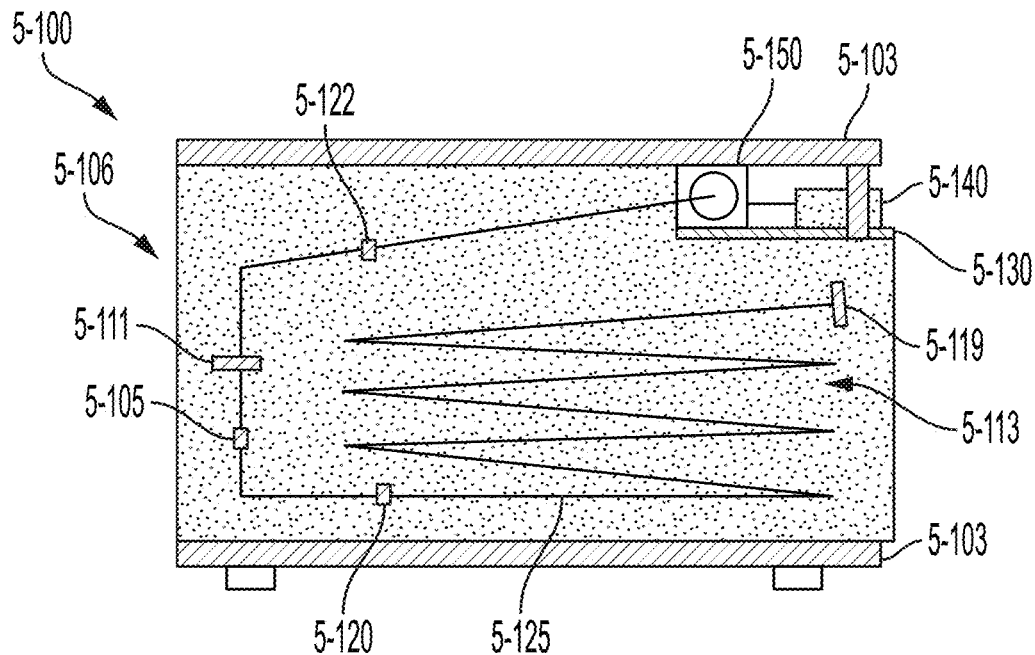
Figures 2, 4:
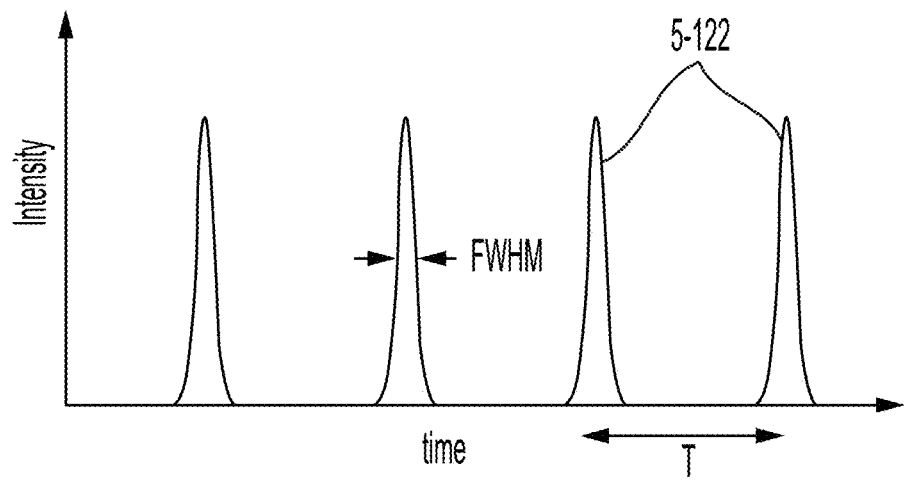
Figures 3, 4:
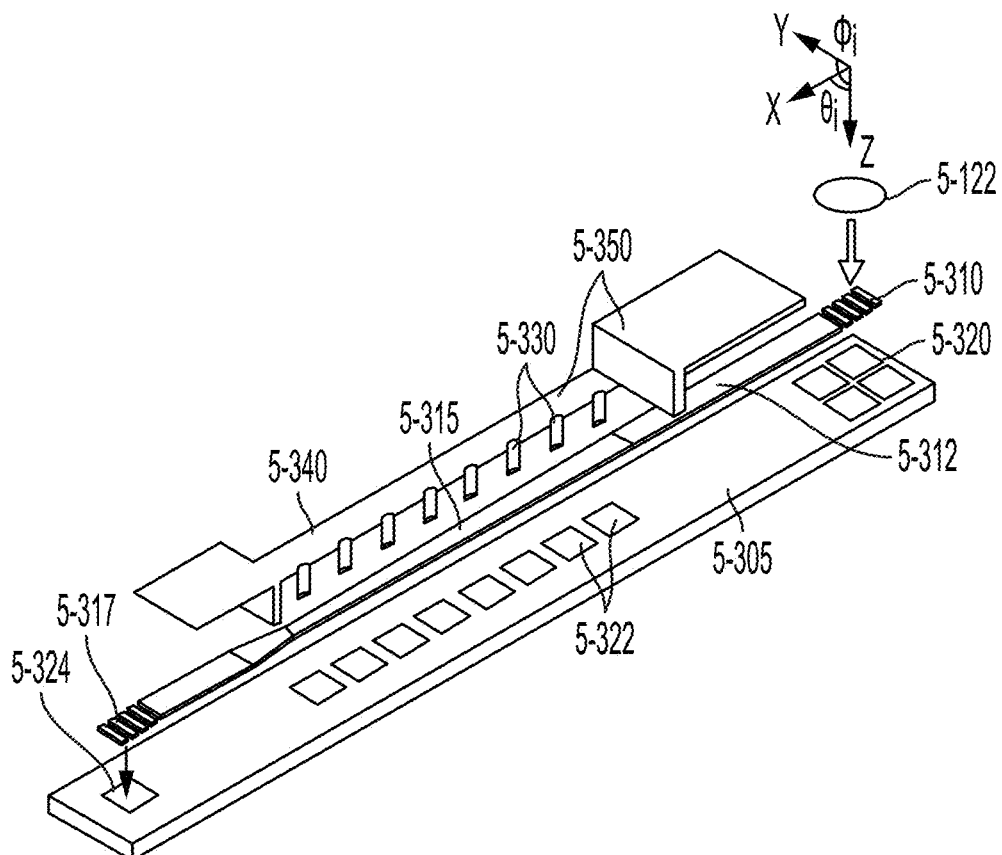
Figure 4:
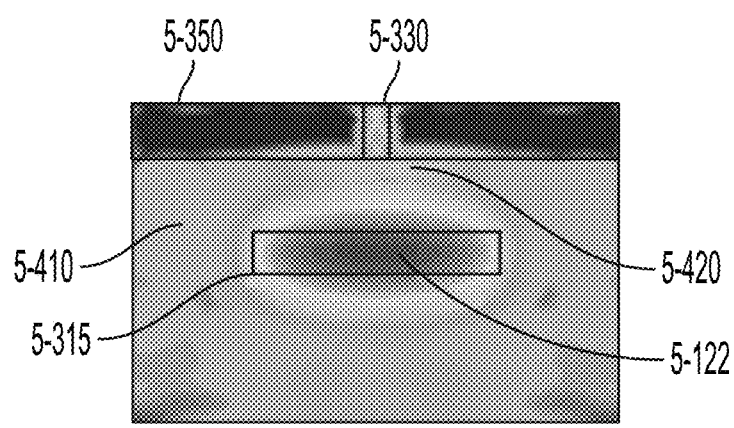
Figures 4, 5:
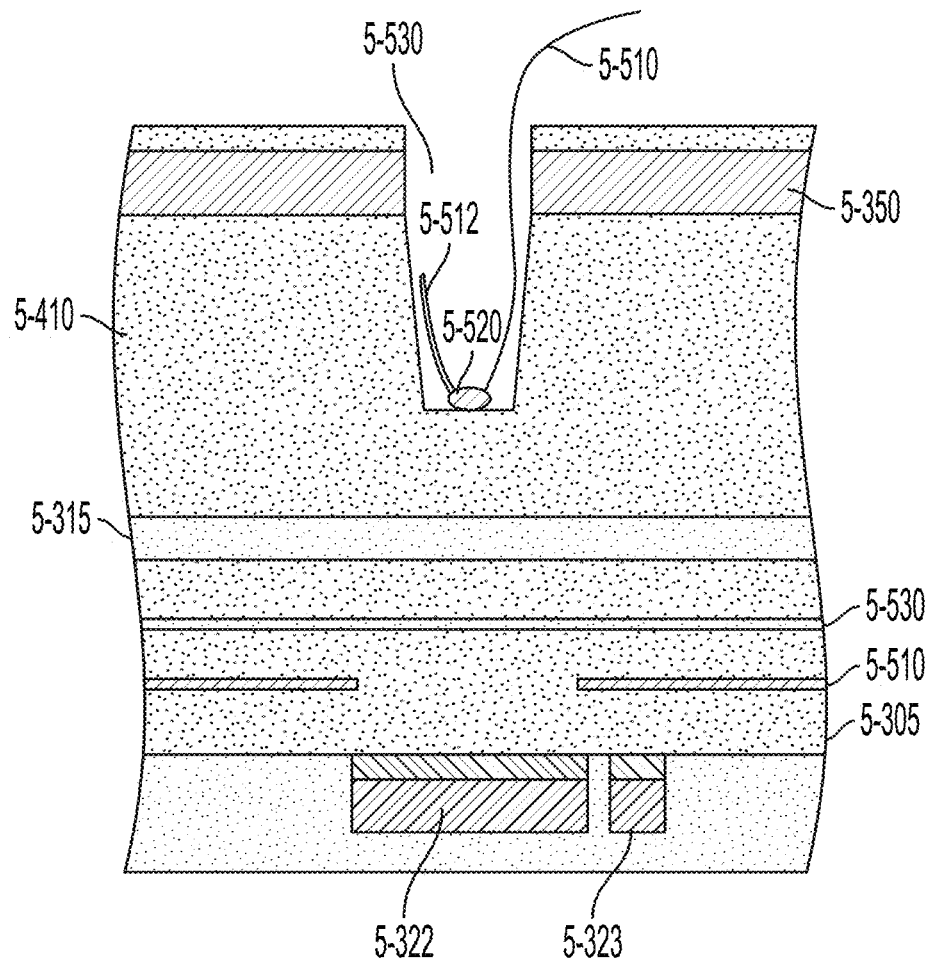
Figures 4, 5, 6:
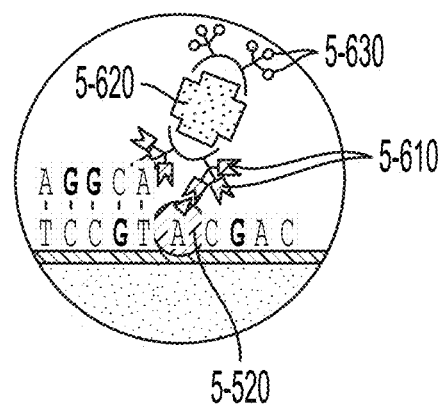
Figures 4, 5, 6, 7:
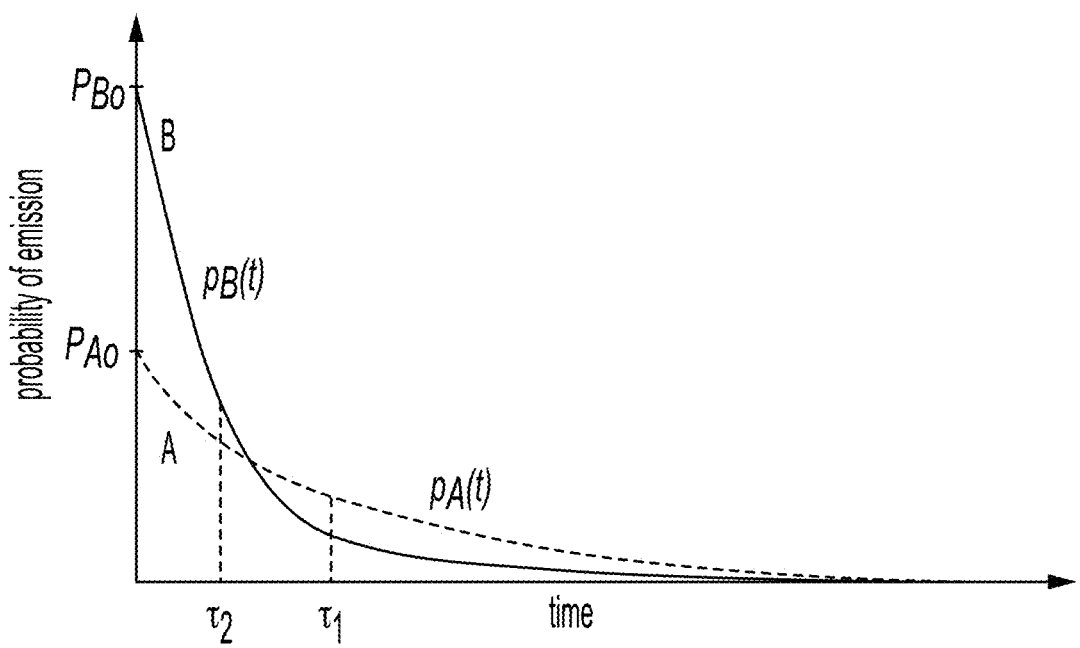
Figures 4, 5, 6, 7, 8:
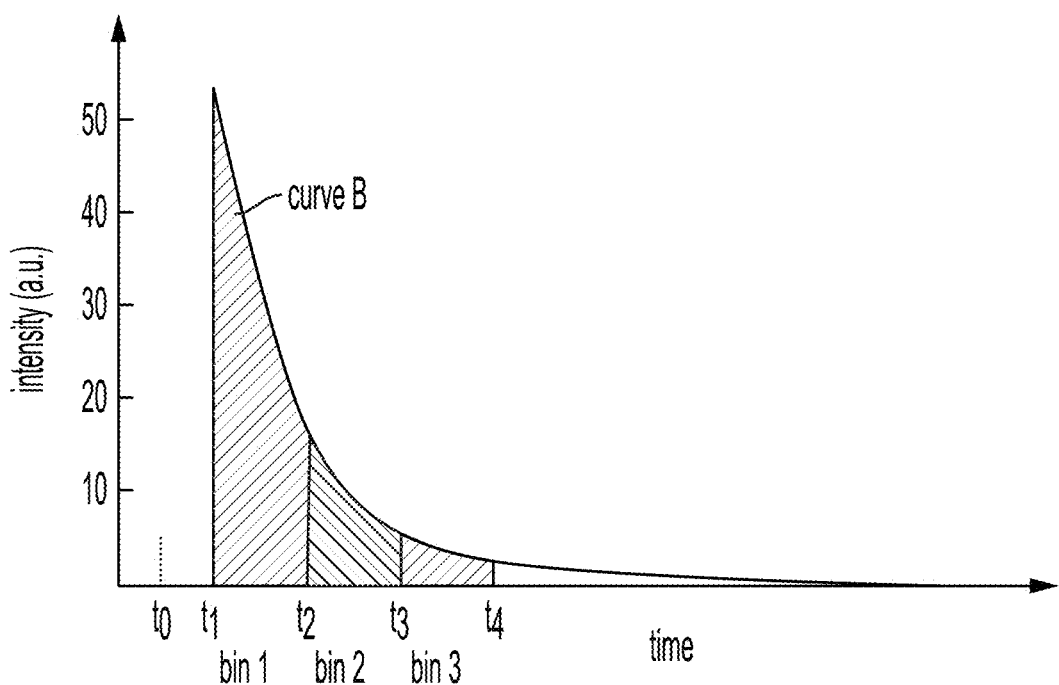
Figures 4, 5, 6, 7, 8, 9:
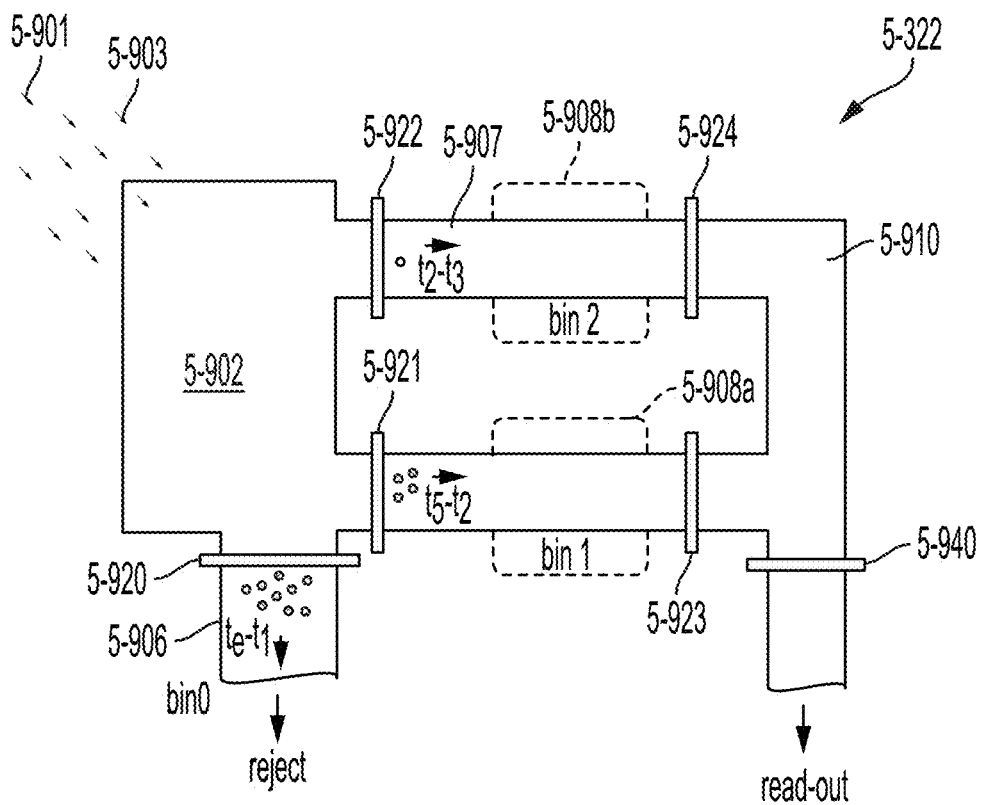
Figures 4, 5, 6, 7, 8, 9, 10, 10A:
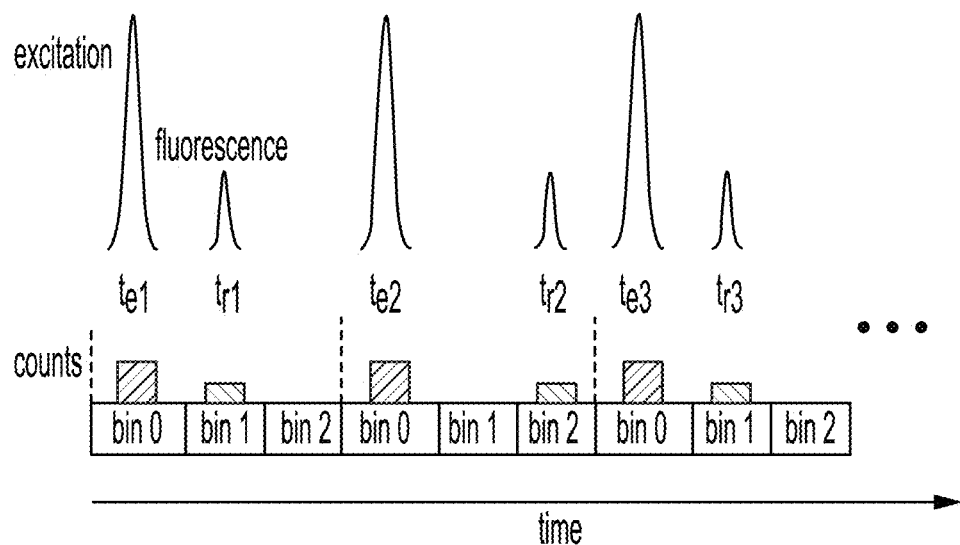
Figures 4, 5, 6, 7, 8, 9, 10, 10B:
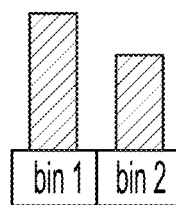
Figures 4, 5, 6, 7, 8, 9, 10, 11, 11A:
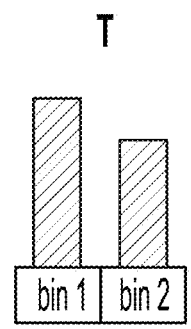
Figures 4, 5, 6, 7, 8, 9, 10, 11, 11B:
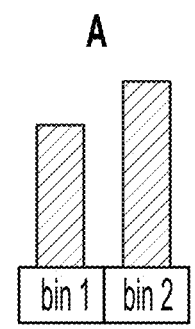
Figures 4, 5, 6, 7, 8, 9, 10, 11, 11C:
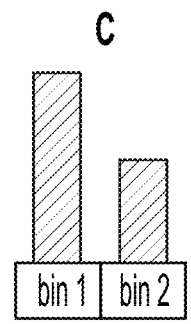
Figures 4, 5, 6, 7, 8, 9, 10, 11, 11D:
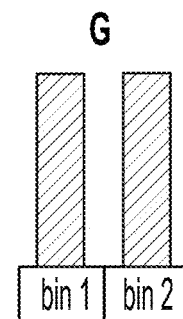
Figures 4, 5, 6, 7, 8, 9, 10, 11, 12:
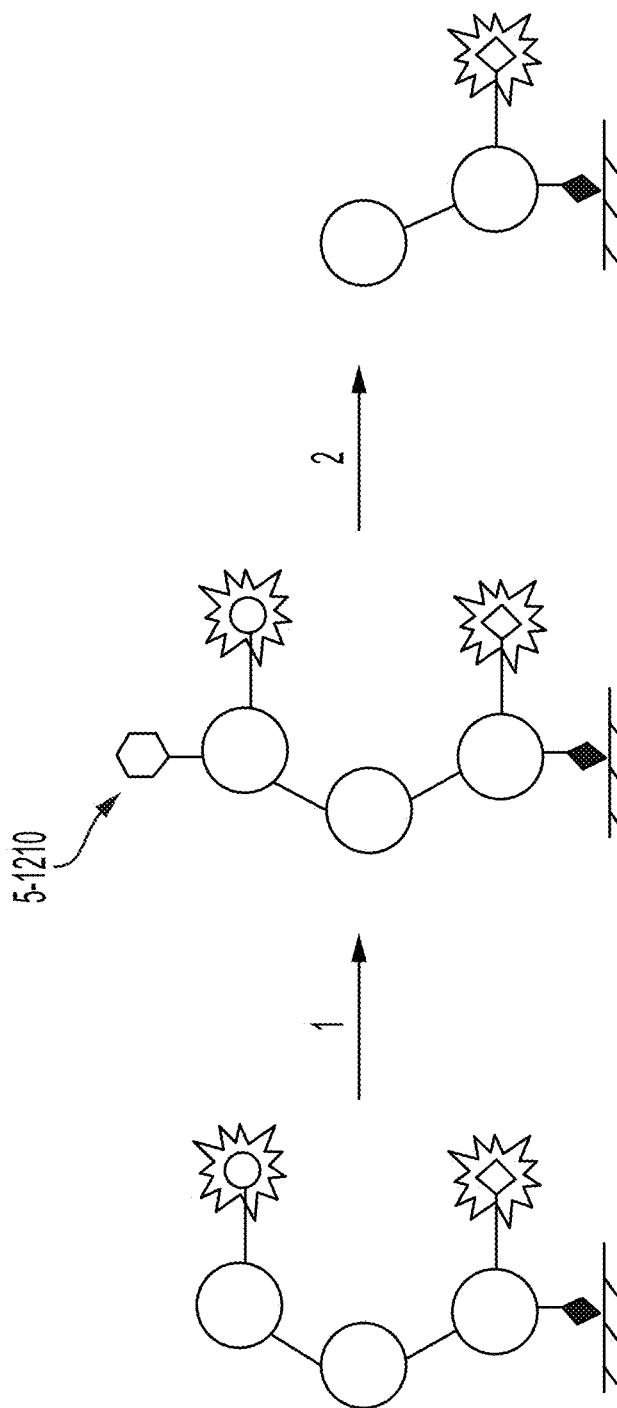
Figures 4, 5, 6, 7, 8, 9, 10, 11, 12, 13:
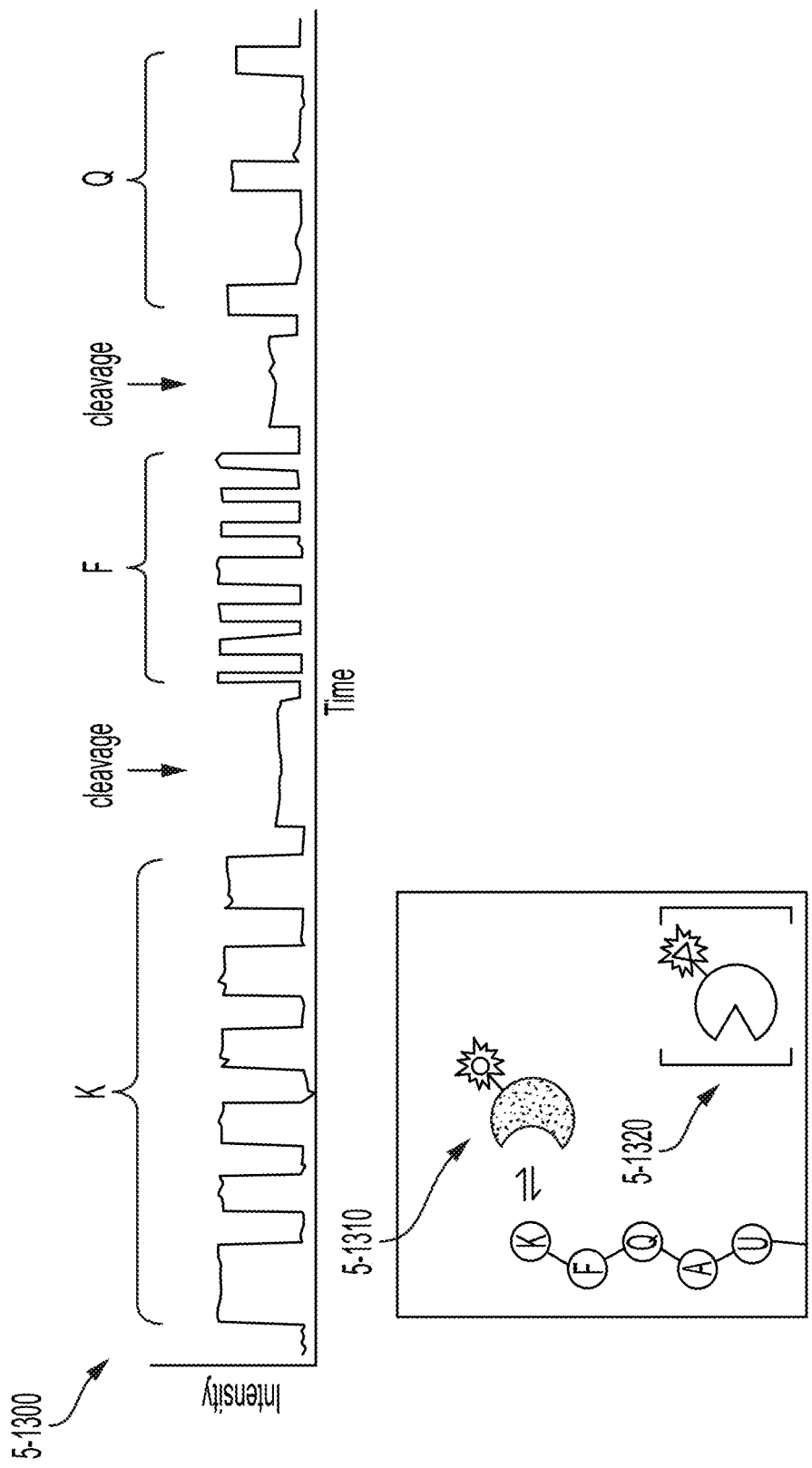

FIG. 4-1D depicts a further detailed example of a portable analytical instrument 5-100 that includes a compact pulsed optical source 5-108. In this example, the pulsed optical source 5-108 comprises a compact, passively mode-locked laser module 5-113. A passively mode-locked laser can produce optical pulses autonomously, without the application of an external pulsed signal. In some implementations, the module can be mounted to an instrument chassis or frame 5-103, and may be located inside an outer casing of the instrument. According to some embodiments, a pulsed optical source 5-106 can include additional components that can be used to operate the optical source and operate on an output beam from the optical source 5-106. A mode-locked laser 5-113 may comprise an element (e.g., saturable absorber, acousto-optic modulator, Kerr lens) in a laser cavity, or coupled to the laser cavity, that induces phase locking of the laser's longitudinal frequency modes. The laser cavity can be defined in part by cavity end mirrors 5-111, 5-119. Such locking of the frequency modes results in pulsed operation of the laser (e.g., an intracavity pulse 5-120 bounces back-and-forth between the cavity end mirrors) and produces a stream of output optical pulses 5-122 from one end mirror 5-111 which is partially transmitting.

In some cases, the analytic instrument 5-100 is configured to receive a removable, packaged, bio-optoelectronic or optoelectronic chip 5-140 (also referred to as a "disposable chip"). The disposable chip can include a bio-optoelectronic chip, for example, that comprises a plurality of reaction chambers, integrated optical components arranged to deliver optical excitation energy to the reaction chambers, and integrated photodetectors arranged to detect fluorescent emission from the reaction chambers. In some implementations, the chip 5-140 can be disposable after a single use, whereas in other implementations the chip 5-140 can be reused two or more times. When the chip 5-140 is received by the instrument 5-100, it can be in electrical and optical communication with the pulsed optical source 5-106 and with apparatus in the analytic system 5-160. Electrical communication may be made through electrical contacts on the chip package, for example.

In some embodiments and referring to FIG. 4-1D, the disposable chip 5-140 can be mounted (e.g., via a socket connection) on an electronic circuit board 5-130, such as a printed circuit board (PCB) that can include additional instrument electronics. For example, the PCB 5-130 can include circuitry configured to provide electrical power, one or more clock signals, and control signals to the optoelectronic chip 5-140, and signal-processing circuitry arranged to receive signals representative of fluorescent emission detected from the reaction chambers. Data returned from the optoelectronic chip can be processed in part or entirely by electronics on the instrument 5-100, although data may be transmitted via a network connection to one or more remote data processors, in some implementations. The PCB 5-130 can also include circuitry configured to receive feedback signals from the chip relating to optical coupling and power levels of the optical pulses 5-122 coupled into waveguides of the optoelectronic chip 5-140. The feedback signals can be provided to one or both of the pulsed optical source 5-106 and optical system 5-115 to control one or more parameters of the output beam of optical pulses 5-122. In some cases, the PCB 5-130 can provide or route power to the pulsed optical source 5-106 for operating the optical source and related circuitry in the optical source 5-106.

According to some embodiments, the pulsed optical source 5-106 comprises a compact mode-locked laser module 5-113. The mode-locked laser can comprise a gain medium 5-105 (which can be solid-state material in some embodiments), an output coupler 5-111, and a laser-cavity end mirror 5-119. The mode-locked laser's optical cavity can be bound by the output coupler 5-111 and end mirror 5-119. An optical axis 5-125 of the laser cavity can have one or more folds (turns) to increase the length of the laser cavity and provide a desired pulse repetition rate. The pulse repetition rate is determined by the length of the laser cavity (e.g., the time for an optical pulse to make a round-trip within the laser cavity).

In some embodiments, there can be additional optical elements (not shown in FIG. 4-1D) in the laser cavity for beam shaping, wavelength selection, and/or pulse forming. In some cases, the end mirror 5-119 comprises a saturable-absorber mirror (SAM) that induces passive mode locking of longitudinal cavity modes and results in pulsed operation of the mode-locked laser. The mode-locked laser module 5-113 can further include a pump source (e.g., a laser diode, not shown in FIG. 4-1D) for exciting the gain medium 5-105. Further details of a mode-locked laser module 5-113 can be found in U.S. patent application Ser. No. 15/844,469, titled "Compact Mode-Locked Laser Module," filed Dec. 15, 2017, each application of which is incorporated herein by reference.

When the laser 5-113 is mode locked, an intracavity pulse 5-120 can circulate between the end mirror 5-119 and the output coupler 5-111, and a portion of the intracavity pulse can be transmitted through the output coupler 5-111 as an output pulse 5-122. Accordingly, a train of output pulses 5-122, as depicted in the graph of FIG. 4-2, can be detected at the output coupler as the intracavity pulse 5-120 bounces back-and-forth between the output coupler 5-111 and end mirror 5-119 in the laser cavity.

FIG. 4-2 depicts temporal intensity profiles of the output pulses 5-122, though the illustration is not to scale. In some embodiments, the peak intensity values of the emitted pulses may be approximately equal, and the profiles may have a Gaussian temporal profile, though other profiles such as a sech2 profile may be possible. In some cases, the pulses may not have symmetric temporal profiles and may have other temporal shapes. The duration of each pulse may be characterized by a full-width-half-maximum (FWHM) value, as indicated in FIG. 4-2. According to some embodiments of a mode-locked laser, ultrashort optical pulses can have FWHM values less than 100 picoseconds (ps). In some cases, the FWHM values can be between approximately 5 ps and approximately 30 ps.

The output pulses 5-122 can be separated by regular intervals T. For example, T can be determined by a round-trip travel time between the output coupler 5-111 and cavity end mirror 5-119. According to some embodiments, the pulse-separation interval T can be between about 1 ns and about 30 ns. In some cases, the pulse-separation interval T can be between about 5 ns and about 20 ns, corresponding to a laser-cavity length (an approximate length of the optical axis 5-125 within the laser cavity) between about 0.7 meter and about 3 meters. In embodiments, the pulse-separation interval corresponds to a round trip travel time in the laser cavity, so that a cavity length of 3 meters (round-trip distance of 6 meters) provides a pulse-separation interval T of approximately 20 ns.

According to some embodiments, a desired pulse-separation interval T and laser-cavity length can be determined by a combination of the number of reaction chambers on the chip 5-140, fluorescent emission characteristics, and the speed of data-handling circuitry for reading data from the optoelectronic chip 5-140. In embodiments, different fluorophores can be distinguished by their different fluorescent decay rates or characteristic lifetimes. Accordingly, there needs to be a sufficient pulse-separation interval T to collect adequate statistics for the selected fluorophores to distinguish between their different decay rates. Additionally, if the pulse-separation interval T is too short, the data handling circuitry cannot keep up with the large amount of data being collected by the large number of reaction chambers. Pulse-separation interval T between about 5 ns and about 20 ns is suitable for fluorophores that have decay rates up to about 2 ns and for handling data from between about 60,000 and 10,000,000 reaction chambers.

According to some implementations, a beam-steering module 5-150 can receive output pulses from the pulsed optical source 5-106 and is configured to adjust at least the position and incident angles of the optical pulses onto an optical coupler (e.g., grating coupler) of the optoelectronic chip 5-140. In some cases, the output pulses 5-122 from the pulsed optical source 5-106 can be operated on by a beam-steering module 5-150 to additionally or alternatively change a beam shape and/or beam rotation at an optical coupler on the optoelectronic chip 5-140. In some implementations, the beam-steering module 5-150 can further provide focusing and/or polarization adjustments of the beam of output pulses onto the optical coupler. One example of a beam-steering module is described in U.S. patent application Ser. No. 15/161,088 titled "Pulsed Laser and Bioanalytic System," filed May 20, 2016, which is incorporated herein by reference. Another example of a beam-steering module is described in a separate U.S. patent application No. 62/435,679, filed Dec. 16, 2016, and titled "Compact Beam Shaping and Steering Assembly," which is incorporated herein by reference.

Referring to FIG. 4-3, the output pulses 5-122 from a pulsed optical source can be coupled into one or more optical waveguides 5-312 on a bio-optoelectronic chip 5-140, for example. In some embodiments, the optical pulses can be coupled to one or more waveguides via a grating coupler 5-310, though coupling to an end of one or more optical waveguides on the optoelectronic chip can be used in some embodiments. According to some embodiments, a quad detector 5-320 can be located on a semiconductor substrate 5-305 (e.g., a silicon substrate) for aiding in alignment of the beam of optical pulses 5-122 to a grating coupler 5-310. The one or more waveguides 5-312 and reaction chambers or reaction chambers 5-330 can be integrated on the same semiconductor substrate with intervening dielectric layers (e.g., silicon dioxide layers) between the substrate, waveguide, reaction chambers, and photodetectors 5-322.

Each waveguide 5-312 can include a tapered portion 5-315 below the reaction chambers 5-330 to equalize optical power coupled to the reaction chambers along the waveguide. The reducing taper can force more optical energy outside the waveguide's core, increasing coupling to the reaction chambers and compensating for optical losses along the waveguide, including losses for light coupling into the reaction chambers. A second grating coupler 5-317 can be located at an end of each waveguide to direct optical energy to an integrated photodiode 5-324. The integrated photodiode can detect an amount of power coupled down a waveguide and provide a detected signal to feedback circuitry that controls the beam-steering module 5-150, for example.

The reaction chambers 5-330 or reaction chambers 5-330 can be aligned with the tapered portion 5-315 of the waveguide and recessed in a tub 5-340. There can be photodetectors 5-322 located on the semiconductor substrate 5-305 for each reaction chamber 5-330. In some embodiments, a semiconductor absorber (shown in FIG. 4-5 as an optical filter 5-530) may be located between the waveguide and a photodetector 5-322 at each pixel. A metal coating and/or multilayer coating 5-350 can be formed around the reaction chambers and above the waveguide to prevent optical excitation of fluorophores that are not in the reaction chambers (e.g., dispersed in a solution above the reaction chambers). The metal coating and/or multilayer coating 5-350 may be raised beyond edges of the tub 5-340 to reduce absorptive losses of the optical energy in the waveguide 5-312 at the input and output ends of each waveguide.

There can be a plurality of rows of waveguides, reaction chambers, and time-binning photodetectors on the optoelectronic chip 5-140. For example, there can be 128 rows, each having 512 reaction chambers, for a total of 65,536 reaction chambers in some implementations. Other implementations may include fewer or more reaction chambers, and may include other layout configurations. Optical power from the pulsed optical source 5-106 can be distributed to the multiple waveguides via one or more star couplers or multi-mode interference couplers, or by any other means, located between an optical coupler 5-310 to the chip 5-140 and the plurality of waveguides 5-312.

FIG. 4-4 illustrates optical energy coupling from an optical pulse 5-122 within a tapered portion of waveguide 5-315 to a reaction chamber 5-330. The drawing has been produced from an electromagnetic field simulation of the optical wave that accounts for waveguide dimensions, reaction chamber dimensions, the different materials' optical properties, and the distance of the tapered portion of waveguide 5-315 from the reaction chamber 5-330. The waveguide can be formed from silicon nitride in a surrounding medium 5-410 of silicon dioxide, for example. The waveguide, surrounding medium, and reaction chamber can be formed by microfabrication processes described in U.S. application Ser. No. 14/821,688, filed Aug. 7, 2015, titled "Integrated Device for Probing, Detecting and Analyzing Molecules." According to some embodiments, an evanescent optical field 5-420 couples optical energy transported by the waveguide to the reaction chamber 5-330.

Figures 1, 2, 3, 4, 5:
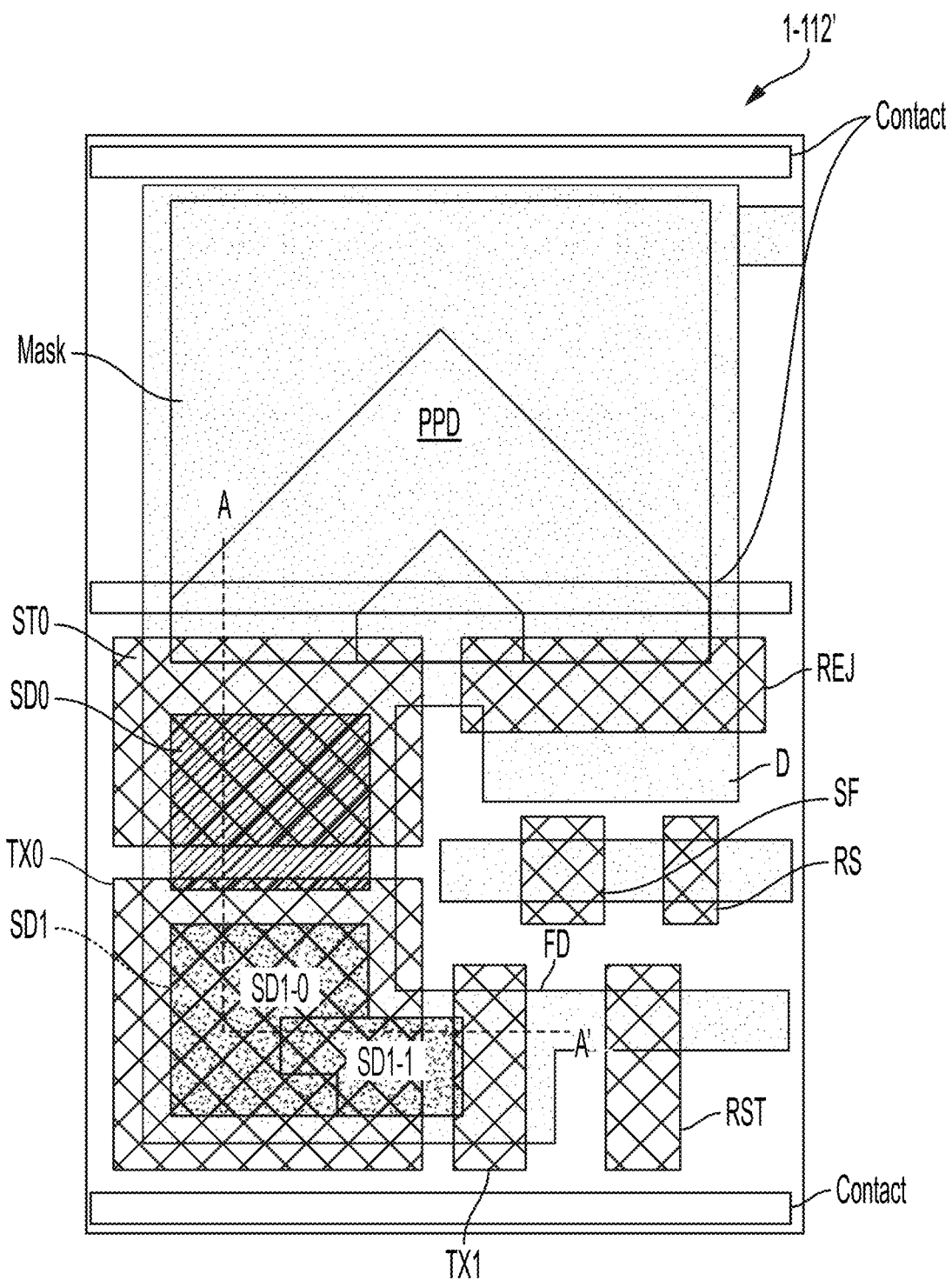

A non-limiting example of a biological reaction taking place in a reaction chamber 5-330 is depicted in FIG. 4-5. The example depicts sequential incorporation of nucleotides or nucleotide analogs into a growing strand that is complementary to a target nucleic acid. The sequential incorporation can take place in a reaction chamber 5-330, and can be detected by an advanced analytic instrument to sequence DNA. The reaction chamber can have a depth between about 150 nm and about 250 nm and a diameter between about 80 nm and about 160 nm. A metallization layer 5-540 (e.g., a metallization for an electrical reference potential) can be patterned above a photodetector 5-322 to provide an aperture or iris that blocks stray light from adjacent reaction chambers and other unwanted light sources. According to some embodiments, polymerase 5-520 can be located within the reaction chamber 5-330 (e.g., attached to a base of the chamber). The polymerase can take up a target nucleic acid 5-510 (e.g., a portion of nucleic acid derived from DNA), and sequence a growing strand of complementary nucleic acid to produce a growing strand of DNA 5-512. Nucleotides or nucleotide analogs labeled with different fluorophores can be dispersed in a solution above and within the reaction chamber.

Figures 1, 2, 3, 4, 5, 6:
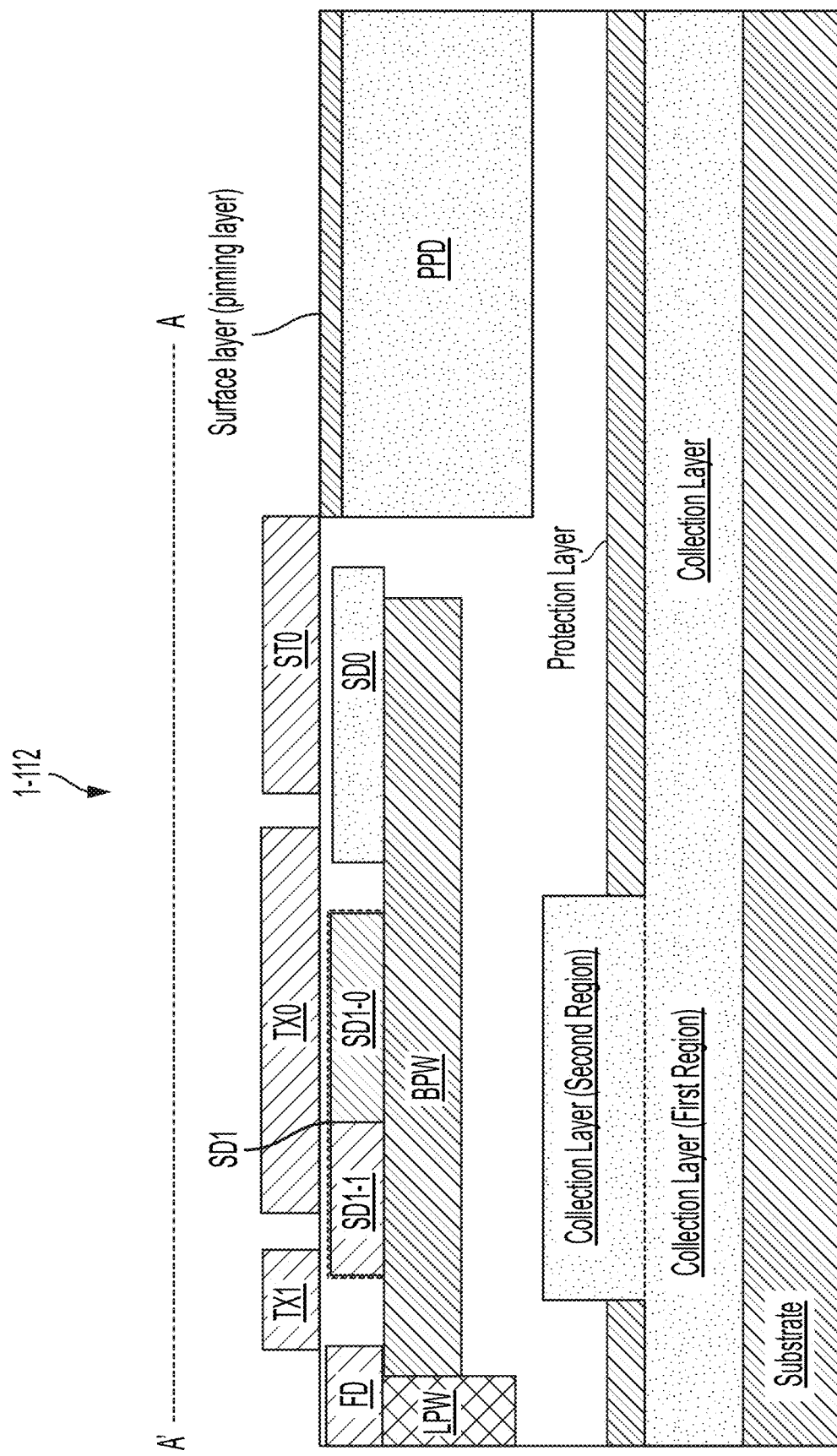
Figures 1, 2, 3, 4, 5, 6, 7:
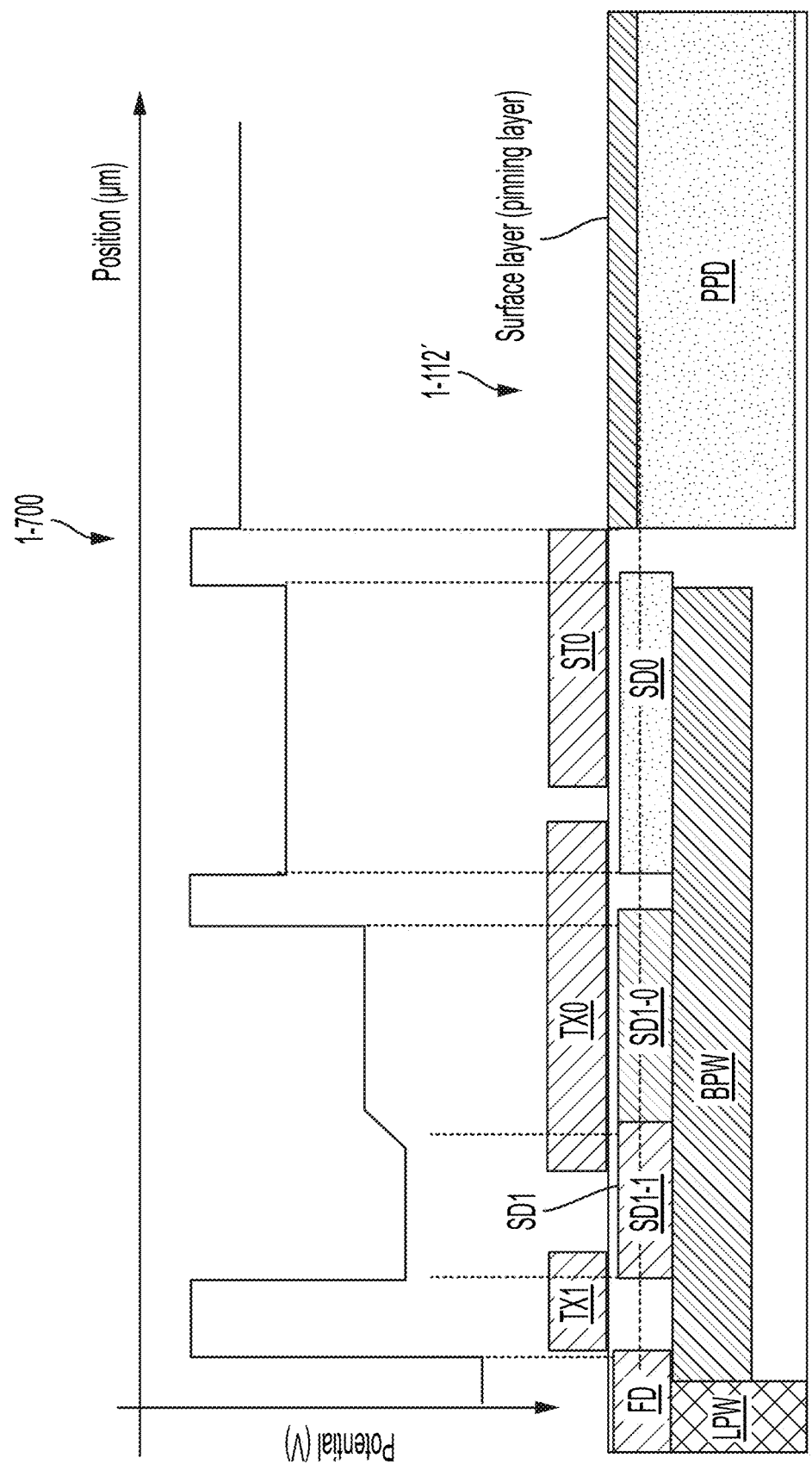
Figures 1, 2, 3, 4, 5, 6, 7, 8, 9:
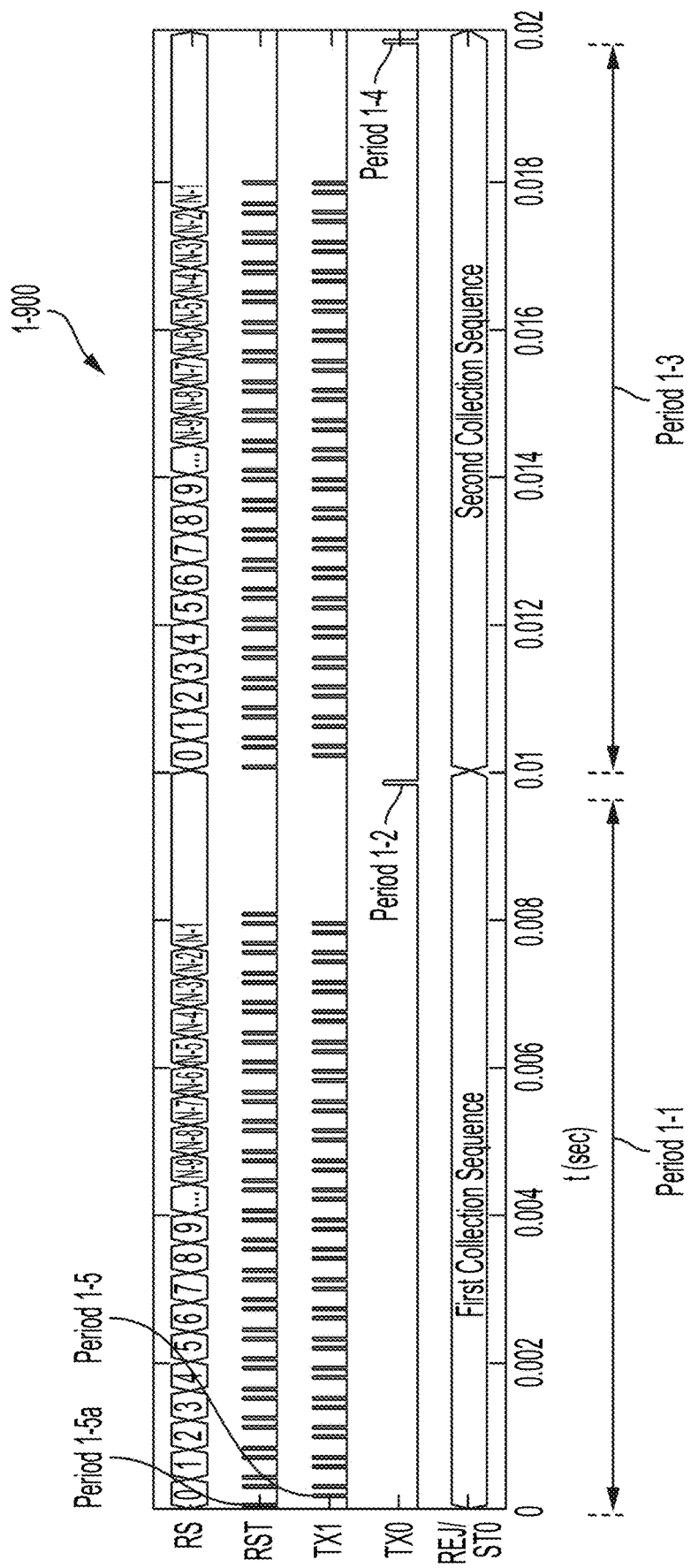
Figures 1, 2:
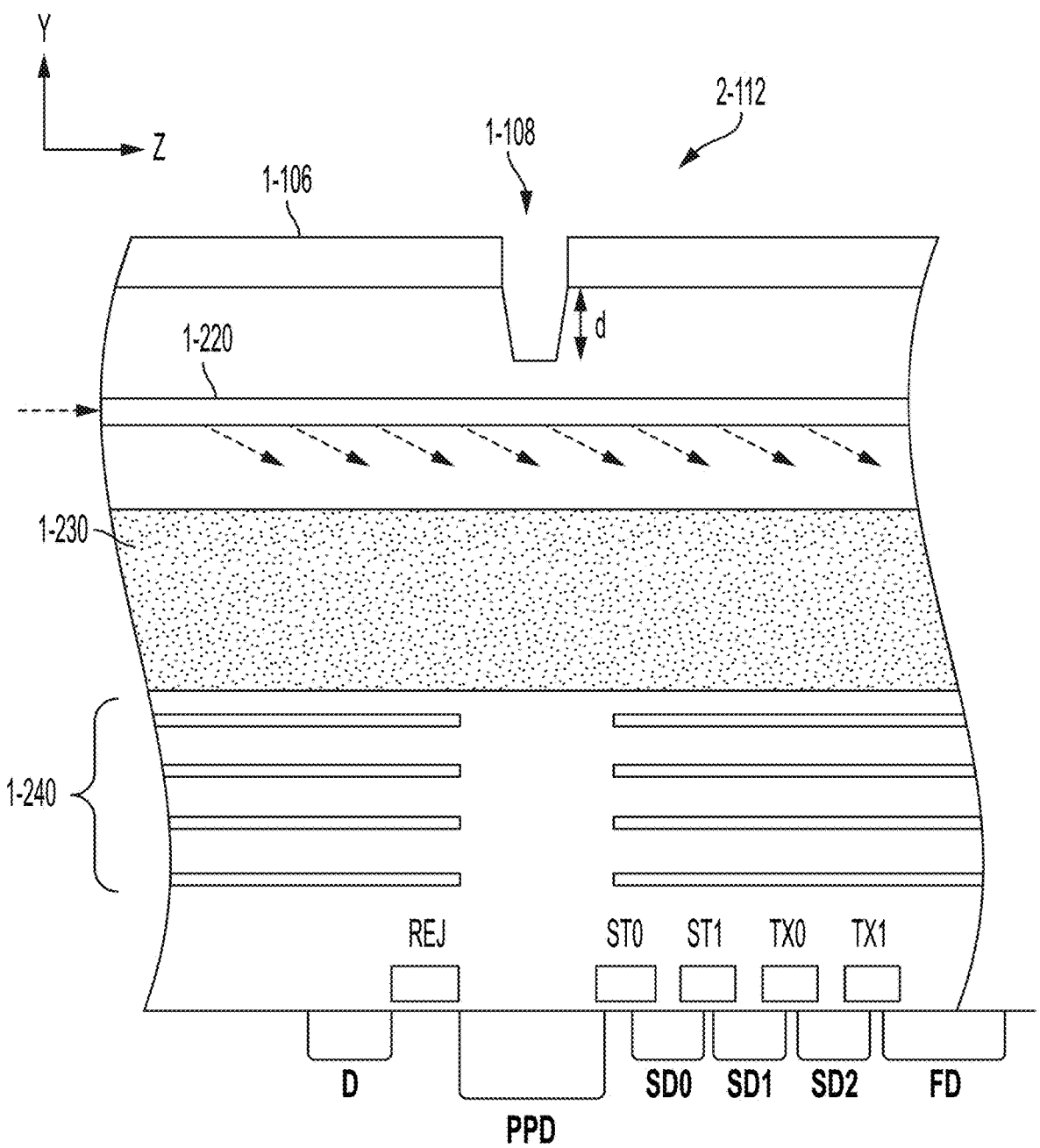
Figure 2:
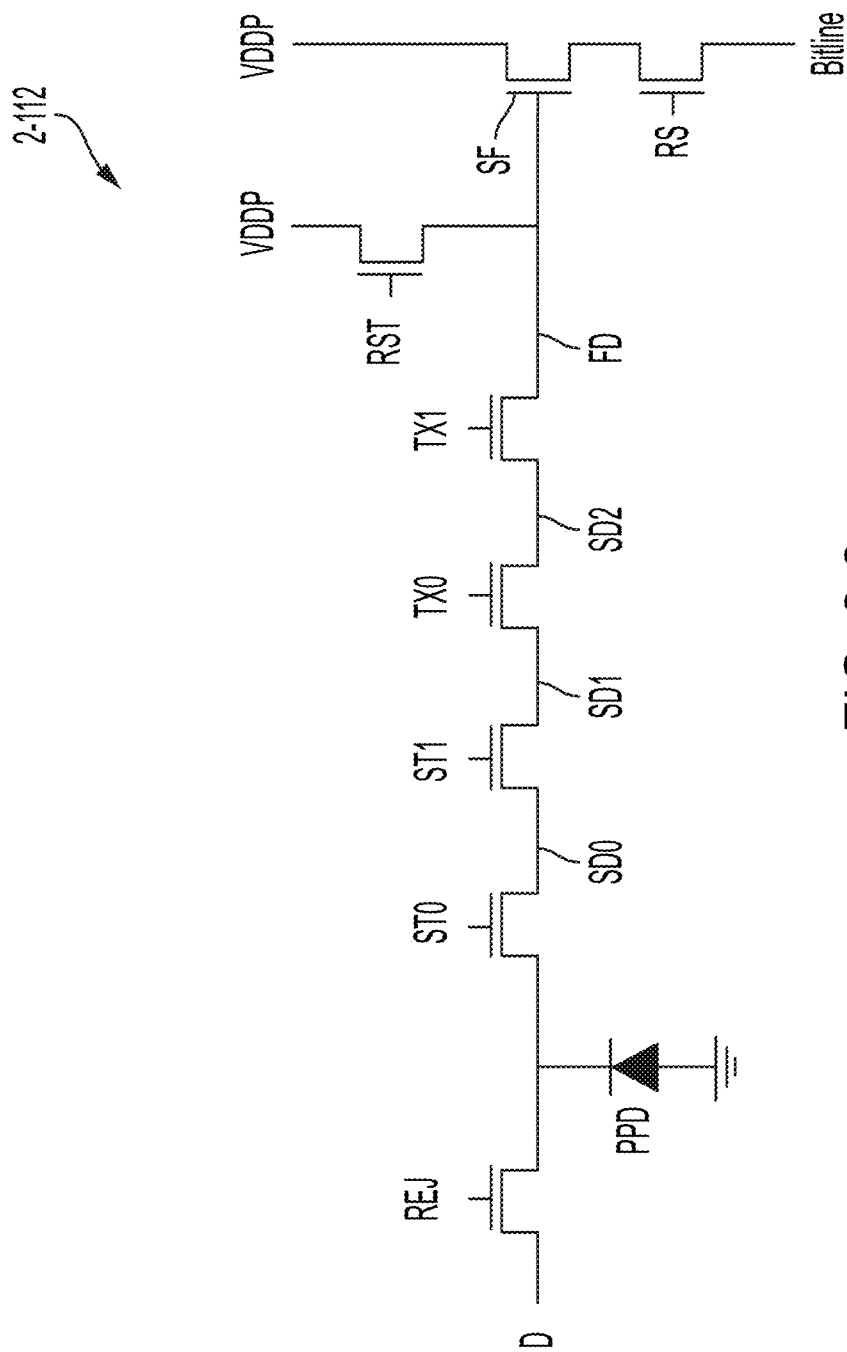
Figures 2, 3:
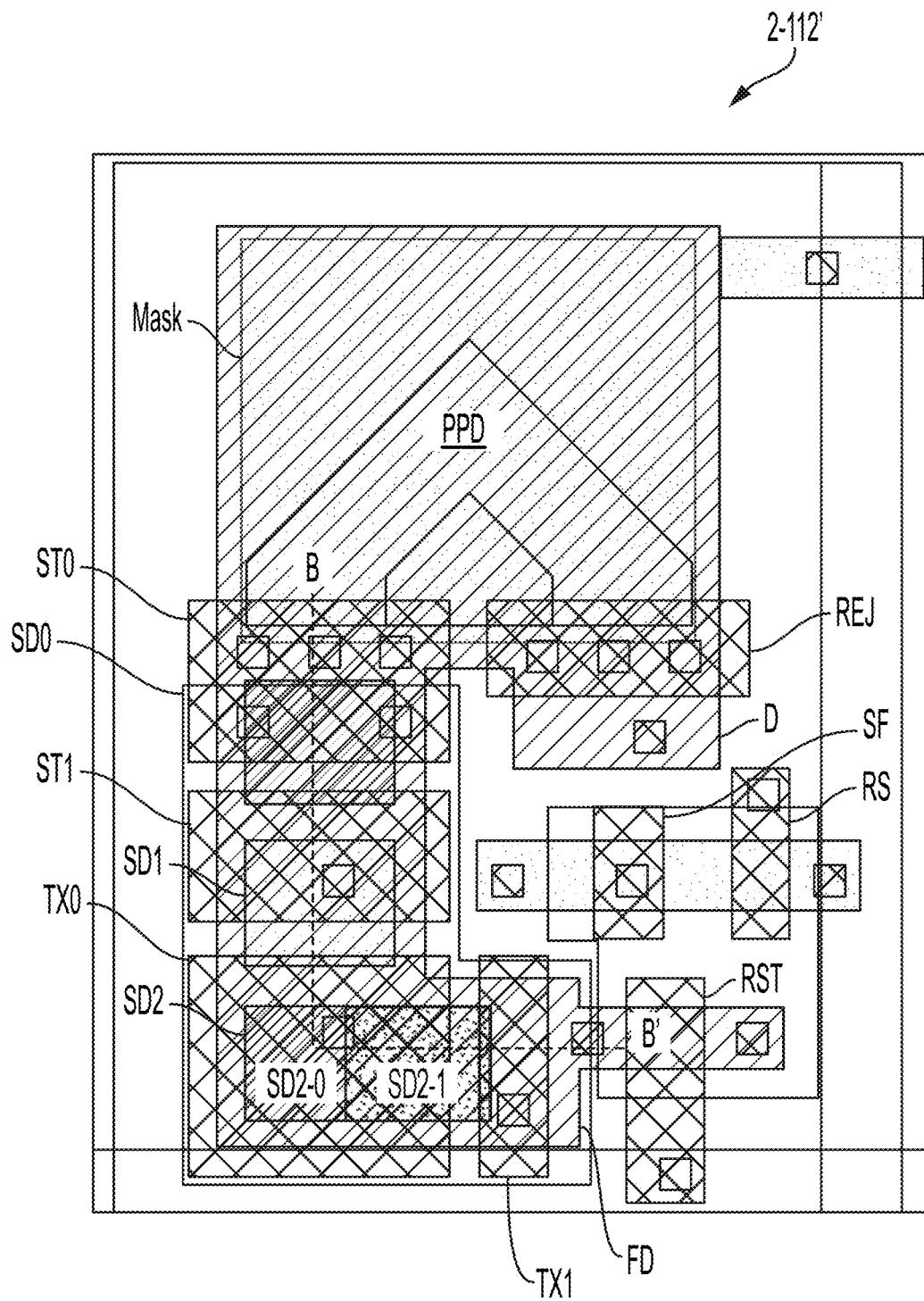
Figures 2, 3, 4:
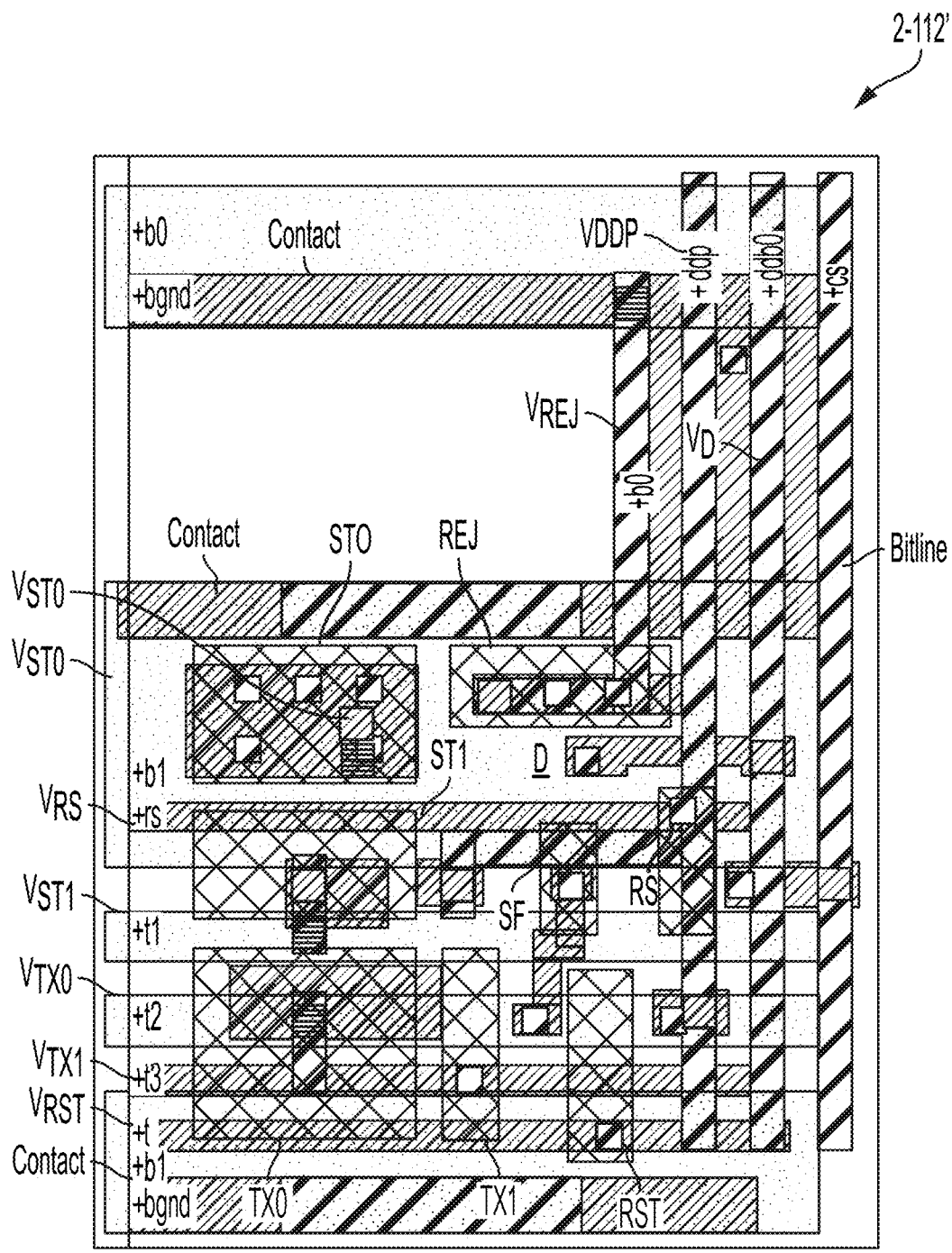
Figures 2, 3, 4, 5:
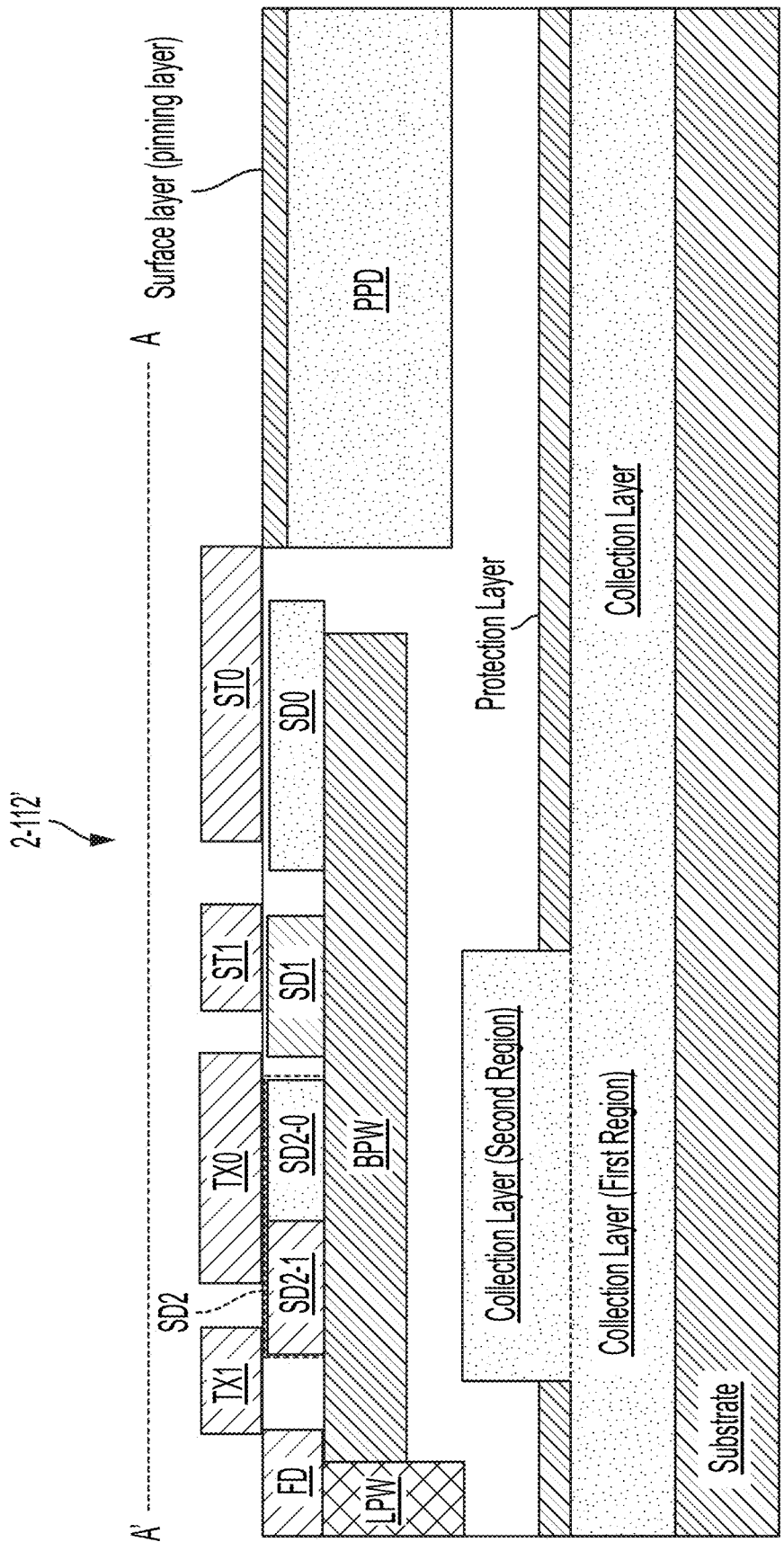
Figures 2, 3, 4, 5, 6:
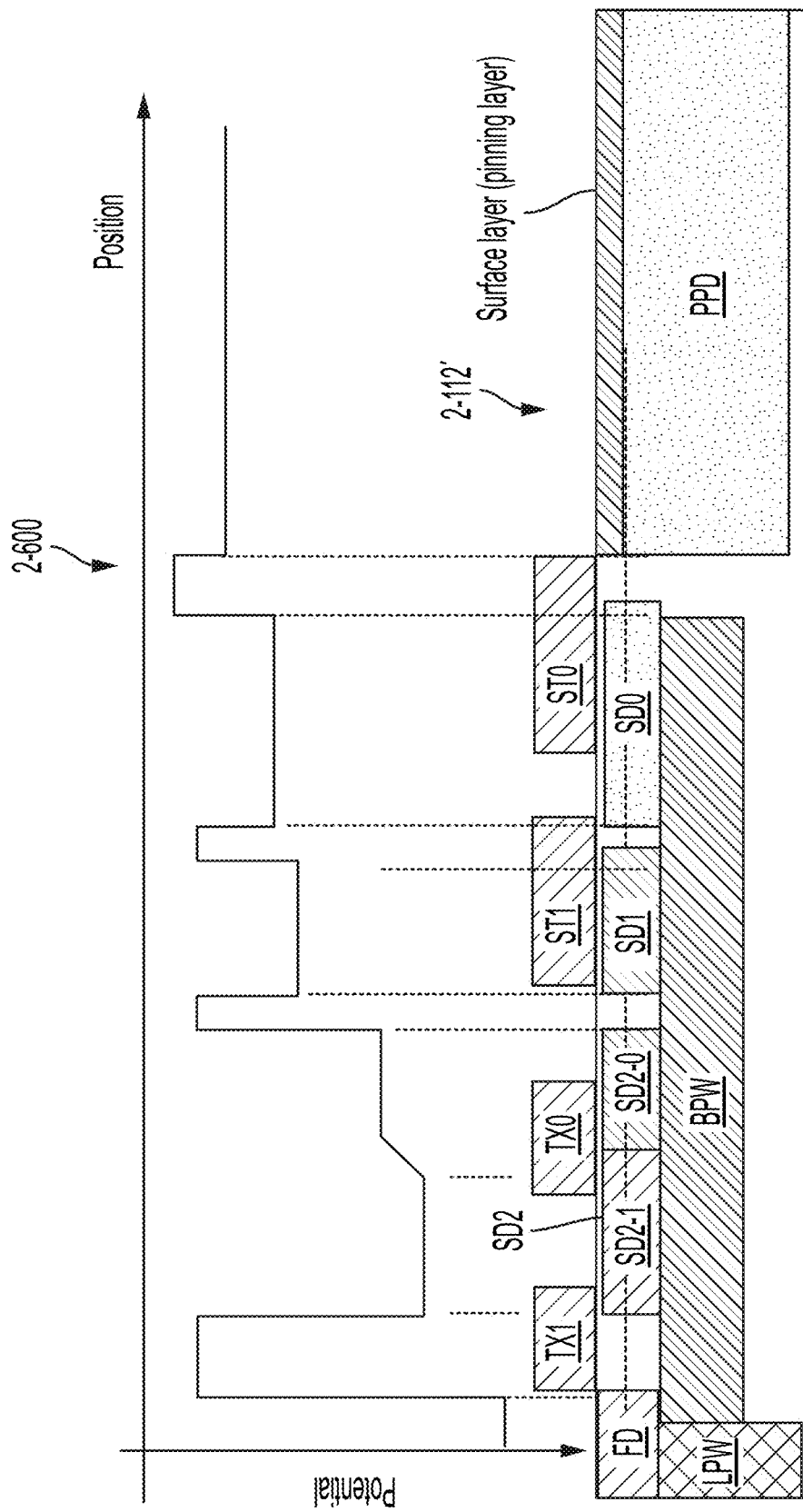
Figures 2, 3, 4, 5, 6, 7:
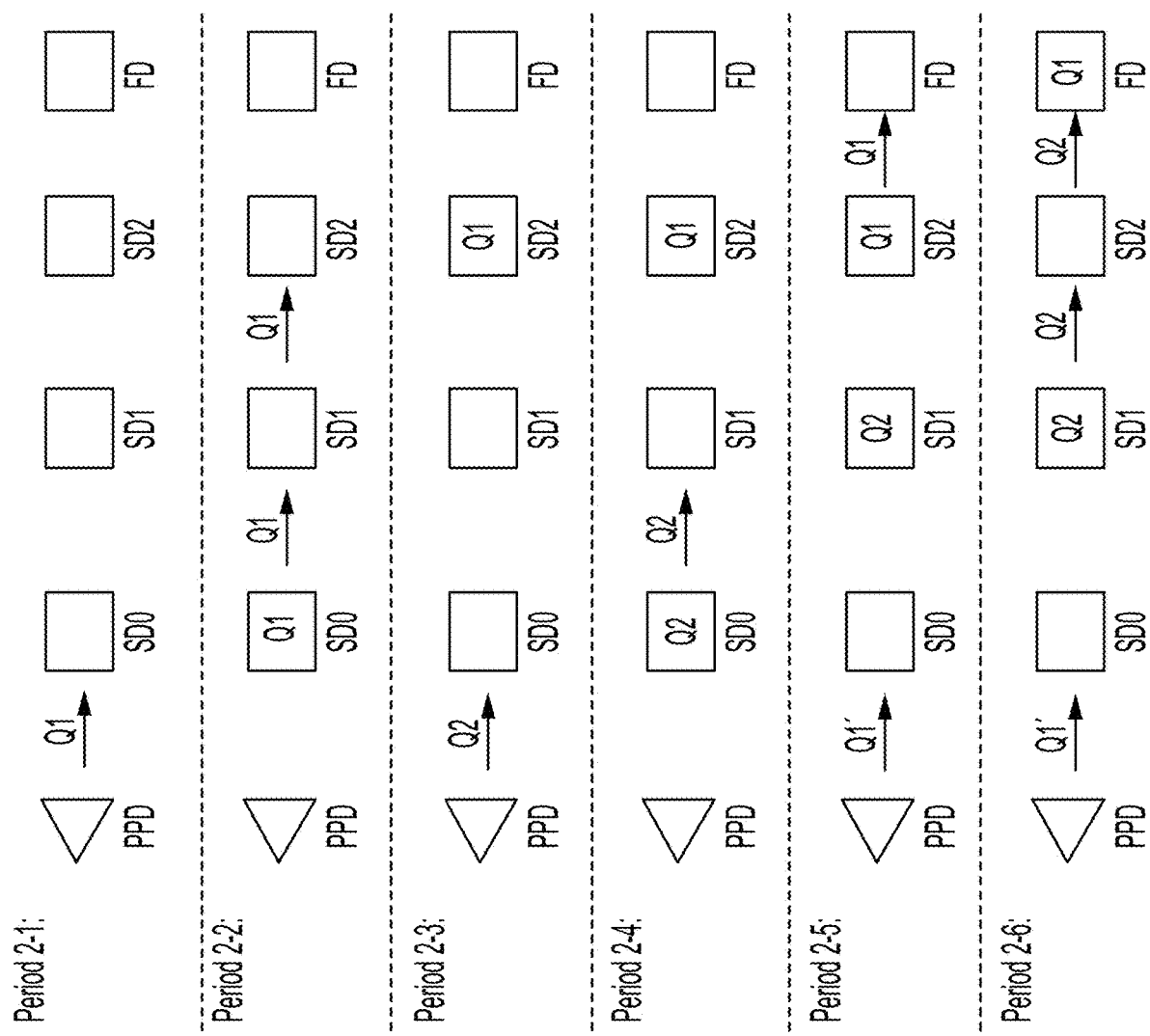
Figures 2, 3, 4, 5, 6, 7, 8, 8A:
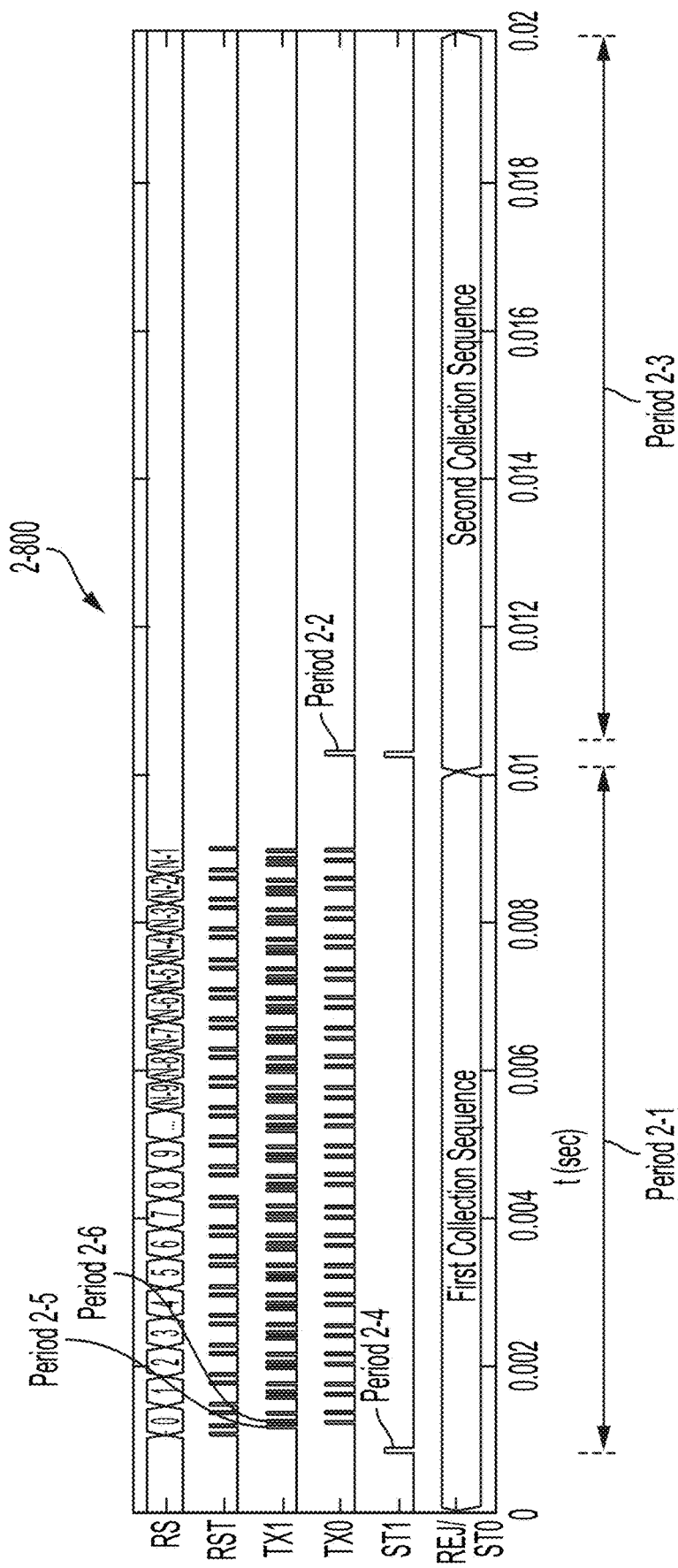
Figures 2, 3, 4, 5, 6, 7, 8, 8B:
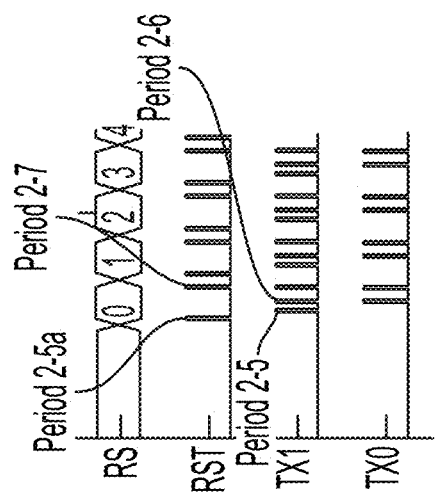
Figures 2, 3, 4, 5, 6, 7, 8, 9:
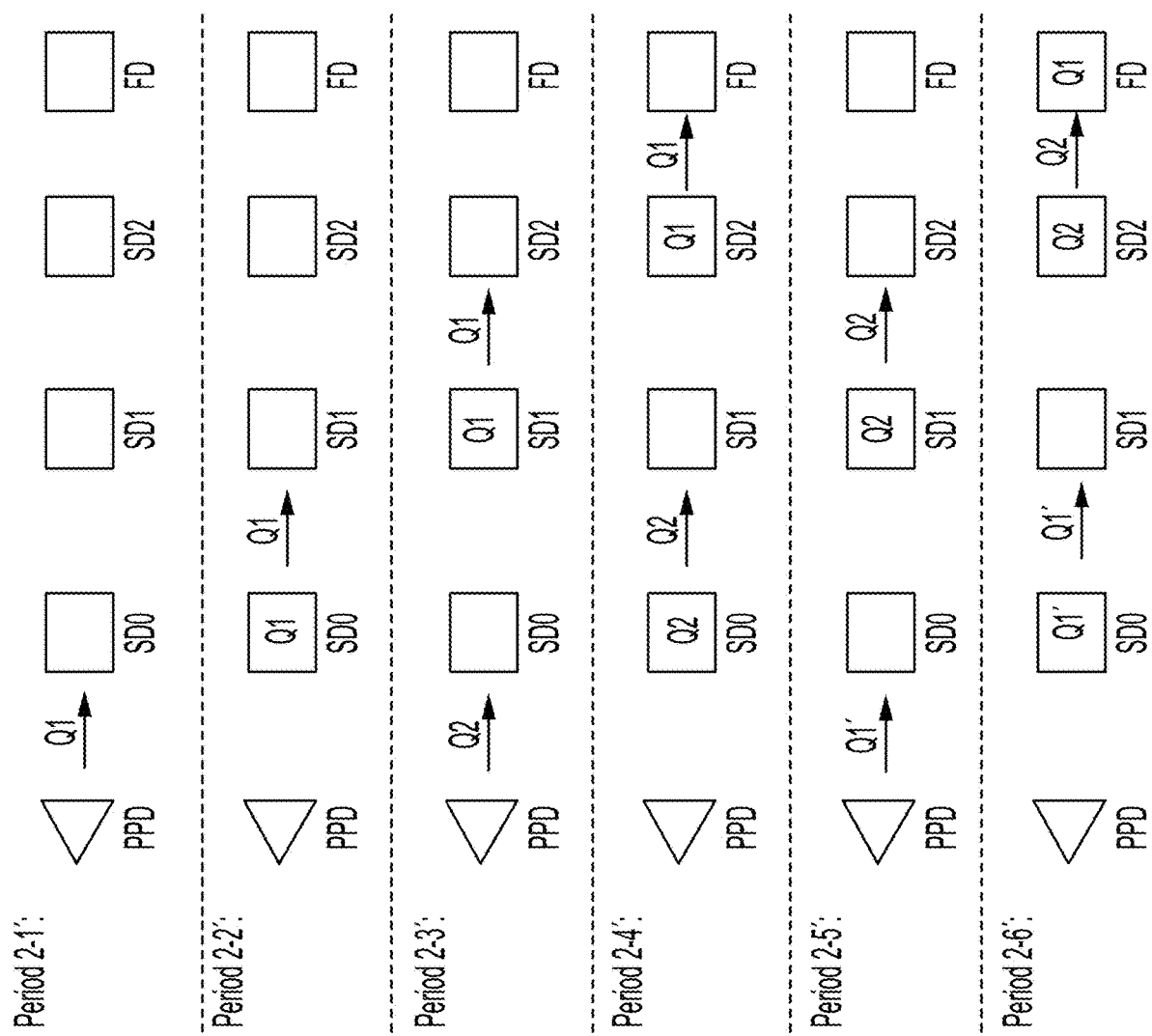
Figures 1, 3:
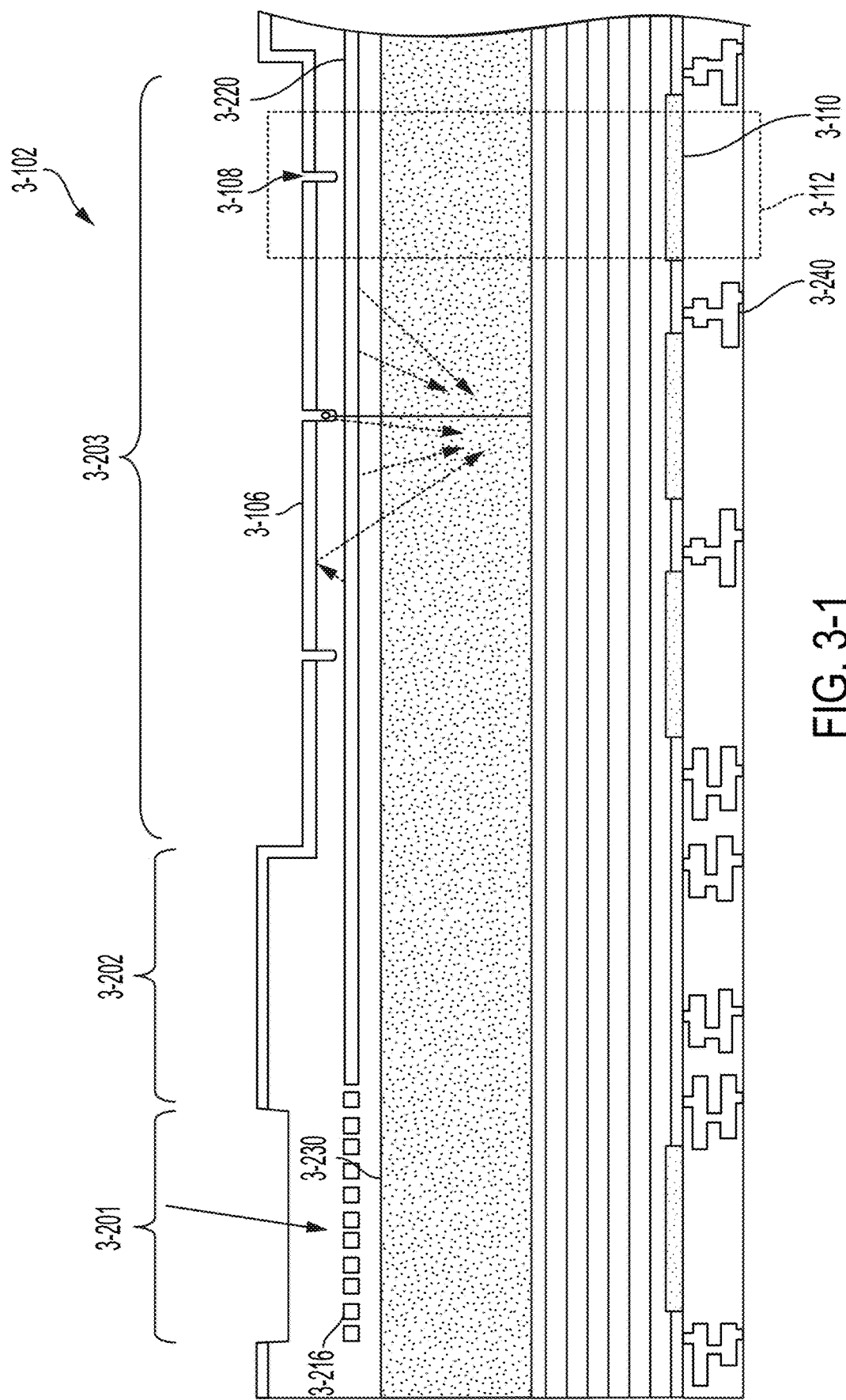
Figures 2, 3:
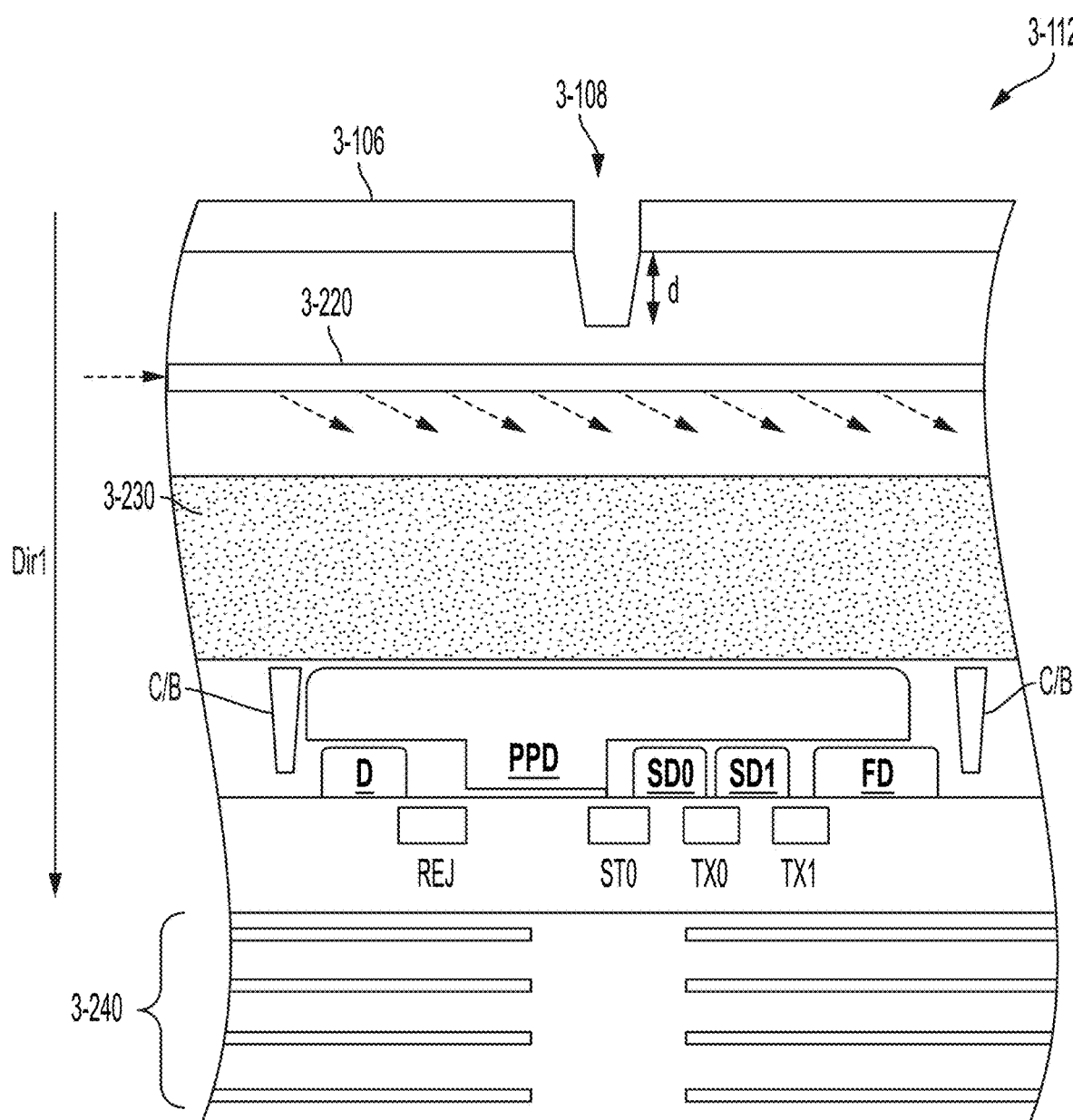
Figures 3, 3A:
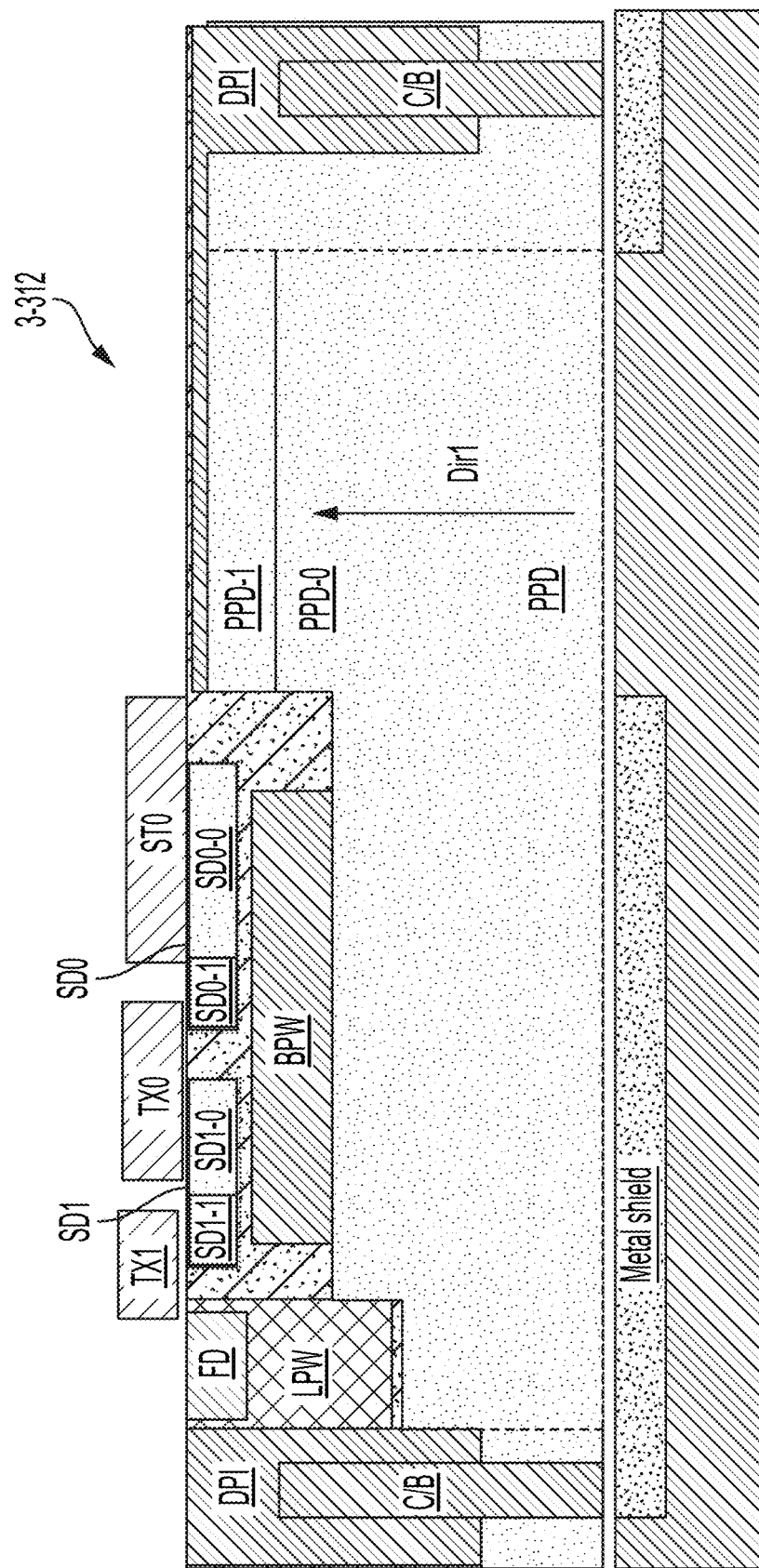
Figures 3, 3B:
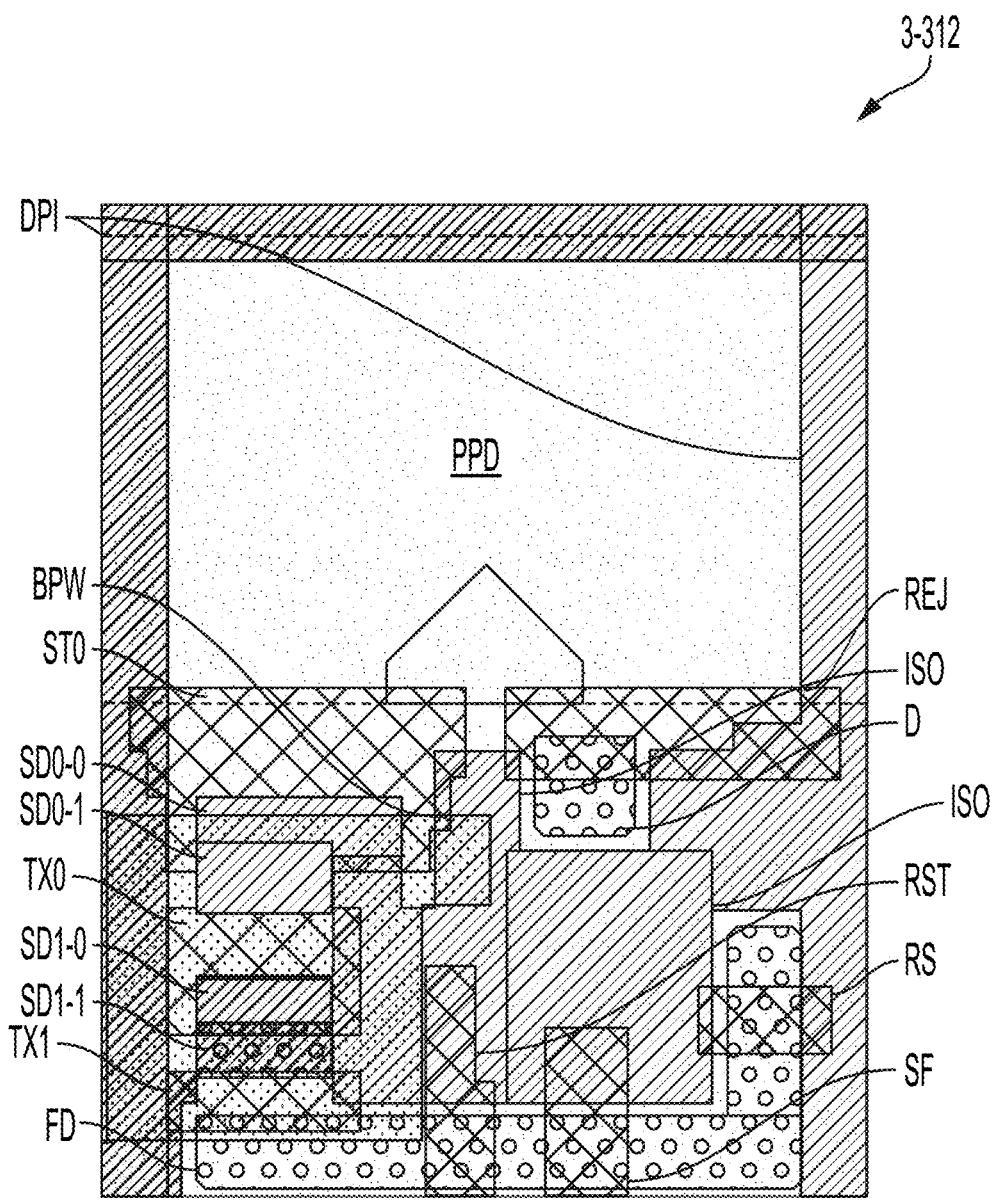
Figures 3, 4:
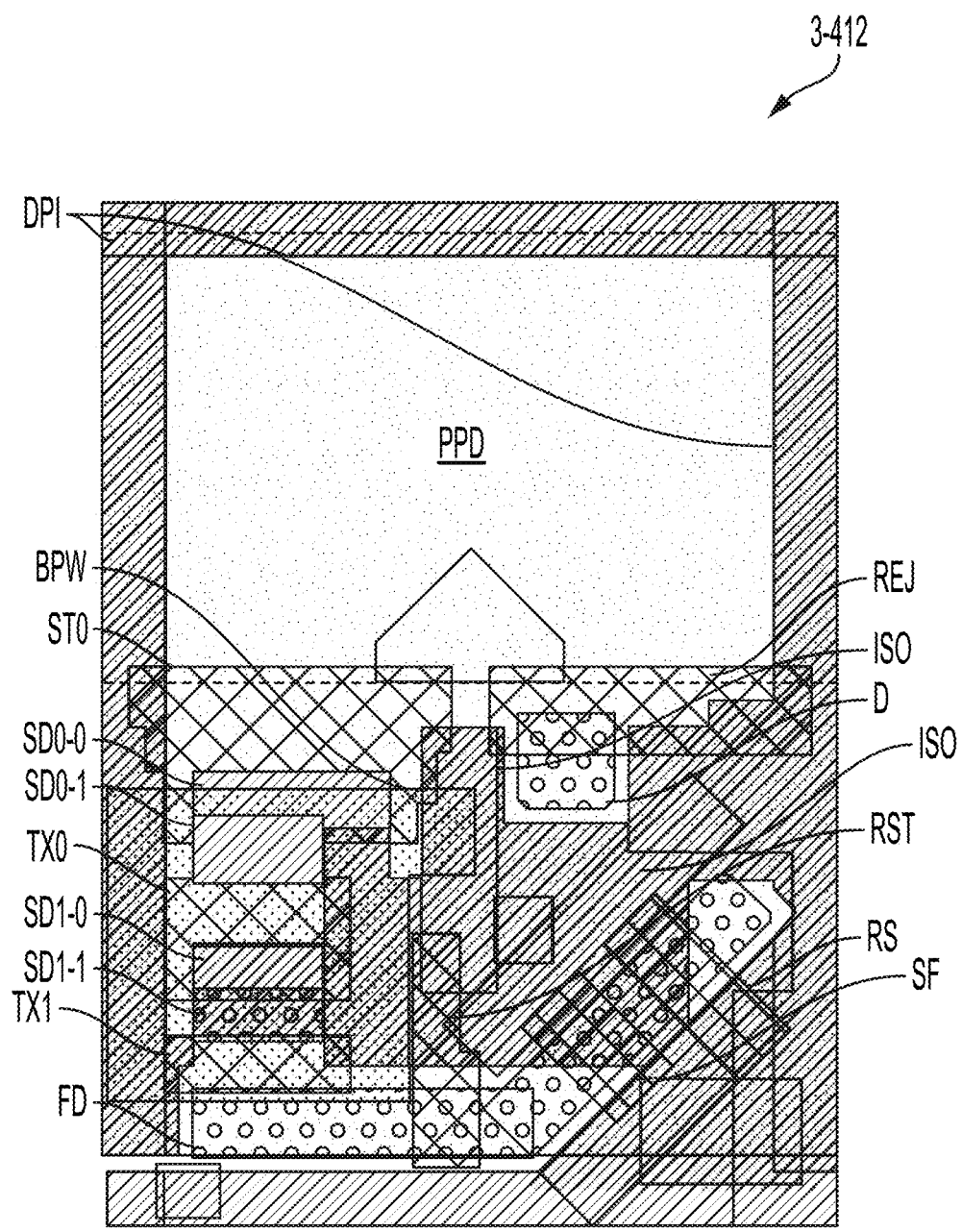
Figures 3, 4, 5, 5A:
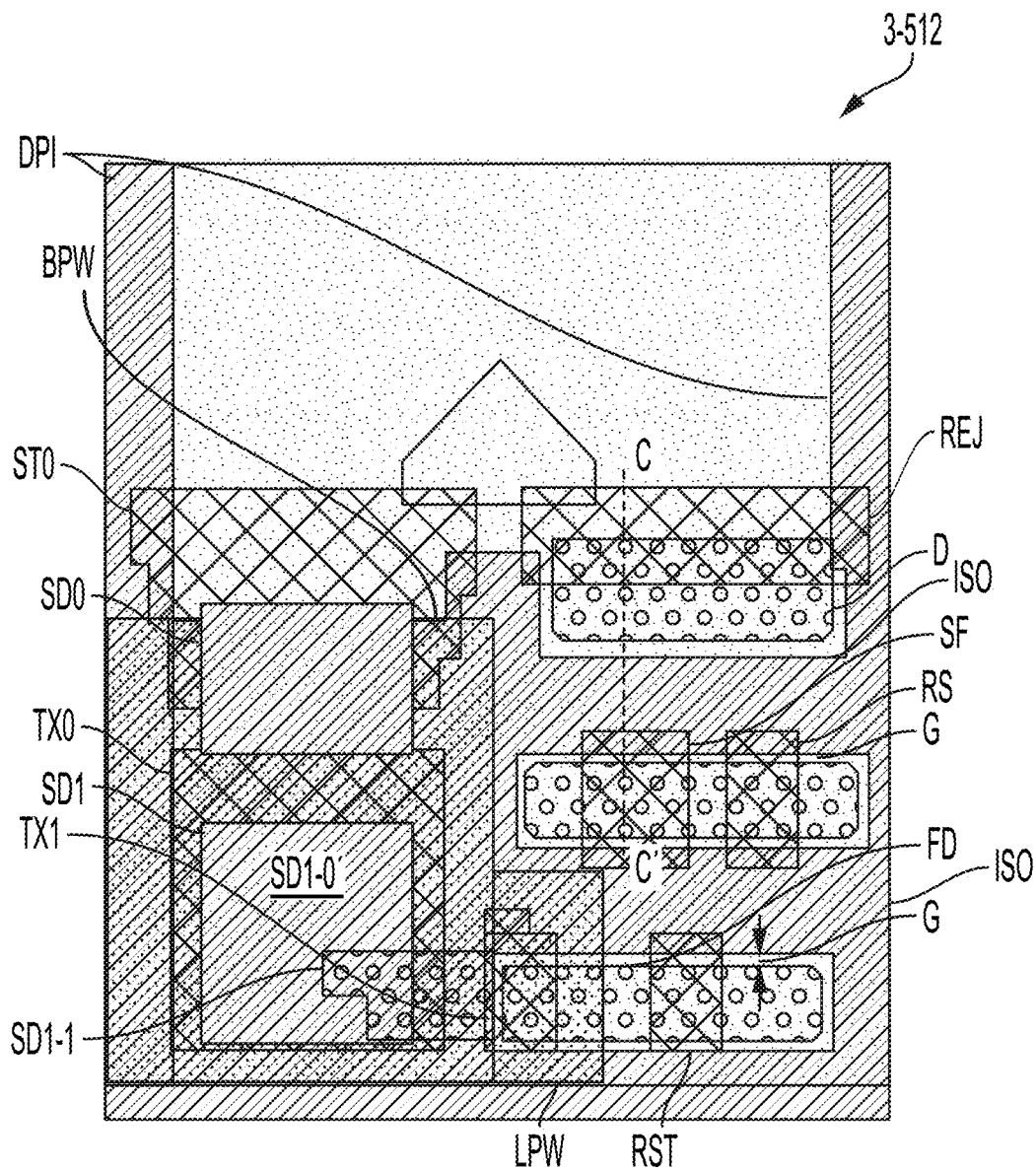
Figures 3, 4, 5, 5B:
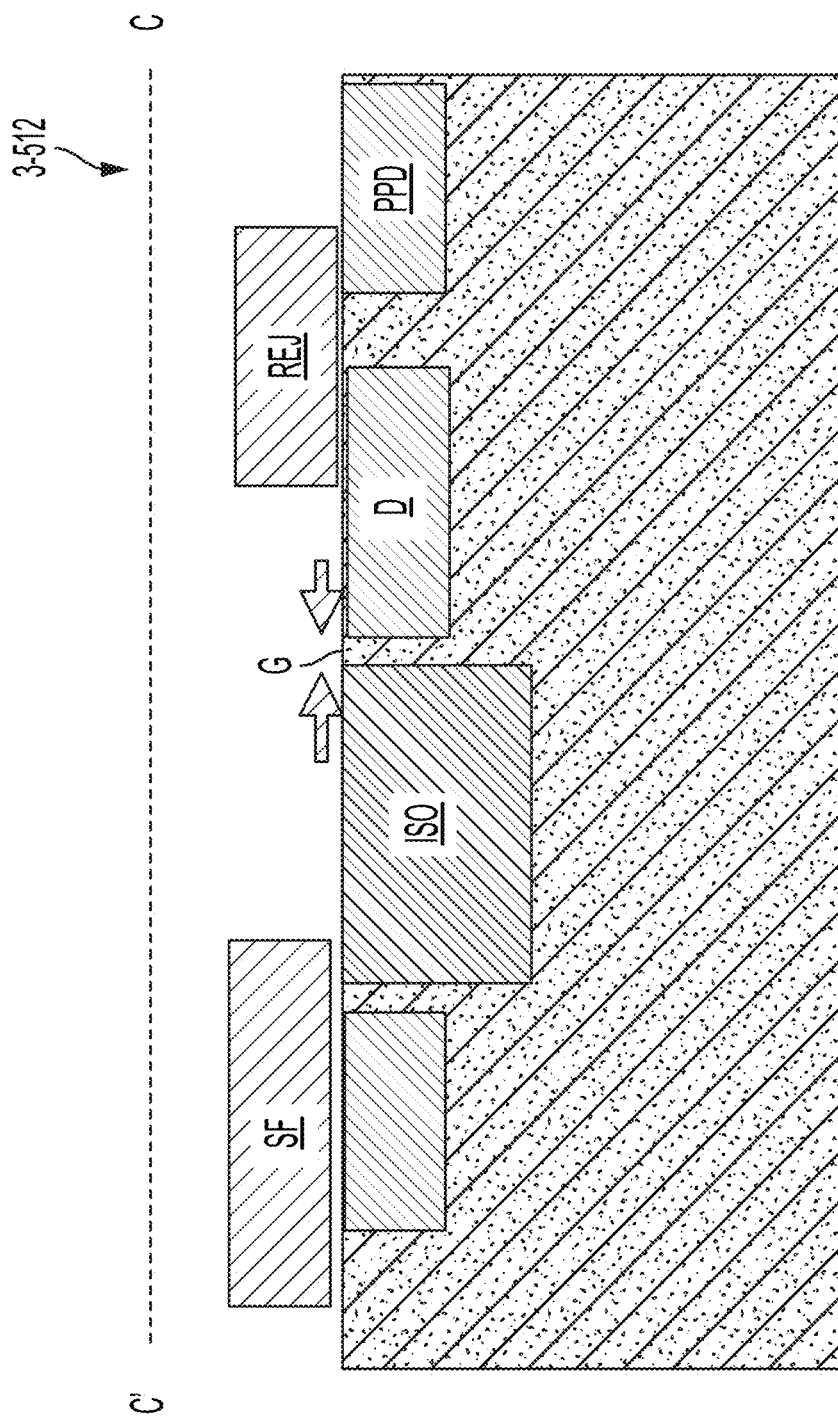
Figures 3, 4, 5, 6:
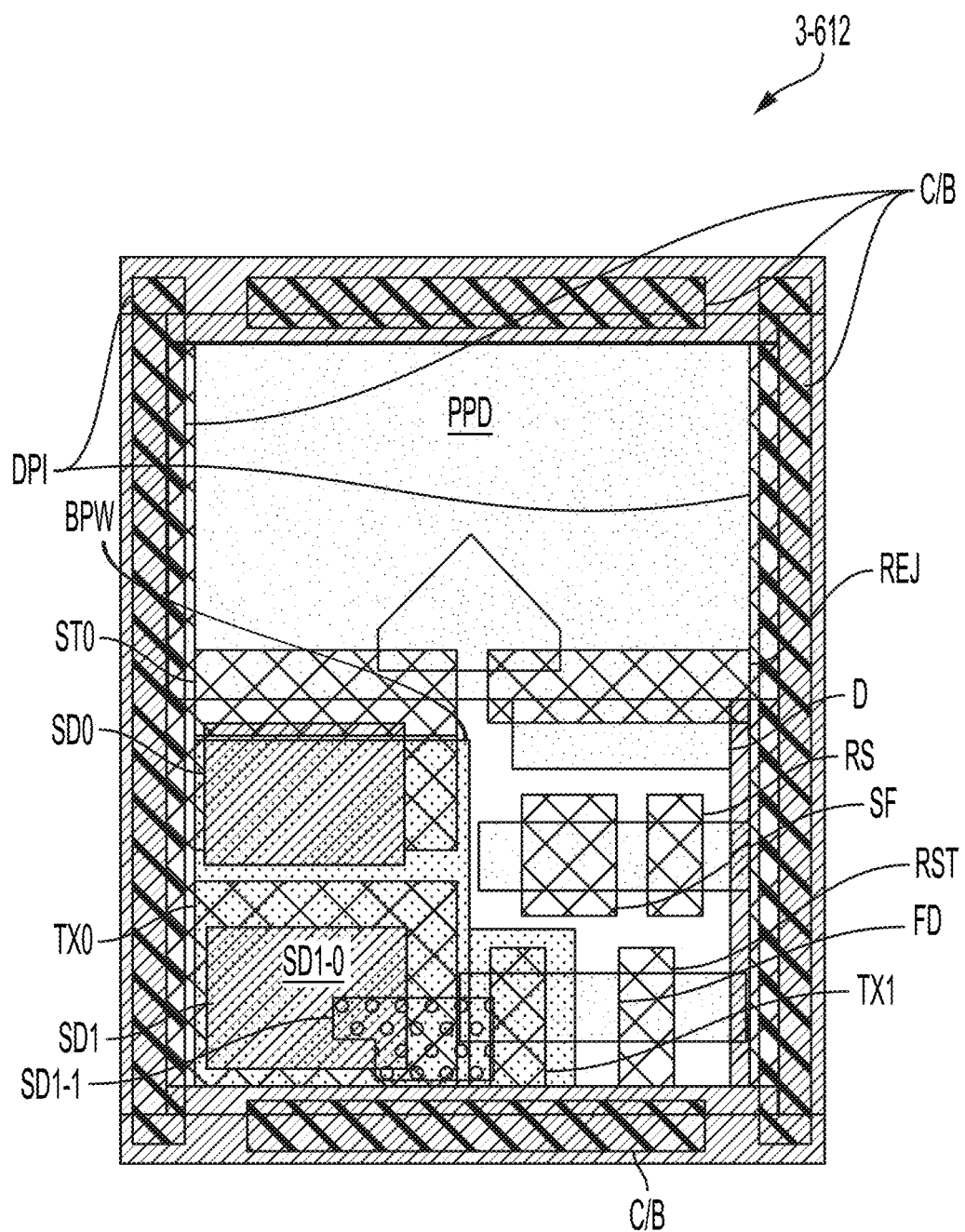
Figures 3, 4, 5, 6, 7:
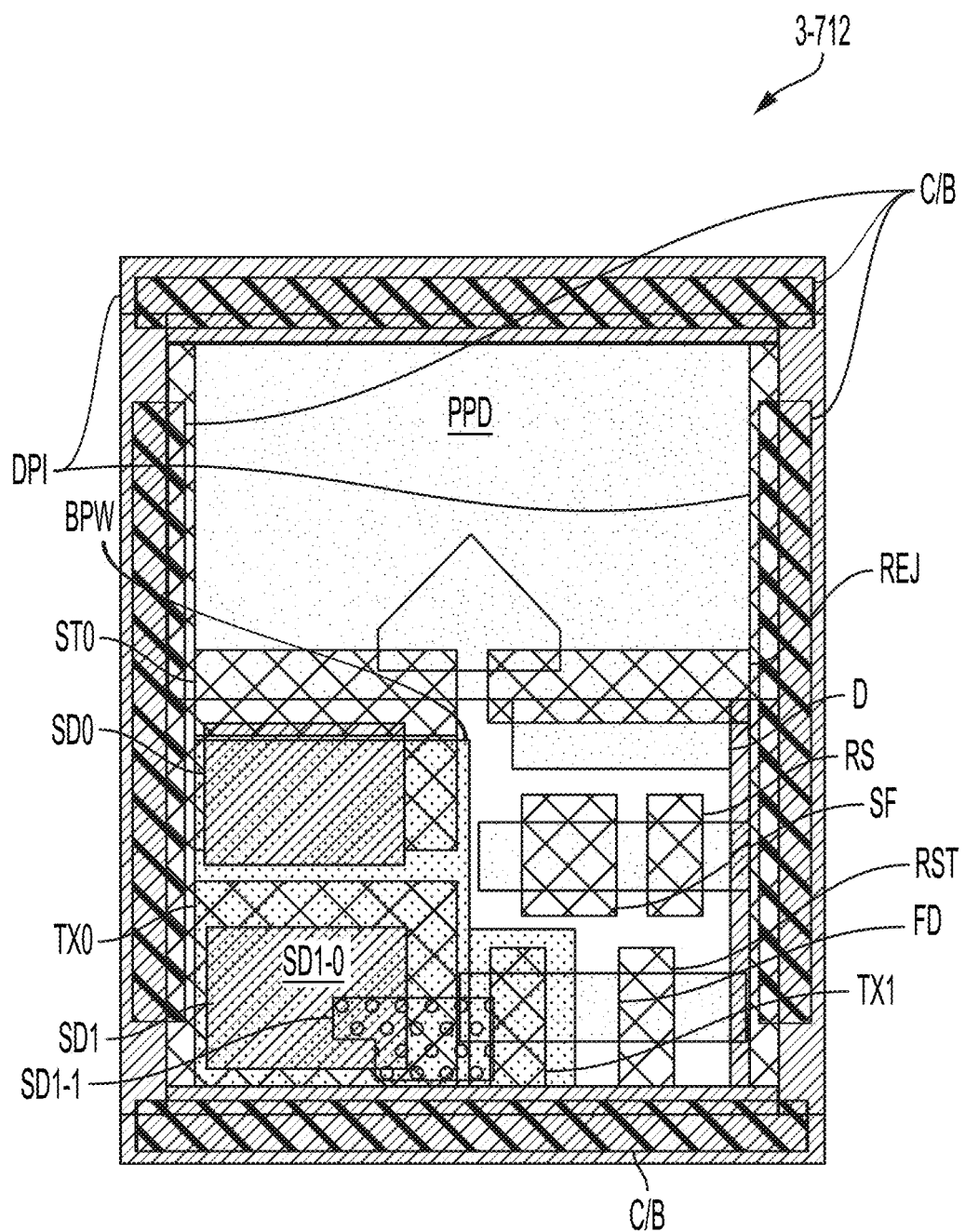
Figures 3, 4, 5, 6, 7, 8:
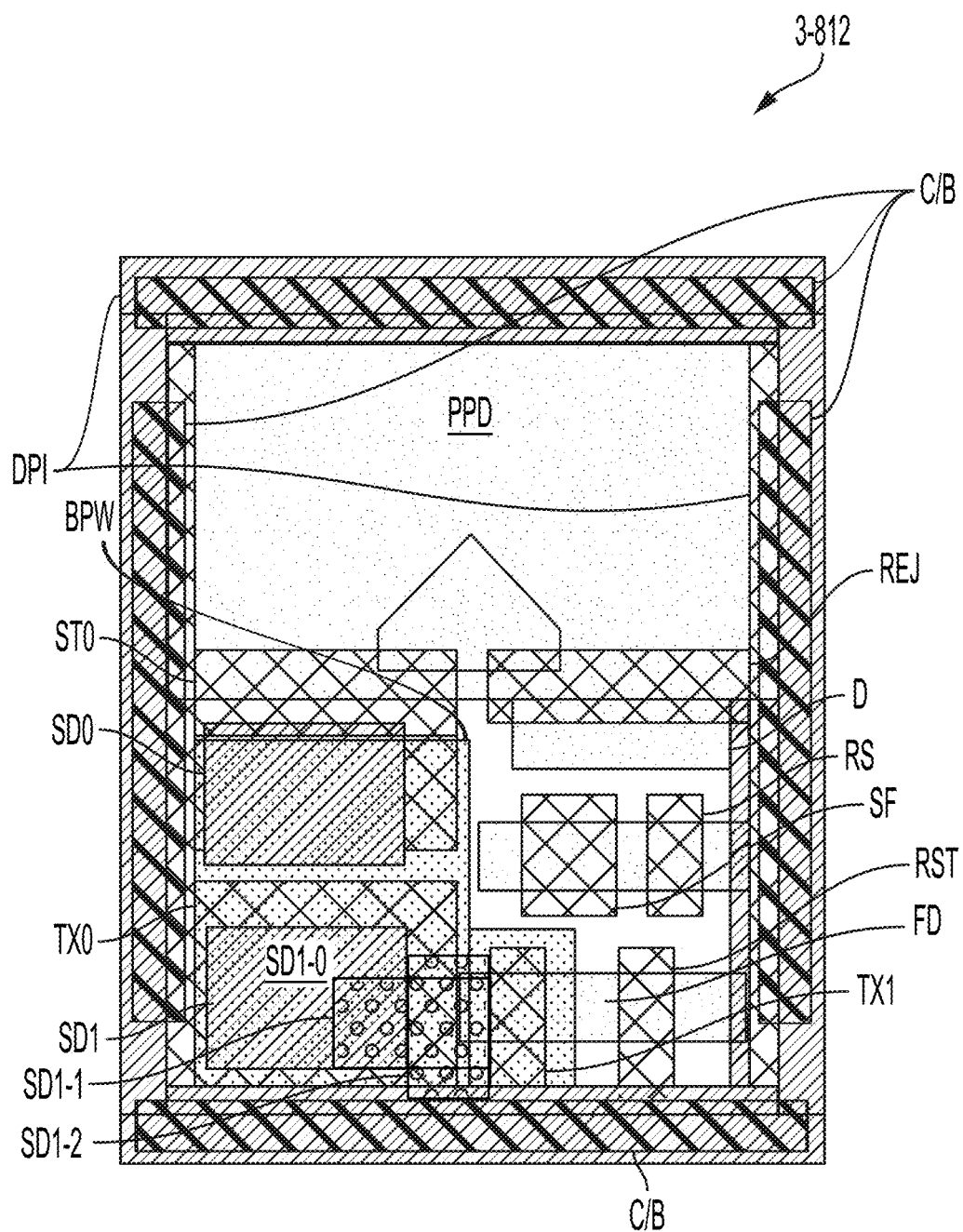

When a labeled nucleotide or nucleotide analog 5-610 is incorporated into a growing strand of complementary nucleic acid, as depicted in FIG. 4-6, one or more attached fluorophores 5-630 can be repeatedly excited by pulses of optical energy coupled into the reaction chamber 5-330 from the waveguide 5-315. In some embodiments, the fluorophore or fluorophores 5-630 can be attached to one or more nucleotides or nucleotide analogs 5-610 with any suitable linker 5-620. An incorporation event may last for a period of time up to about 100 ms. During this time, pulses of fluorescent emission resulting from excitation of the fluorophore(s) by pulses from the mode-locked laser can be detected with a time-binning photodetector 5-322, for example. In some embodiments, there can be one or more additional integrated electronic devices 5-323 at each pixel for signal handling (e.g., amplification, read-out, routing, signal preprocessing, etc.). According to some embodiments, each pixel can include at least one optical filter 5-530 (e.g., a semiconductor absorber) that passes fluorescent emission and reduces transmission of radiation from the excitation pulse. Some implementations may not use the optical filter 5-530. By attaching fluorophores with different emission characteristics (e.g., fluorescent decay rates, intensity, fluorescent wavelength) to the different nucleotides (A,C,G,T), detecting and distinguishing the different emission characteristics while the strand of DNA 5-512 incorporates a nucleic acid and enables determination of the genetic sequence of the growing strand of DNA.

According to some embodiments, an advanced analytic instrument 5-100 that is configured to analyze samples based on fluorescent emission characteristics can detect differences in fluorescent lifetimes and/or intensities between different fluorescent molecules, and/or differences between lifetimes and/or intensities of the same fluorescent molecules in different environments. By way of explanation, FIG. 4-7 plots two different fluorescent emission probability curves (A and B), which can be representative of fluorescent emission from two different fluorescent molecules, for example. With reference to curve A (dashed line), after being excited by a short or ultrashort optical pulse, a probability $p_A(t)$ of a fluorescent emission from a first molecule may decay with time, as depicted. In some cases, the decrease in the probability of a photon being emitted over time can be represented by an exponential decay function $p_A(t)=p_{A0}*e^{-t/\tau_1}$, where $p_{A0}$ is an initial emission probability and $\tau_1$ is a temporal parameter associated with the first fluorescent molecule that characterizes the emission decay probability. $\tau_1$ may be referred to as the "fluorescence lifetime," "emission lifetime," or "lifetime" of the first fluorescent molecule. In some cases, the value of Ti can be altered by a local environment of the fluorescent molecule. Other fluorescent molecules can have different emission characteristics than that shown in curve A. For example, another fluorescent molecule can have a decay profile that differs from a single exponential decay, and its lifetime can be characterized by a half-life value or some other metric.

A second fluorescent molecule may have a decay profile $p_B(t)$ that is exponential, but has a measurably different lifetime $\tau_2$, as depicted for curve B in FIG. 4-7. In the example shown, the lifetime for the second fluorescent molecule of curve B is shorter than the lifetime for curve A, and the probability of emission $p_B(t)$ is higher sooner after excitation of the second molecule than for curve A. As shown in FIG. 4-7, $p_B(t)$ can have an initial emission probability of $p_{B0}$. Different fluorescent molecules can have lifetimes or half-life values ranging from about 0.1 ns to about 20 ns, in some embodiments.

Differences in fluorescent emission lifetimes can be used to discern between the presence or absence of different fluorescent molecules and/or to discern between different environments or conditions to which a fluorescent molecule is subjected. In some cases, discerning fluorescent molecules based on lifetime (rather than emission wavelength, for example) can simplify aspects of an analytical instrument 5-100. As an example, wavelength-discriminating optics (such as wavelength filters, dedicated detectors for each wavelength, dedicated pulsed optical sources at different wavelengths, and/or diffractive optics) can be reduced in number or eliminated when discerning fluorescent molecules based on lifetime. In some cases, a single pulsed optical source operating at a single characteristic wavelength can be used to excite different fluorescent molecules that emit within a same wavelength region of the optical spectrum but have measurably different lifetimes. An analytic system that uses a single pulsed optical source, rather than multiple sources operating at different wavelengths, to excite and discern different fluorescent molecules emitting in a same wavelength region can be less complex to operate and maintain, more compact, and can be manufactured at lower cost.

Although analytic systems based on fluorescent lifetime analysis can have certain benefits, the amount of information obtained by an analytic system and/or detection accuracy can be increased by allowing for additional detection techniques. For example, some analytic systems 5-160 can additionally be configured to discern one or more properties of a sample based on fluorescent wavelength and/or fluorescent intensity.

Referring again to FIG. 4-7, according to some embodiments, different fluorescent lifetimes can be distinguished with a photodetector that is configured to time-bin fluorescent emission events following excitation of a fluorescent molecule. The time binning can occur during a single charge-accumulation cycle for the photodetector. A charge-accumulation cycle is an interval between read-out events during which photo-generated carriers are accumulated in bins of the time-binning photodetector. The concept of determining fluorescent lifetime by time-binning of emission events is introduced graphically in FIG. 4-8. At time $t_e$ just prior to $t_1$, a fluorescent molecule or ensemble of fluorescent molecules of a same type (e.g., the type corresponding to curve B of FIG. 4-7) is (are) excited by a short or ultrashort optical pulse. For a large ensemble of molecules, the intensity of emission can have a time profile similar to curve B, as depicted in FIG. 4-8.

For a single molecule or a small number of molecules, however, the emission of fluorescent photons occurs according to the statistics of curve B in FIG. 4-7, for this example. A time-binning photodetector 5-322 can accumulate carriers generated from emission events into discrete time bins. Three bins are indicated in FIG. 4-8, though fewer bins or more bins may be used in embodiments. The bins are temporally resolved with respect to the excitation time $t_e$ of the fluorescent molecule(s). For example, a first bin can accumulate carriers produced during an interval between times $t_1$ and $t_2$, occurring after the excitation event at time te. A second bin can accumulate carriers produced during an interval between times $t_2$ and $t_3$, and a third bin can accumulate carriers produced during an interval between times $t_3$ and $t_4$. When a large number of emission events are summed, carriers accumulated in the time bins can approximate the decaying intensity curve shown in FIG. 4-8, and the binned signals can be used to distinguish between different fluorescent molecules or different environments in which a fluorescent molecule is located.

Examples of a time-binning photodetector 5-322 are described in U.S. patent application Ser. No. 14/821,656, filed Aug. 7, 2015, titled "Integrated Device for Temporal Binning of Received Photons" and in U.S. patent application Ser. No. 15/852,571, filed Dec. 22, 2017, titled "Integrated Photodetector with Direct Binning Pixel," which are both incorporated herein by reference in their entirety. For explanation purposes, a non-limiting embodiment of a time-binning photodetector is depicted in FIG. 4-9. A single time-binning photodetector 5-322 can comprise a photon-absorption/carrier-generation region 5-902, a carrier-discharge channel 5-906, and a plurality of carrier-storage regions 5-908a, 5-908b all formed on a semiconductor substrate. Carrier-transport channels 5-907 can connect between the photon-absorption/carrier-generation region 5-902 and carrier-storage regions 5-908a, 5-908b. In the illustrated example, two carrier-storage regions are shown, but there may be more or fewer. There can be a read-out channel 5-910 connected to the carrier-storage regions. The photon-absorption/carrier-generation region 5-902, carrier-discharge channel 5-906, carrier-storage regions 5-908a, 5-908b, and read-out channel 5-910 can be formed by doping the semiconductor locally and/or forming adjacent insulating regions to provide photodetection capability, confinement, and transport of carriers. A time-binning photodetector 5-322 can also include a plurality of electrodes 5-920, 5-921, 5-922, 5-923, 5-924 formed on the substrate that are configured to generate electric fields in the device for transporting carriers through the device.

In operation, a portion of an excitation pulse 5-122 from a pulsed optical source 5-106 (e.g., a mode-locked laser) is delivered to a reaction chamber 5-330 over the time-binning photodetector 5-322. Initially, some excitation radiation photons 5-901 may arrive at the photon-absorption/carrier-generation region 5-902 and produce carriers (shown as light-shaded circles). There can also be some fluorescent emission photons 5-903 that arrive with the excitation radiation photons 5-901 and produce corresponding carriers (shown as dark-shaded circles). Initially, the number of carriers produced by the excitation radiation can be too large compared to the number of carriers produced by the fluorescent emission. The initial carriers produced during a time interval $t_e$-$t_1$ can be rejected by gating them into a carrier-discharge channel 5-906 with a first transfer gate 5-920, for example.

At a later times mostly fluorescent emission photons 5-903 arrive at the photon-absorption/carrier-generation region 5-902 and produce carriers (indicated a dark-shaded circles) that provide useful and detectable signal that is representative of fluorescent emission from the reaction chamber 5-330. According to some detection methods, a second electrode 5-921 and third electrode 5-923 can be gated at a later time to direct carriers produced at a later time (e.g., during a second time interval $t_1$-$t_2$) to a first carrier-storage region 5-908a. Subsequently, a fourth electrode 5-922 and fifth electrode 5-924 can be gated at a later time (e.g., during a third time interval $t_2$-$t_3$) to direct carriers to a second carrier-storage region 5-908b. Charge accumulation can continue in this manner after excitation pulses for a large number of excitation pulses to accumulate an appreciable number of carriers and signal level in each carrier-storage region 5-908a, 5-908b. At a later time, the signal can be read out from the bins. In some implementations, the time intervals corresponding to each storage region are at the sub-nanosecond time scale, though longer time scales can be used in some embodiments (e.g., in embodiments where fluorophores have longer decay times).

The process of generating and time-binning carriers after an excitation event (e.g., excitation pulse from a pulsed optical source) can occur once after a single excitation pulse or be repeated multiple times after multiple excitation pulses during a single charge-accumulation cycle for the time-binning photodetector 5-322. After charge accumulation is complete, carriers can be read out of the storage regions via the read-out channel 5-910. For example, an appropriate biasing sequence can be applied to electrodes 5-923, 5-924 and at least to electrode 5-940 to remove carriers from the storage regions 5-908a, 5-908b. The charge accumulation and read-out processes can occur in a massively parallel operation on the optoelectronic chip 5-140 resulting in frames of data.

Although the described example in connection with FIG. 4-9 includes multiple charge storage regions 5-908a, 5-908b, in some cases a single charge storage region may be used instead. For example, only bin1 may be present in a time-binning photodetector 5-322. In such a case, a single storage regions 5-908a can be operated in a variable time-gated manner to look at different time intervals after different excitation events. For example, after pulses in a first series of excitation pulses, electrodes for the storage region 5-908a can be gated to collect carriers generated during a first time interval (e.g., during the second time interval $t_1$-$t_2$), and the accumulated signal can be read out after a first predetermined number of pulses. After pulses in a subsequent series of excitation pulses at the same reaction chamber, the same electrodes for the storage region 5-908a can be gated to collect carriers generated during a different interval (e.g., during the third time interval $t_2$-$t_3$), and the accumulated signal can be read out after a second predetermined number of pulses. Carriers could be collected during later time intervals in a similar manner if needed. In this manner, signal levels corresponding to fluorescent emission during different time periods after arrival of an excitation pulse at a reaction chamber can be produced using a single carrier-storage region.

In some embodiments, carriers produced during the second and third time intervals may be collected and stored using sequentially-coupled charge-carrier storage regions (e.g., SD0 and SD1 and/or SD0, SD1, and SD2) according to techniques described above. For example, charge carriers produced during the time interval $t_1$-$t_2$ may be collected in charge storage region SD0 and transferred to charge storage region SD1, and then charge carriers produced during the time interval $t_2$-$t_3$ may be collected in charge storage region SD0 while the charge carriers collected during time interval $t_1$-$t_2$ are read out to readout region FD, as described herein for pixels 1-112 and 1-112'. Alternatively or additionally, the charge carriers produced during time interval $t_1$-$t_2$ can be further transferred to and read out from charge storage region SD2, and then the charge carriers produced during time interval $t_2$-$t_3$ can be read out from charge storage region SD1 via charge storage region SD2 (e.g., without resetting the voltage of readout region FD in between), as described herein for pixels 2-112 and 2-112'.

Regardless of how charge accumulation is carried out for different time intervals after excitation, signals that are read out can provide a histogram of bins that are representative of the fluorescent emission decay characteristics, for example. An example process is illustrated in FIG. 4-10A and FIG. 4-10B, for which two charge-storage regions are used to acquire fluorescent emission from the reaction chambers. The histogram's bins can indicate a number of photons detected during each time interval after excitation of the fluorophore(s) in a reaction chamber 5-330. In some embodiments, signals for the bins will be accumulated following a large number of excitation pulses, as depicted in FIG. 4-10A. The excitation pulses can occur at times $t_{e1}$, $t_{e2}$, $t_{e3}$, ... $t_{eN}$ which are separated by the pulse interval time T. In some cases, there can be between 105 and 107 excitation pulses 5-122 (or portions thereof) applied to a reaction chamber during an accumulation of signals in the electron-storage regions for a single event being observed in the reaction chamber (e.g., a single nucleotide incorporation event in DNA analysis). In some embodiments, one bin (bin 0) can be configured to detect an amplitude of excitation energy delivered with each optical pulse, and may be used as a reference signal (e.g., to normalize data). In other cases, the excitation pulse amplitude may be stable, determined one or more times during signal acquisition, and not determined after each excitation pulse so that there is no bin0 signal acquisition after each excitation pulse. In such cases, carriers produced by an excitation pulse can be rejected and dumped from the photon-absorption/carrier-generation region 5-902 as described above in connection with FIG. 4-9.

In some implementations, only a single photon may be emitted from a fluorophore following an excitation event, as depicted in FIG. 4-10A. After a first excitation event at time $t_{e1}$, the emitted photon at time $t_{f1}$ may occur within a first time interval (e.g., between times $t_1$ and $t_2$), so that the resulting electron signal is accumulated in the first electron-storage region (contributes to bin 1). In a subsequent excitation event at time $t_{e2}$, the emitted photon at time $t_{f2}$ may occur within a second time interval (e.g., between times $t_2$ and $t_3$), so that the resulting electron signal contributes to bin 2. After a next excitation event at time $t_{e3}$, a photon may emit at a time $t_{f3}$ occurring within the first time interval.

In some implementations, there may not be a fluorescent photon emitted and/or detected after each excitation pulse received at a reaction chamber 5-330. In some cases, there can be as few as one fluorescent photon that is detected at a reaction chamber for every 10,000 excitation pulses delivered to the reaction chamber. One advantage of implementing a mode-locked laser 5-113 as the pulsed excitation source 5-106 is that a mode-locked laser can produce short optical pulses having high intensity and quick turn-off times at high pulse-repetition rates (e.g., between 50 MHz and 250 MHz). With such high pulse-repetition rates, the number of excitation pulses within a 10 millisecond charge-accumulation interval can be 50,000 to 250,000, so that detectable signal can be accumulated.

After a large number of excitation events and carrier accumulations, the carrier-storage regions of the time-binning photodetector 5-322 can be read out to provide a multi-valued signal (e.g., a histogram of two or more values, an N-dimensional vector, etc.) for a reaction chamber. The signal values for each bin can depend upon the decay rate of the fluorophore. For example and referring again to FIG. 4-8, a fluorophore having a decay curve B will have a higher ratio of signal in bin 1 to bin 2 than a fluorophore having a decay curve A. The values from the bins can be analyzed and compared against calibration values, and/or each other, to determine the particular fluorophore present. For a sequencing application, identifying the fluorophore can determine the nucleotide or nucleotide analog that is being incorporated into a growing strand of DNA, for example. For other applications, identifying the fluorophore can determine an identity of a molecule or specimen of interest, which may be linked to the fluorophore.

To further aid in understanding the signal analysis, the accumulated, multi-bin values can be plotted as a histogram, as depicted in FIG. 4-10B for example, or can be recorded as a vector or location in N-dimensional space. Calibration runs can be performed separately to acquire calibration values for the multi-valued signals (e.g., calibration histograms) for four different fluorophores linked to the four nucleotides or nucleotide analogs. As an example, the calibration histograms may appear as depicted in FIG. 4-11A (fluorescent label associated with the T nucleotide), FIG. 4-11B (fluorescent label associated with the A nucleotide), FIG. 4-11C (fluorescent label associated with the C nucleotide), and FIG. 4-11D (fluorescent label associated with the G nucleotide). A comparison of the measured multi-valued signal (corresponding to the histogram of FIG. 4-10B) to the calibration multi-valued signals can determine the identity "T" (FIG. 4-11A) of the nucleotide or nucleotide analog being incorporated into the growing strand of DNA.

In some implementations, fluorescent intensity can be used additionally or alternatively to distinguish between different fluorophores. For example, some fluorophores may emit at significantly different intensities or have a significant difference in their probabilities of excitation (e.g., at least a difference of about 35%) even though their decay rates may be similar. By referencing binned signals (bins 5-3) to measured excitation energy and/or other acquired signals, it can be possible to distinguish different fluorophores based on intensity levels.

In some embodiments, different numbers of fluorophores of the same type can be linked to different nucleotides or nucleotide analogs, so that the nucleotides can be identified based on fluorophore intensity. For example, two fluorophores can be linked to a first nucleotide (e.g., "C") or nucleotide analog and four or more fluorophores can be linked to a second nucleotide (e.g., "T") or nucleotide analog. Because of the different numbers of fluorophores, there may be different excitation and fluorophore emission probabilities associated with the different nucleotides. For example, there may be more emission events for the "T" nucleotide or nucleotide analog during a signal accumulation interval, so that the apparent intensity of the bins is significantly higher than for the "C" nucleotide or nucleotide analog.

Distinguishing nucleotides or any other biological or chemical specimens based on fluorophore decay rates and/or fluorophore intensities enables a simplification of the optical excitation and detection systems in an analytical instrument 5-100. For example, optical excitation can be performed with a single-wavelength source (e.g., a source producing one characteristic wavelength rather than multiple sources or a source operating at multiple different characteristic wavelengths). Additionally, wavelength-discriminating optics and filters may not be needed in the detection system to distinguish between fluorophores of different wavelengths. Also, a single photodetector can be used for each reaction chamber to detect emission from different fluorophores.

The phrase "characteristic wavelength" or "wavelength" is used to refer to a central or predominant wavelength within a limited bandwidth of radiation (e.g., a central or peak wavelength within a 20 nm bandwidth output by a pulsed optical source). In some cases, "characteristic wavelength" or "wavelength" may be used to refer to a peak wavelength within a total bandwidth of radiation output by a source.

Fluorophores having emission wavelengths in a range between about 560 nm and about 900 nm can provide adequate amounts of fluorescence to be detected by a time-binning photodetector (which can be fabricated on a silicon wafer using CMOS processes). These fluorophores can be linked to biological molecules of interest, such as nucleotides or nucleotide analogs for genetic sequencing applications. Fluorescent emission in this wavelength range can be detected with higher responsivity in a silicon-based photodetector than fluorescence at longer wavelengths. Additionally, fluorophores and associated linkers in this wavelength range may not interfere with incorporation of the nucleotides or nucleotide analogs into growing strands of DNA. In some implementations, fluorophores having emission wavelengths in a range between about 560 nm and about 660 nm can be optically excited with a single-wavelength source. An example fluorophore in this range is Alexa Fluor 647, available from Thermo Fisher Scientific Inc. of Waltham, Massachusetts Excitation energy at shorter wavelengths (e.g., between about 500 nm and about 650 nm) may be used to excite fluorophores that emit at wavelengths between about 560 nm and about 900 nm. In some embodiments, the time-binning photodetectors can efficiently detect longer-wavelength emission from the reaction chambers, e.g., by incorporating other materials, such as Ge, into the photodetectors' active regions.

IX. Protein Sequencing Applications

Some aspects of the present disclosure may be useful for protein sequencing. For example, some aspects of the present disclosure are useful for determining amino acid sequence information from polypeptides (e.g., for sequencing one or more polypeptides). In some embodiments, amino acid sequence information can be determined for single polypeptide molecules. In some embodiments, one or more amino acids of a polypeptide are labeled (e.g., directly or indirectly) and the relative positions of the labeled amino acids in the polypeptide are determined. In some embodiments, the relative positions of amino acids in a protein are determined using a series of amino acid labeling and cleavage steps.

In some embodiments, the identity of a terminal amino acid (e.g., an N-terminal or a C-terminal amino acid) is assessed, after which the terminal amino acid is removed and the identity of the next amino acid at the terminus is assessed, and this process is repeated until a plurality of successive amino acids in the polypeptide are assessed. In some embodiments, assessing the identity of an amino acid comprises determining the type of amino acid that is present. In some embodiments, determining the type of amino acid comprises determining the actual amino acid identity, for example by determining which of the naturally-occurring 20 amino acids is the terminal amino acid is (e.g., using a recognition molecule that is specific for an individual terminal amino acid). However, in some embodiments assessing the identity of a terminal amino acid type can comprise determining a subset of potential amino acids that can be present at the terminus of the polypeptide. In some embodiments, this can be accomplished by determining that an amino acid is not one or more specific amino acids (and therefore could be any of the other amino acids). In some embodiments, this can be accomplished by determining which of a specified subset of amino acids (e.g., based on size, charge, hydrophobicity, binding properties) could be at the terminus of the polypeptide (e.g., using a recognition molecule that binds to a specified subset of two or more terminal amino acids).

Amino acids of a polypeptide can be indirectly labeled, for example, using amino acid recognition molecules that selectively bind one or more types of amino acids on the polypeptide. Amino acids of a polypeptide can be directly labeled, for example, by selectively modifying one or more types of amino acid side chains on the polypeptide with uniquely identifiable labels. Methods of selective labeling of amino acid side chains and details relating to the preparation and analysis of labeled polypeptides are known in the art (see, e.g., Swaminathan, et al. PLoS Comput Biol. 2015, 11(2):e1004080). Accordingly, in some embodiments, the one or more types of amino acids are identified by detecting binding of one or more amino acid recognition molecules that selectively bind the one or more types of amino acids. In some embodiments, the one or more types of amino acids are identified by detecting labeled polypeptide.

In some embodiments, the relative position of labeled amino acids in a protein can be determined without removing amino acids from the protein but by translocating a labeled protein through a pore (e.g., a protein channel) and detecting a signal (e.g., a Förster resonance energy transfer (FRET) signal) from the labeled amino acid(s) during translocation through the pore in order to determine the relative position of the labeled amino acids in the protein molecule.

As used herein, sequencing a polypeptide refers to determining sequence information for a polypeptide. In some embodiments, this can involve determining the identity of each sequential amino acid for a portion (or all) of the polypeptide. However, in some embodiments, this can involve assessing the identity of a subset of amino acids within the polypeptide (e.g., and determining the relative position of one or more amino acid types without determining the identity of each amino acid in the polypeptide). However, in some embodiments amino acid content information can be obtained from a polypeptide without directly determining the relative position of different types of amino acids in the polypeptide. The amino acid content alone may be used to infer the identity of the polypeptide that is present (e.g., by comparing the amino acid content to a database of polypeptide information and determining which polypeptide(s) have the same amino acid content).

In some embodiments, sequence information for a plurality of polypeptide products obtained from a longer polypeptide or protein (e.g., via enzymatic and/or chemical cleavage) can be analyzed to reconstruct or infer the sequence of the longer polypeptide or protein. Accordingly, some embodiments provide compositions and methods for sequencing a polypeptide by sequencing a plurality of fragments of the polypeptide. In some embodiments, sequencing a polypeptide comprises combining sequence information for a plurality of polypeptide fragments to identify and/or determine a sequence for the polypeptide. In some embodiments, combining sequence information may be performed by computer hardware and software. The methods described herein may allow for a set of related polypeptides, such as an entire proteome of an organism, to be sequenced. In some embodiments, a plurality of single molecule sequencing reactions may be performed in parallel (e.g., on a single chip). For example, in some embodiments, a plurality of single molecule sequencing reactions are each performed in separate sample wells on a single chip.

In some embodiments, methods provided herein may be used for the sequencing and identification of an individual protein in a sample comprising a complex mixture of proteins. Some embodiments provide methods of uniquely identifying an individual protein in a complex mixture of proteins. In some embodiments, an individual protein is detected in a mixed sample by determining a partial amino acid sequence of the protein. In some embodiments, the partial amino acid sequence of the protein is within a contiguous stretch of approximately 5 to 50 amino acids.

Without wishing to be bound by any particular theory, it is believed that most human proteins can be identified using incomplete sequence information with reference to proteomic databases. For example, simple modeling of the human proteome has shown that approximately 98% of proteins can be uniquely identified by detecting just four types of amino acids within a stretch of 6 to 40 amino acids (see, e.g., Swaminathan, et al. PLoS Comput Biol. 2015, 11(2):e1004080; and Yao, et al. Phys. Biol. 2015, 12(5): 055003). Therefore, a complex mixture of proteins can be degraded (e.g., chemically degraded, enzymatically degraded) into short polypeptide fragments of approximately 6 to 40 amino acids, and sequencing of this polypeptide library would reveal the identity and abundance of each of the proteins present in the original complex mixture. Compositions and methods for selective amino acid labeling and identifying polypeptides by determining partial sequence information are described in in detail in U.S. patent application Ser. No. 15/510,962, filed Sep. 15, 2015, titled "SINGLE MOLECULE PEPTIDE SEQUENCING," which is incorporated by reference in its entirety.

Sequencing in accordance with some embodiments can involve immobilizing a polypeptide on a surface of a substrate or solid support, such as a chip or integrated device. In some embodiments, a polypeptide can be immobilized on a surface of a sample well (e.g., on a bottom surface of a sample well) on a substrate. In some embodiments, a first terminus of a polypeptide is immobilized to a surface, and the other terminus is subjected to a sequencing reaction as described herein. For example, in some embodiments, a polypeptide is immobilized to a surface through a C-terminal end, and terminal amino acid recognition and degradation proceeds from an N-terminal end of the polypeptide toward the C-terminal end. In some embodiments, the N-terminal amino acid of the polypeptide is immobilized (e.g., attached to the surface). In some embodiments, the C-terminal amino acid of the polypeptide is immobilized (e.g., attached to the surface). In some embodiments, one or more non-terminal amino acids are immobilized (e.g., attached to the surface). The immobilized amino acid(s) can be attached using any suitable covalent or non-covalent linkage, for example as described herein. In some embodiments, a plurality of polypeptides are attached to a plurality of sample wells (e.g., with one polypeptide attached to a surface, for example a bottom surface, of each sample well), for example in an array of sample wells on a substrate.

Some aspects of the present disclosure provide a method of sequencing a polypeptide by detecting luminescence of a labeled polypeptide which is subjected to repeated cycles of terminal amino acid modification and cleavage. For example, FIG. 4-12 shows a method of sequencing a labeled polypeptide by Edman degradation in accordance with some embodiments. In some embodiments, the method generally proceeds as described herein for other methods of sequencing by Edman degradation. For example, in some embodiments, steps (1) and (2) shown in FIG. 4-12 may be performed as described elsewhere herein for terminal amino acid modification and terminal amino acid cleavage, respectively, in an Edman degradation reaction.

As shown in the example depicted in FIG. 4-12, in some embodiments, the method comprises a step of (1) modifying the terminal amino acid of a labeled polypeptide. As described elsewhere herein, in some embodiments, modifying comprises contacting the terminal amino acid with an isothiocyanate (e.g., PITC) to form an isothiocyanate-modified terminal amino acid. In some embodiments, an isothiocyanate modification 5-1210 converts the terminal amino acid to a form that is more susceptible to removal by a cleaving reagent (e.g., a chemical or enzymatic cleaving reagent, as described herein). Accordingly, in some embodiments, the method comprises a step of (2) removing the modified terminal amino acid using chemical or enzymatic means detailed elsewhere herein for Edman degradation.

In some embodiments, the method comprises repeating steps (1) through (2) for a plurality of cycles, during which luminescence of the labeled polypeptide is detected, and cleavage events corresponding to the removal of a labeled amino acid from the terminus may be detected as a decrease in detected signal. In some embodiments, no change in signal following step (2) as shown in FIG. 4-12 identifies an amino acid of unknown type. Accordingly, in some embodiments, partial sequence information may be determined by evaluating a signal detected following step (2) during each sequential round by assigning an amino acid type by a determined identity based on a change in detected signal or identifying an amino acid type as unknown based on no change in a detected signal.

Some aspects of the present disclosure provide methods of polypeptide sequencing in real-time by evaluating binding interactions of terminal amino acids with labeled amino acid recognition molecules and a labeled cleaving reagent (e.g., a labeled exopeptidase). FIG. 4-13 shows an example of a method of sequencing in which discrete binding events give rise to signal pulses of a signal output 5-1300. The inset panel of FIG. 4-13 illustrates a general scheme of real-time sequencing by this approach. As shown, a labeled amino acid recognition molecule 5-1310 selectively binds to and dissociates from a terminal amino acid (shown here as lysine), which gives rise to a series of pulses in signal output 5-1300 which may be used to identify the terminal amino acid. In some embodiments, the series of pulses provide a pulsing pattern which may be diagnostic of the identity of the corresponding terminal amino acid.

Without wishing to be bound by theory, labeled amino acid recognition molecule 5-1310 selectively binds according to a binding affinity (KD) defined by an association rate of binding (kon) and a dissociation rate of binding (koff). The rate constants koff and kon are the critical determinants of pulse duration (e.g., the time corresponding to a detectable binding event) and interpulse duration (e.g., the time between detectable binding events), respectively. In some embodiments, these rates can be engineered to achieve pulse durations and pulse rates that give the best sequencing accuracy.

As shown in the inset panel, a sequencing reaction mixture further comprises a labeled cleaving reagent 5-1320 comprising a detectable label that is different than that of labeled amino acid recognition molecule 5-1310. In some embodiments, labeled cleaving reagent 5-1320 is present in the mixture at a concentration that is less than that of labeled amino acid recognition molecule 5-1310. In some embodiments, labeled cleaving reagent 5-1320 displays broad specificity such that it cleaves most or all types of terminal amino acids.

As illustrated by the progress of signal output 5-1300, in some embodiments, terminal amino acid cleavage by labeled cleaving reagent 5-1320 gives rise to a uniquely identifiable signal pulse, and these events occur with lower frequency than the binding pulses of a labeled amino acid recognition molecule 5-1310. In this way, amino acids of a polypeptide can be counted and/or identified in a real-time sequencing process. As further illustrated in signal output 5-1300, in some embodiments, a labeled amino acid recognition molecule 5-1310 is engineered to bind more than one type of amino acid with different binding properties corresponding to each type, which produces uniquely identifiable pulsing patterns. In some embodiments, a plurality of labeled amino acid recognition molecules may be used, each with a diagnostic pulsing pattern which may be used to identify a corresponding terminal amino acid.

Having thus described several aspects and embodiments of the technology of the present disclosure, it is to be appreciated that various alterations, modifications, and improvements will readily occur to those of ordinary skill in the art. Such alterations, modifications, and improvements are intended to be within the spirit and scope of the technology described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

What is claimed is:

1. A method, comprising:
   during a first time period, transferring first charge carriers from a first charge storage region to a second charge storage region; and
   during a second time period:
      receiving second charge carriers at the first charge storage region; and
      reading out the first charge carriers from the second charge storage region.

2. The method of claim 1, wherein:
   the first and second charge carriers are generated in a photodetection region in response to arrival of photons at the photodetection region;
   before the first time period, the first charge carriers are received at the first charge storage region from the photodetection region; and
   during the second time period, the second charge carriers are received at the first charge storage region from the photodetection region.

3. The method of claim 2, wherein:
   over multiple sub-periods within the second time period, the second charge carriers are received at the first charge storage region; and
   each sub-period within the second time period follows a respective excitation of a sample that causes the sample to emit the photons.

4. The method of claim 2, wherein:
   the second charge carriers are received at the first charge storage region from the photodetection region via a first charge transfer channel that connects the photodetection region to the first charge storage region; and
   the first charge carriers are transferred from the first charge storage region to the second charge storage region via a second charge transfer channel that connects the first charge storage region to the second charge storage region.

5. The method of claim 2, wherein:
   the second charge carriers are received at the first charge storage region from the photodetection region via a first charge transfer channel that connects the photodetection region to the first charge storage region; and
   the first charge carriers are transferred from the first charge storage region to the second charge storage region via:
      a second charge transfer channel that connects the first charge storage region to an intermediate charge storage region;
      the intermediate charge storage region; and
      a third charge transfer channel that connects the intermediate charge storage region to the second charge storage region.

6. The method of claim 5, wherein:
   during a first sub-period of the second time period, the first charge carriers are read out from the second charge storage region to a readout region; and
   during a second sub-period of the second time period, third charge carriers are read out from the intermediate charge storage region to the readout region via the second charge storage region.

7. The method of claim 1, wherein reading out comprises transferring the first charge carriers from the second charge storage region to a readout region to be sampled.

8. A system, comprising:
   a sample well configured to support a sample; and
   an integrated circuit, comprising:
      a photodetection region configured to generate charge carriers in response to receiving photons emitted by the sample;
      a first charge storage region electrically coupled to the photodetection region to receive charge carriers; and
      a second charge storage region electrically coupled to the first charge storage region to receive charge carriers,
      wherein the integrated circuit is controllable to:
         during a first time period, transfer first charge carriers from the first charge storage region to the second charge storage region; and
         during a second time period:
            read out the first charge carriers from the second charge storage region; and
            receive second charge carriers at the first charge storage region from the photodetection region.

9. The system of claim 8, wherein the integrated circuit is configured to induce a potential barrier between the first and second charge storage regions while the first charge storage region receives the second charge carriers from the photodetection region and the second charge storage region reads out the first charge carriers.

10. The system of claim 9, wherein the integrated circuit further comprises a first transfer gate positioned, at least in part, between the first and second charge storage region and configured to receive a first control signal that causes the first transfer gate to control the potential barrier between the first and second charge storage regions while the first charge storage region receives the second charge carriers from the photodetection region and the second charge storage region reads out the first charge carriers.

11. The system of claim 10, wherein the integrated circuit further comprises:
a first charge transfer channel connecting the first charge storage region to the second charge storage region and configured to be biased by the first transfer gate to control the potential barrier between the first and second charge storage regions.

12. The system of claim 11, wherein the integrated circuit further comprises:
a drain region electrically coupled to the photodetection region to receive third charge carriers from the photodetection region;
a second transfer gate positioned, at least in part, between the photodetection region and the first charge storage region and configured to receive a second control signal that causes the second transfer gate to control a potential barrier between the photodetection region and the first charge storage region while the drain region receives the third charge carriers from the photodetection region; and
a second charge transfer channel connecting the photodetection region to the first charge storage region and configured to be biased by the second transfer gate to control the potential barrier between the photodetection region and the first charge storage region.

13. The system of claim 8, wherein the integrated circuit further comprises:
an intermediate charge storage region electrically coupled between the first and second charge storage regions;
a first transfer gate positioned, at least in part, between the first and intermediate charge storage regions and configured to receive a first control signal that causes the first transfer gate to control a potential barrier between the first and intermediate charge storage regions while the first charge storage region receives the second charge carriers from the photodetection region and the intermediate and second charge storage regions read out the first charge carriers;
a first charge transfer channel connecting the first charge storage region to the intermediate charge storage region and configured to be biased by the first transfer gate to control the potential barrier between the first and intermediate charge storage regions;
a second transfer gate positioned, at least in part, between the intermediate and second charge storage regions and configured to receive a second control signal that causes the second transfer gate to control a potential barrier between the intermediate and second charge storage regions while the intermediate charge storage region receives the second charge carriers from the photodetection region via the first charge storage region and the second charge storage region reads out the first charge carriers; and
a second charge transfer channel connecting the intermediate charge storage region to the second charge storage region and configured to be biased by the second transfer gate to control the potential barrier between the intermediate and second charge storage regions.

14. The system of claim 8, wherein the integrated circuit further comprises:
a readout region electrically coupled to the second charge storage region, and
wherein the integrated circuit is configured to read out the first charge carriers from the second charge storage region by transferring the first charge carriers from the second charge storage region to the readout region to be sampled.

15. A system, comprising:
an integrated circuit, comprising:
a first charge storage region; and
a second charge storage region electrically coupled to the first charge storage region; and
a control circuit electrically coupled to the integrated circuit and configured to:
during a first time period, control the integrated circuit to transfer, from the first charge storage region to the second charge storage region, first charge carriers; and
during a second time period, control the integrated circuit to:
receive, at the first charge storage region, second charge carriers; and
read out, from the second charge storage region, the first charge carriers.

16. The system of claim 15, wherein:
the integrated circuit further comprises a photodetection region configured to, in response to receiving photons, generate the first and second charge carriers; and
the control circuit is configured to control the integrated circuit to:
before the first time period, transfer, from the photodetection region to the first charge storage region, the first charge carriers; and
during the second time period, transfer, from the photodetection region to the first charge storage region, the second charge carriers.

17. The system of claim 16, wherein the control circuit is configured to, over the course of multiple sub-periods within the second time period, control the integrated circuit to transfer, from the photodetection region to the first charge storage region, the second charge carriers, each sub-period within the second time period following a respective excitation of a sample that causes the sample to emit the photons.

18. The system of claim 16, wherein:
the integrated circuit further comprises:
a first transfer gate configured to control the transfer of charge carriers from the photodetection region to the first charge storage region; and
a second transfer gate configured to control the transfer of charge carriers from the first charge storage region to the second charge storage region; and
the control circuit is configured to:
apply a first signal to the first transfer gate to transfer charge carriers from the photodetection region to the first charge storage region; and
apply a second signal to the second transfer gate to transfer charge carriers from the first charge storage region to the second charge storage region.

19. The system of claim 16, wherein
the integrated circuit further comprises:
- an intermediate charge storage region;
- a first transfer gate configured to control the transfer of charge carriers from the photodetection region to the first charge storage region;
- a second transfer gate configured to control the transfer of charge carriers from the first charge storage region to the intermediate charge storage region; and
- a third transfer gate configured to control the transfer of charge carriers from the intermediate charge storage region to the second charge storage region; and the control circuit is configured to:
- apply a first signal to the first transfer gate to transfer charge carriers from the photodetection region to the first charge storage region;
- apply a second signal to the second transfer gate to transfer charge carriers from the first charge storage region to the intermediate charge storage region; and
- apply a third signal to the third transfer gate to transfer charge carriers from the intermediate charge storage region to the second charge storage region.

20. The system of claim 15, wherein:
the integrated circuit further comprises a readout region; and
the control circuit is configured to, during the second time period, control the readout of the first charge carriers from the second charge storage region to the readout region to be sampled.

21. The method of claim 3, wherein:
- the first charge carriers are aggregated in the first charge storage region over multiple sub-periods within a third time period preceding the first time period, each of the multiple sub-periods within the third time period following a respective excitation of the sample that causes the sample to emit photons; and
- the second charge carriers are aggregated in the first charge storage region over the multiple sub-periods within the second time period.

22. The system of claim 8, wherein the photodetection region comprises a dopant configuration having a first end proximate the first charge storage region and a second end opposite the first charge storage region, the dopant configuration being wider at the first end than at the second end so as to induce an intrinsic electric field from the photodetection region toward the first charge storage region.

23. The system of claim 17, wherein the control circuit is configured to:
- over the course of multiple sub-periods within a third time period that precedes the first time period, control the integrated circuit to aggregate, in the first charge storage region, the first charge carriers, each of the multiple sub-periods within the third time period following a respective excitation of the sample that causes the sample to emit photons; and
- over the course of the multiple sub-periods within the second time period, control the integrated circuit to aggregate, in the first charge storage region, the second charge carriers.

* * * * *